US010217931B2

(12) United States Patent
Nakamura et al.

(10) Patent No.: US 10,217,931 B2
(45) Date of Patent: Feb. 26, 2019

(54) MAGNETIC ELEMENT, SKYRMION MEMORY, SOLID-STATE ELECTRONIC DEVICE, DATA-STORAGE DEVICE, DATA PROCESSING AND COMMUNICATION DEVICE

(71) Applicant: RIKEN, Saitama (JP)

(72) Inventors: Masao Nakamura, Saitama (JP); Jobu Matsuno, Saitama (JP); Masashi Kawasaki, Tokyo (JP); Yoshinori Tokura, Tokyo (JP); Yoshio Kaneko, Tokyo (JP)

(73) Assignee: RIKEN, Saitama (JP)

( * ) Notice: Subject to any disclaimer, the term of this patent is extended or adjusted under 35 U.S.C. 154(b) by 0 days.

(21) Appl. No.: 15/450,044

(22) Filed: Mar. 6, 2017

(65) Prior Publication Data
US 2017/0179376 A1 Jun. 22, 2017

Related U.S. Application Data

(63) Continuation of application No. PCT/JP2015/082466, filed on Nov. 18, 2015.

(30) Foreign Application Priority Data

Nov. 27, 2014 (JP) .................... 2014-240225

(51) Int. Cl.
H01L 43/02 (2006.01)
H01L 27/105 (2006.01)
(Continued)

(52) U.S. Cl.
CPC ........... H01L 43/02 (2013.01); G11C 11/161 (2013.01); G11C 11/1675 (2013.01);
(Continued)

(58) Field of Classification Search
CPC ................ H01L 43/02; H01L 43/10
(Continued)

(56) References Cited

U.S. PATENT DOCUMENTS 6,387,549 B1  5/2002  Obata et al.
6,834,005 B1  12/2004  Parkin
(Continued)

FOREIGN PATENT DOCUMENTS

JP      H10-269842 A    10/1998
JP      2014-86470 A     5/2014

OTHER PUBLICATIONS

International Search Report for International Application No. PCT/JP2015/082466, issued by the Japan Patent Office dated Dec. 22, 2015.

(Continued)

Primary Examiner — Long K Tran

(57) ABSTRACT

Provided is a magnetic element which can generate a skyrmion by a stacked film including a magnetic layer and a non-magnetic layer, and a skyrmion memory to which the magnetic element is applied and the like. Provided is a magnetic element for generating a skyrmion, the magnetic element comprising a two-dimensional stacked film, wherein the two-dimensional stacked film is at least one or more multiple layered films including a magnetic film and a non-magnetic film stacked on the magnetic film. Also, provided is a skyrmion memory including a plurality of the magnetic elements stacked in a thickness direction.

16 Claims, 46 Drawing Sheets

(51) Int. Cl.
  *H01L 29/82* (2006.01)
  *H01L 43/10* (2006.01)
  *G11C 11/16* (2006.01)
  *G11C 11/18* (2006.01)
  *H01L 27/22* (2006.01)
  *H01F 10/193* (2006.01)

(52) U.S. Cl.
  CPC .......... *G11C 11/18* (2013.01); *H01F 10/1933* (2013.01); *H01L 27/105* (2013.01); *H01L 27/228* (2013.01); *H01L 29/82* (2013.01); *H01L 43/10* (2013.01); *G11C 11/1673* (2013.01)

(58) Field of Classification Search
  USPC ........................................................ 257/421
  See application file for complete search history.

(56) References Cited

U.S. PATENT DOCUMENTS

| | | | |
|---|---|---|---|
| 2003/0042562 | A1 | 3/2003 | Giebeler et al. |
| 2008/0174400 | A1* | 7/2008 | Chen .................. G11C 11/5685 338/32 R |
| 2009/0243008 | A1* | 10/2009 | Kitagawa .............. H01L 27/222 257/421 |
| 2009/0280355 | A1* | 11/2009 | Eom ....................... C30B 23/02 428/701 |
| 2011/0261602 | A1 | 10/2011 | Moutafis et al. |
| 2012/0300543 | A1 | 11/2012 | Ohno et al. |
| 2013/0107395 | A1 | 5/2013 | Nagasawa et al. |
| 2014/0043895 | A1* | 2/2014 | Bibes ..................... H01L 43/08 365/171 |

OTHER PUBLICATIONS

Naoto Nagaosa, Yoshinori Tokura, "Topological properties and dynamics of magnetic skyrmions", Nature Nanotechnology, United Kingdom, Nature Publishing Group, Dec. 4, 2013, vol. 8, p. 899-911.

D. C. Worledge, T. H. Geballe, "Negative Spin-Polarization of $SrRuO_3$", Physical Review Letters, U.S., The American Physical Society, Dec. 11, 2000, vol. 85, No. 24, p. 5182-5185.

J.-H.Park, E. Vescovo, H.-J. Kim, C. Kwon, R. Ramesh, T. Venkatesan, "Direct evidence for a half-metallic ferromagnet", Nature, United Kingdom, Nature Publishing Group, Apr. 23, 1998, vol. 392, p. 794-796.

International Preliminary Report on Patentability for International Application No. PCT/JP2015/082466, issued by the International Bureau of WIPO dated May 30, 2017.

Extended European search report issued for European Patent Application No. 15863107.7 issued by the European Patent Office dated Jul. 27, 2018.

Bertrand Dupe et al., "Tailoring magnetic skyrmions in ultra-thin transition metal films", Nature Communications, Jun. 4, 2014, pp. 1-6, vol. 5, No. 1, Macmillan Publishers Limited.

Niklas Romming et al., "Writing and Deleting Single Magnetic Skyrmions", Science Aug. 9, 2013, p. 636-639, vol. 341, Issue 6146, AAAS, USA.

Fei-Xiang Wu et al., "Metal-insulator transition in $SrIrO_3$ with strong spin-orbit interaction" Journal of Physics, Condensed Matter, Feb. 19, 2013, pp. 1-8, vol. 25, No. 12, IOP Publishing Ltd., UK&USA.

Office Action issued for counterpart Korean Application 10-2017-7005912, issued by the Korean Intellectual Property Office dated Aug. 6, 2018.

* cited by examiner

MAGNETIC ELEMENT, SKYRMION MEMORY, SOLID-STATE ELECTRONIC DEVICE, DATA-STORAGE DEVICE, DATA PROCESSING AND COMMUNICATION DEVICE

BACKGROUND

1. Technical Field

The present invention relates to a magnetic element which can generate and erase a skyrmion, a skyrmion memory using the magnetic element, a skyrmion memory embedded solid-state electronic device, a data-storage device embedded with a skyrmion memory, a data processing device embedded with a skyrmion memory, and a communication device embedded with a skyrmion memory.

2. Related Art

A magnetic element has been known which utilizes magnetic moment of a magnet as digital information. The magnetic element has a nanoscale magnetic structure which functions as an element of a non-volatile memory which needs no electrical power during storage of information. As the magnetic element has an advantage of ultra high density and the like due to the nanoscale magnetic structure, it is expected to have an application as mass storage medium of information and the importance has been increased as a memory device of an electronic device.

As a possible candidate for a magnetic memory device of a new generation, a magnetic shift register has been proposed by IBM in the U.S. and other entities. A magnetic shift register drives a magnetic domain wall, transfers the magnetic moment arrangement via currents, and reads stored information (see Patent Document 1).

FIG. 46 is a schematic view illustrating the principle of driving a magnetic domain wall by currents. The boundary of magnetic regions at which orientations of magnetic moments are opposing to each other is the magnetic domain wall. In FIG. 46, the magnetic domain wall in a magnetic shift register 1 is shown by solid lines. By having currents flow in the magnetic shift register 1 in a direction of arrows, the magnetic domain wall is driven. Movement of the magnetic domain wall causes a magnetic change due to an orientation of the magnetic moment positioned above a magnetic sensor 2. The magnetic change is detected by the magnetic sensor 2 and magnetic information is drawn out.

However, such a magnetic shift register 1 needs large currents when moving the magnetic domain wall, and also has a disadvantage of a low transfer speed of the magnetic domain wall. As a result, the time to write to and erase from a memory is elongated.

Thus, the present inventors proposed a skyrmion magnetic element which uses a skyrmion generated in a magnet as a unit of storage (see Patent Document 2). In this proposal, the present inventors proved that a skyrmion could be driven by currents.

PRIOR ART DOCUMENT

Patent Document

[Patent Document 1] U.S. Pat. No. 6,834,005
[Patent Document 2] Japanese Patent Application Publication No. 2014-86470
[Non-Patent Document 1] Naoto Nagaosa, Yoshinori Tokura, "Topological properties and dynamics of magnetic skyrmions", Nature Nanotechnology, United Kingdom, Nature Publishing Group, Dec. 4, 2013, Vol. 8, p 899-911.
[Non-Patent Document 2] D. C. Worledge, T. H. Geballe, "Negative Spin-Polarization of $SrRuO_3$", PHYSICAL REVIEW LETTERS, U.S., The American Physical Society, Dec. 11, 2000, Vol. 85, Number 24, p 5182-5185.
[Non-Patent Document 3] J.-H. Park, E. Vescovo, H.-J. Kim, C. Kwon, R. Ramesh, T. Venkatesan, "Direct evidence for a half-metallic ferromagnet", NATURE, United Kingdom, Nature Publishing Group, Apr. 23, 1998, Vol. 392, p 794-796.

As a skyrmion has a magnetic structure of an ultramicro scale having a diameter of 1 nm to 500 nm and can hold the structure over an extended time, expectation for an application as a memory element has been increased. Material for forming a skyrmion which has been found so far is single bulk material material such as FeGe and MnSi of a chiral magnet indicating a helimagnetism (Non-Patent Document 2). In practical use, it is desiable to have a stable skyrmion phase, a flexibility to design and select a skyrmion size (diameter), and a stacked structure of thin films, and to be manufactured easily in the LSI process. Thus, there is a need for material which allows a skyrmion phase to appear with unknown composite material of stacked thin films. SUMMARY In a first aspect of the present invention, provided is a magnetic element for generating a skyrmion, the magnetic element comprising a two-dimensional stacked film, wherein the two-dimensional stacked film is at least one or more multiple layered films including a magnetic film and a non-magnetic film stacked on the magnetic film.

In a second aspect of the present invention, provided is a magnetic element for generating a skyrmion comprising a magnetic film, wherein the magnetic film includes perovskite oxide $La_{1-x}Sr_xMnO_3$ added with Ru elements are added within a range of 2.5% to 10% of Mn, where x is such that $0 \leq x \leq 1$.

In a third aspect of the present invention, provided is a skyrmion memory including a plurality of the magnetic elements of the first or the second aspect stacked in a thickness direction.

In a fourth aspect of the present invention, provided is a skyrmion memory comprising the magnetic elements of the first or the second aspect, and a generating unit of a magnetic field provided to be opposite to the magnetic element and applying a magnetic field to the magnetic element.

In a fifth aspect of the present invention, provided is a skyrmion memory comprising a substrate, a semiconductor element formed on the substrate, the magnetic element according to the first aspect stacked above the semiconductor element, and a generating unit of a magnetic field provided to be opposite to the magnetic element and applying a magnetic field to the magnetic element.

In a sixth aspect of the present invention, provided is a skyrmion memory embedded solid-state electronic device comprising the skyrmion memory of any of the third to the fifth aspects or a skyrmion memory device and a solid-state electronic device in the same chip.

In a seventh aspect of the present invention, provided is a data-storage device comprising the skyrmion memory of any of the third to the fifth aspects or a skyrmion memory device embedded therein.

In an eighth aspect of the present invention, provided is a data processing device comprising the skyrmion memory of any of the third to the fifth aspects or a skyrmion memory device embedded therein.

In a ninth aspect of the present invention, provided is a communication device comprising the skyrmion memory of any of the third to the fifth aspects or a skyrmion memory device embedded therein.

DESCRIPTION OF THE EMBODIMENTS

Hereinafter, the present invention will be described through embodiments of the invention. However, the following embodiments are not to limit the claimed inventions. Also, all of the combinations of features described in the embodiments are not necessarily essential for means for solving the problem of the invention.

One example of a magnet which can generate a skyrmion is a chiral magnet. A chiral magnet is a magnet with a magnetic order phase in which a magnetic moment arrangement is rotated in a helical manner with respect to a moving direction of magnetic moments when no external magnetic field is applied. By applying an external magnetic field, the chiral magnet transits to a ferromagnetic phase, via a state in which a skyrmion exists.

Figure 1:
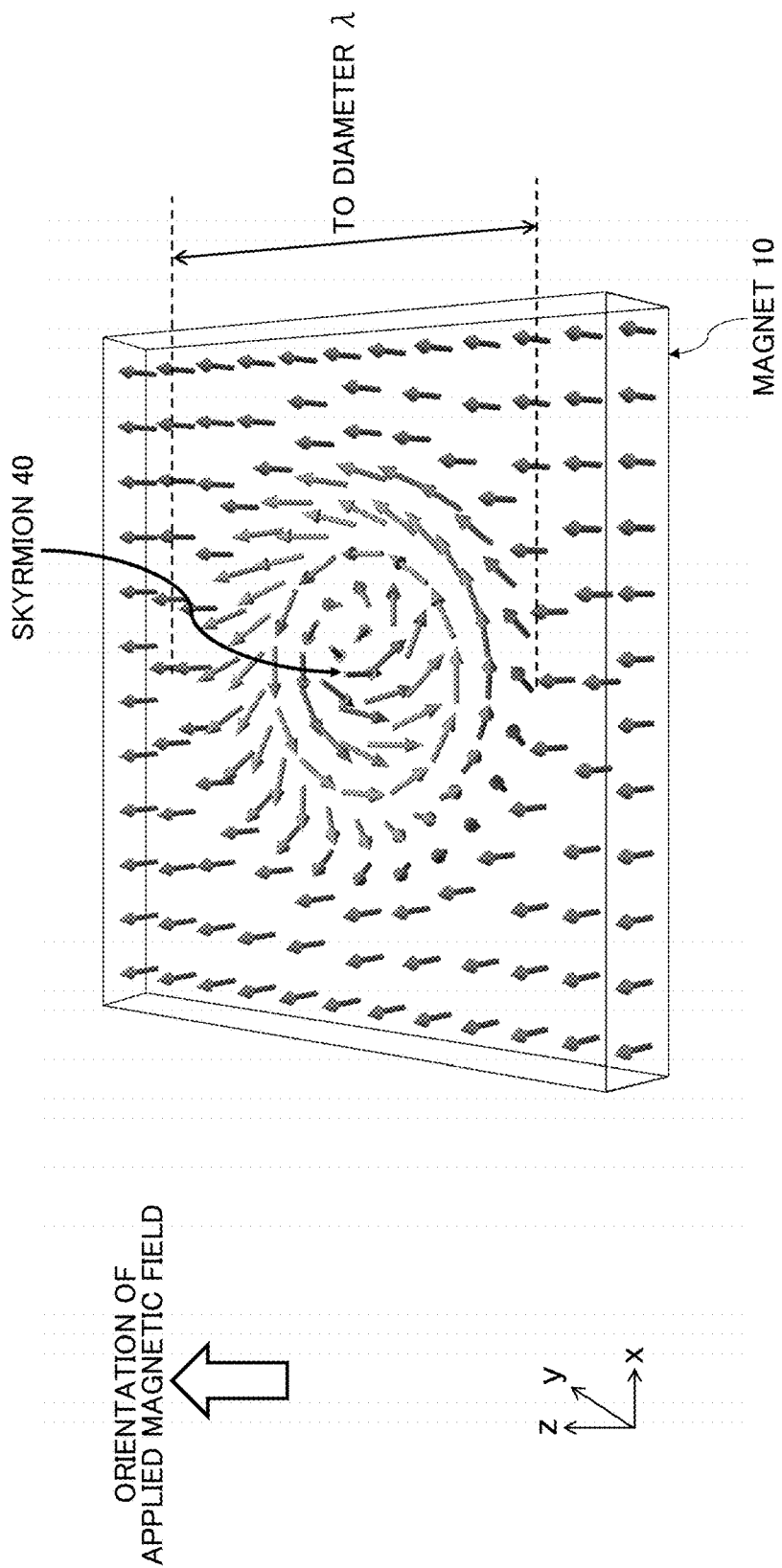
FIG. 1 is a schematic view illustrating one example of a skyrmion which is a magnetic nanoscale texture of magnetic moments in a magnet. An strength and orientation of a magnetic moment is schematically shown by an arrow.

FIG. 1 is a schematic view illustrating one example of a skyrmion 40 which is a magnetic nanoscale texture in a magnet 10. In FIG. 1, each arrow represents an orientation of a magnetic moment in a skyrmion 40. The x axis and the y axis are axes orthogonal to each other, while the z axis is an axis orthogonal to the xy plane.

The magnet 10 includes a plane parallel to the x-y plane. Magnetic moments oriented to any orientations on the plane of the magnet 10 configure the skyrmion 40. In the present example, the magnetic field applied to the magnet 10 is oriented to the positive z direction. In this case, the magnetic moments of an outermost circumference of the skyrmion 40 of the present example are oriented to the positive z direction.

The magnetic moments of the skyrmion 40 are rotated in a vortex manner from the outermost circumference to the inner side. Further, the orientations of the magnetic moments are gradually shifted from the positive z direction to the negative z direction in accordance with the rotation in the vortex manner.

The orientations of the magnetic moments of the skyrmion 40 are continuously twisted between the center and the outermost circumference. That is, the skyrmion 40 is a magnetic nanoscale texture having a vortex structure of the magnetic moments. If the magnet 10 in which the skyrmion 40 exists is solid material having a thin plate-like shape, the magnetic moments configuring the skyrmion 40 are oriented uniquely in the thickness direction. That is, in a depth direction of the plate (z direction), the magnetic moments are oriented uniquely from the front surface to the back surface. A diameter λ of the skyrmion 40 refers to a diameter of the outermost circumference of the skyrmion 40. In the present example, the outermost circumference refers to a circumference of the magnetic moments oriented to the same direction as the external magnetic field shown in FIG. 1.

A skyrmion number Nsk characterizes the skyrmion 40 which is a magnetic nanoscale texture having a vortex structure. The skyrmion number can be represented by the following [Equation 1] and [Equation 2]. In [Equation 2], a polar angle Θ(r) of the magnetic moment and the z axis is a continuous function of r which is a distance from the center of the skyrmion 40. The polar angle Θ(r) varies from π to zero or from zero to π when r varies from zero to infinity.

$$Nsk = \frac{1}{4}\pi \int\int d^2 rn(r) \cdot \left[\left(\frac{\partial n(r)}{\partial x}\right) \times \left(\frac{\partial n(r)}{\partial y}\right)\right] \quad \text{[Equation 1]}$$

$$Nsk = \frac{1}{4}\pi \int\int d^2 rn(r) \cdot \left[\left(\frac{\partial n(r)}{\partial x}\right) \times \left(\frac{\partial n(r)}{\partial y}\right)\right] \quad \text{[Equation 2]}$$

$$\phi(\varphi) = m\varphi + \gamma$$

In [Equation 1], n(r) is a unit vector which represents an orientation of the magnetic moment of the skyrmion 40 at a position r. In [Equation 2], m is a voracity and γ is a helicity. From [Equation 1] and [Equation 2], when Θ(r) varies from π to zero with r varying from zero to infinity, Nsk=−m.

Figure 2:
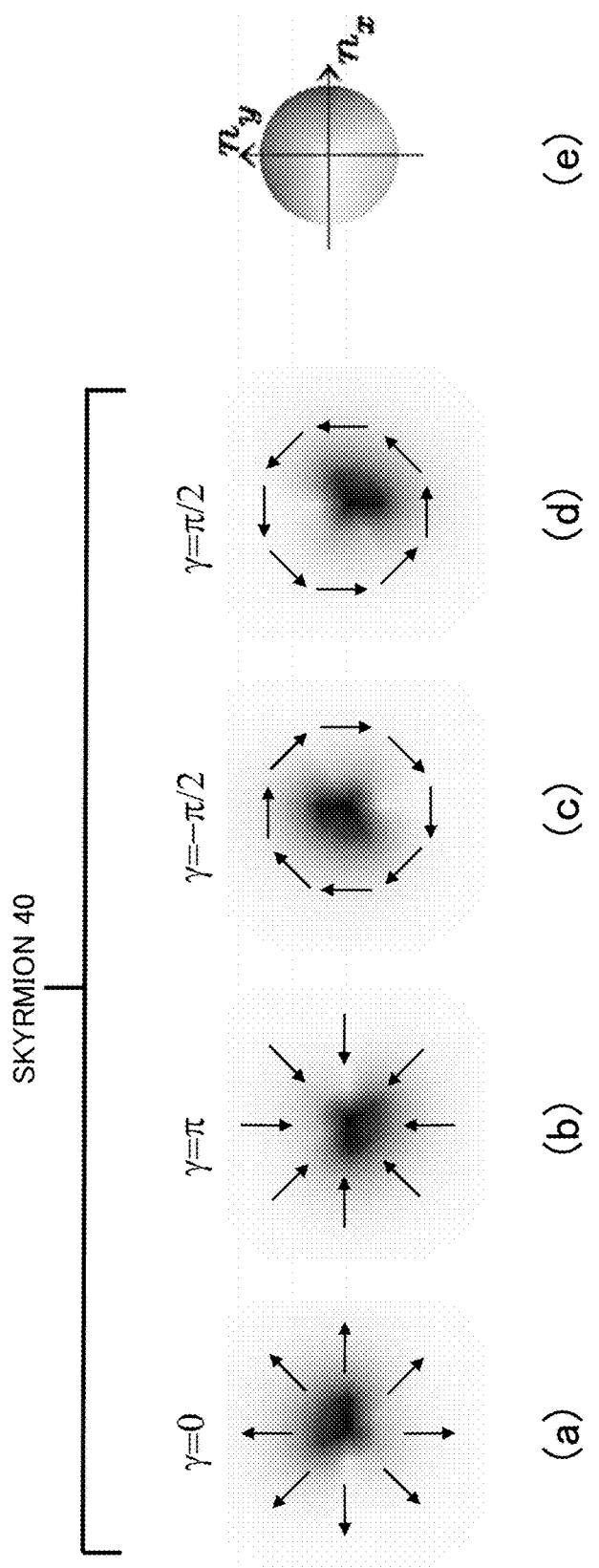
FIG. 2 is a diagram illustrating the skyrmion 40 having different helicities γ.

FIG. 2 is a schematic view illustrating the skyrmion 40 having different helicities γ (Non-Patent Document 1). In particular, FIG. 2 illustrates one example when the skyrmion number Nsk=−1. FIG. 2(e) illustrates the manner to define the coordinate of the magnetic moment n (right-handed system). It should be noted that as it is the right-handed system, the $n_z$ axis is oriented from the back to the front of the sheet of paper with respect to the $n_x$ axis and the $n_y$ axis. In FIG. 2(a) to FIG. 2(e), a grayscale represents orientations of the magnetic moments.

In FIG. 2(e), the magnetic moments represented by the grayscale on the circumference are oriented to be parallel to the $n_x$-$n_y$ plane. On the other hand, in FIG. 2(e), the magnetic moments represented by the lightest color (white) of the grayscale around the center of the circle are oriented from the back to the front of the sheet of paper. The magnetic moment represented by the grayscale at each position between the circumference and the center has an angle against the $n_z$ axis varied from π to zero in accordance with the distance from the center. In FIG. 2(a) to FIG. 2(d), the orientation of each magnetic moment is represented by the same grayscale as the one in FIG. 2(e). It should be noted that in FIG. 2(a) to FIG. 2(d), the magnetic moment represented by the darkest color (black) of the grayscale, such as the one in the center of the skyrmion 40, is oriented from the front of the sheet of paper to the back of the sheet of paper. In FIG. 2(a) to FIG. 2(d), each arrow represents a magnetic moment at a position at predetermined distance from the center of the magnetic texture. The magnetic textures shown in FIG. 2(a) to FIG. 2(d) are in a state which can be defined as the skyrmion 40.

In FIG. 2(a) (γ=0), the grayscale at a predetermined distance from the center of the skyrmion 40 is identical to the grayscale on the circumference in FIG. 2(e). Therefore, in FIG. 2(a), the magnetic moments represented by arrows are radially oriented from the center to the outer side. Compared to each magnetic moment in FIG. 2(a) (γ=0), each magnetic moment in FIG. 2(b) (γ=π) is oriented to be rotated through 180 degrees with respect to each magnetic moment in FIG. 2(a). Compared to each magnetic moment in FIG. 2(a) (γ=0), each magnetic moment in FIG. 2(c) (γ=−π/2) is oriented to be rotated through −90 degrees (90 degrees in a clockwise direction) about each magnetic moment in FIG. 2(a).

Compared to each magnetic moment in FIG. 2(a) (γ=0), each magnetic moment in FIG. 2(d) (γ=π/2) is oriented to be rotated through 90 degrees (90 degrees in a counterclockwise direction) about each magnetic moment in FIG. 2(a). It should be noted that the skyrmion with a helicity of γ=π/2 shown in FIG. 2(d) corresponds to the skyrmion 40 in FIG. 1.

Although four examples of the magnetic structures shown in FIG. 2(a) to (d) seem different, they are the same magnetic texture in the topological meaning. The skyrmion having the structure in FIG. 2(a) to (d) exists stably once generated, and works as a carrier for transmitting information in the magnet 10 to which the external magnetic field is applied.

Figure 3:
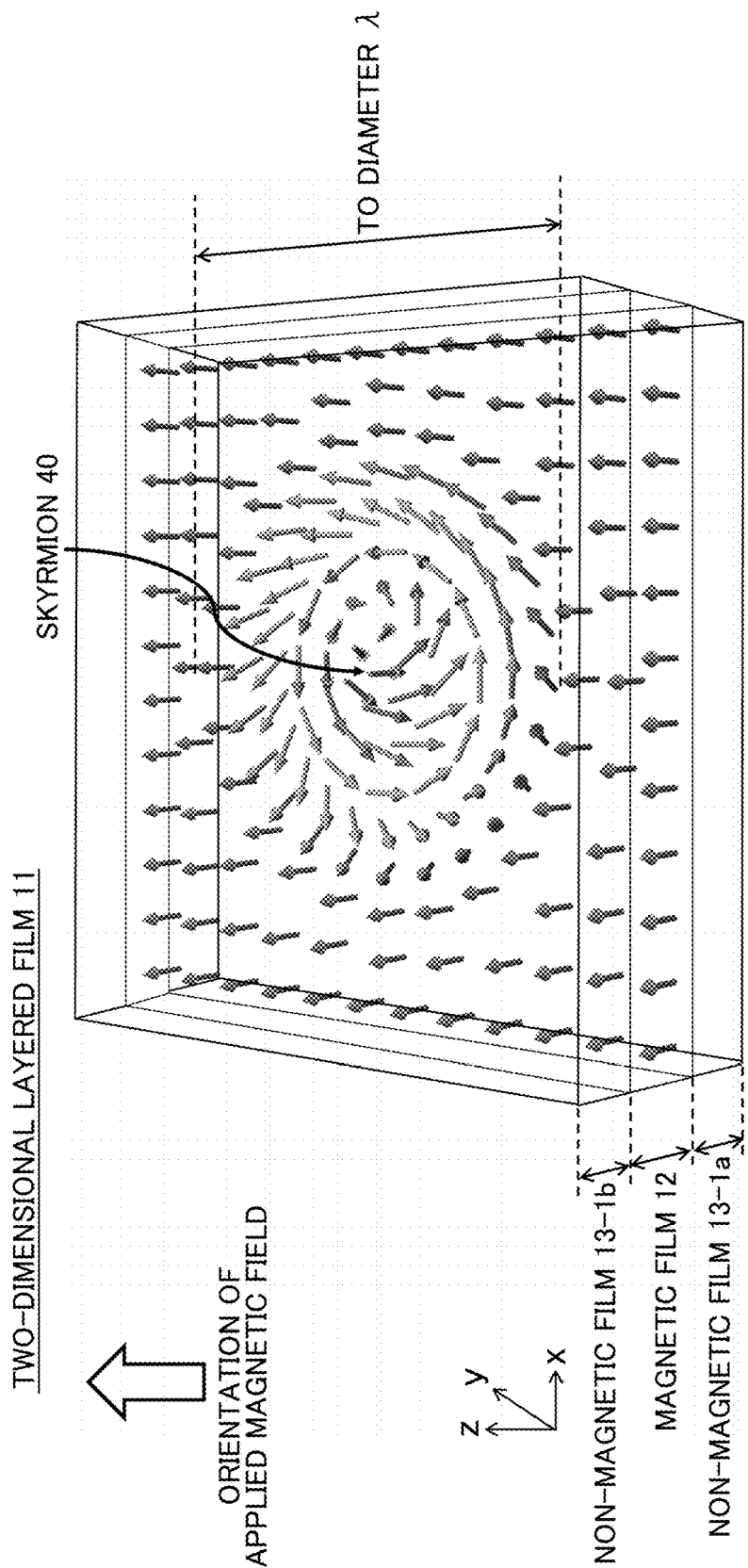
FIG. 3 illustrates a schematic view of the skyrmion 40 formed in a two-dimensional stacked film 11.

FIG. 3 illustrates a schematic view of the skyrmion 40 formed in a two-dimensional stacked film 11.

The two-dimensional stacked film 11 is a stacked film which includes a two-dimensional surface on the xy plane. The two-dimensional stacked film 11 of the present example comprises a magnetic film 12 and non-magnetic films 13 stacked on and under the magnetic film 12. The non-magnetic film 13-1a is stacked under the magnetic film 12 and the non-magnetic film 13-1b is stacked on the magnetic film 12. It should be noted that the two-dimensional stacked film 11 is formed by stacking a plurality of magnetic films 12 and non-magnetic films 13.

The magnetic film 12 has a magnetic exchange interaction J. The magnetic exchange interaction J causes a strong interaction between the magnetic moments and generates a ferromagnetic phase. The magnetic film 12 includes material in which the crystal magnetic anisotropy allows the magnetic moment to be magnetized along the z axis (perpendicularly). For example, the magnetic film 12 oriented perpendicularly is a magnetic metal element such as Fe, Co and Ni, or a perovskite oxide such as $SrRuO_3$. The thickness of the magnetic film 12 is determined depending on material within the range which can form the skyrmion 40. For example, the thickness of the magnetic film 12 is equal to or less than 100 nm.

The non-magnetic film 13 has a strong spin-orbit interaction. For example, the non-magnetic film 13 is non-magnetic metal element such as Pd, Ag, Ir, Pt, Au, W, Re. Also, the non-magnetic film 13 may also be a perovskite oxide which contains these elements as a main component. If the non-magnetic film 12 has a spatially asymmetric interface, the spin-orbit interaction causes the Dzyaloshinskii-Moriya (DM) interaction D around the interface. The Dzyaloshinskii-Moriya (DM) interaction D modulates the magnetic exchange interaction J at the interface between the magnetic film 12 and the non-magnetic film 13. If the magnetic film 12 is a thin film formed of several atomic layers, the modulation mechanism of the magnetic exchange interaction J due to the Dzyaloshinskii-Moriya (DM) interaction D spans from the interface to the front surface of the magnetic layer. Due to the modulation mechanism of the magnetic exchange interaction J, the magnetic moments of the magnet 12 aligned parallel to one another become stable in a twisted state. That is, the skyrmion 40 is generated.

As described above, by stacking the non-magnetic film 13 having a strong spin-orbit interaction, the magnetic moments of the magnetic film 12 having the magnetic exchange interaction J behave in the same manner as the magnetic moments in the chiral magnet. As the magnetic film 12 includes the magnetic moment as in the chiral magnet, it can form a skyrmion phase. That is, there is no need to select material of the magnetic film 12 from material to be the chiral magnet.

Also, in the second example, the magnetic film 12 is formed of a dipole magnet thin film. The dipole magnet is a flexible magnet. A flexible magnet is a magnet which has a small coercive force and of which an orientation of the magnetization easily responds to the applied magnetic field. A coercive force is a magnitude of the magnetic field needed for reversal of the magnetization. As the dipole magnet is a flexible magnet, it has a linear magnetic field dependency of the magnetization. This allows the dipole magnet to form the skyrmion phase in response to the applied magnetic field.

By using the two-dimensional stacked film 11 formed of the configuration described above, the magnetic element which can generate the skyrmion 40 can be embodied. Hereinafter, a method of generating the skyrmion 40 by using the two-dimensional stacked film 11 will be described through the embodiment examples more specifically.

Figure 4:
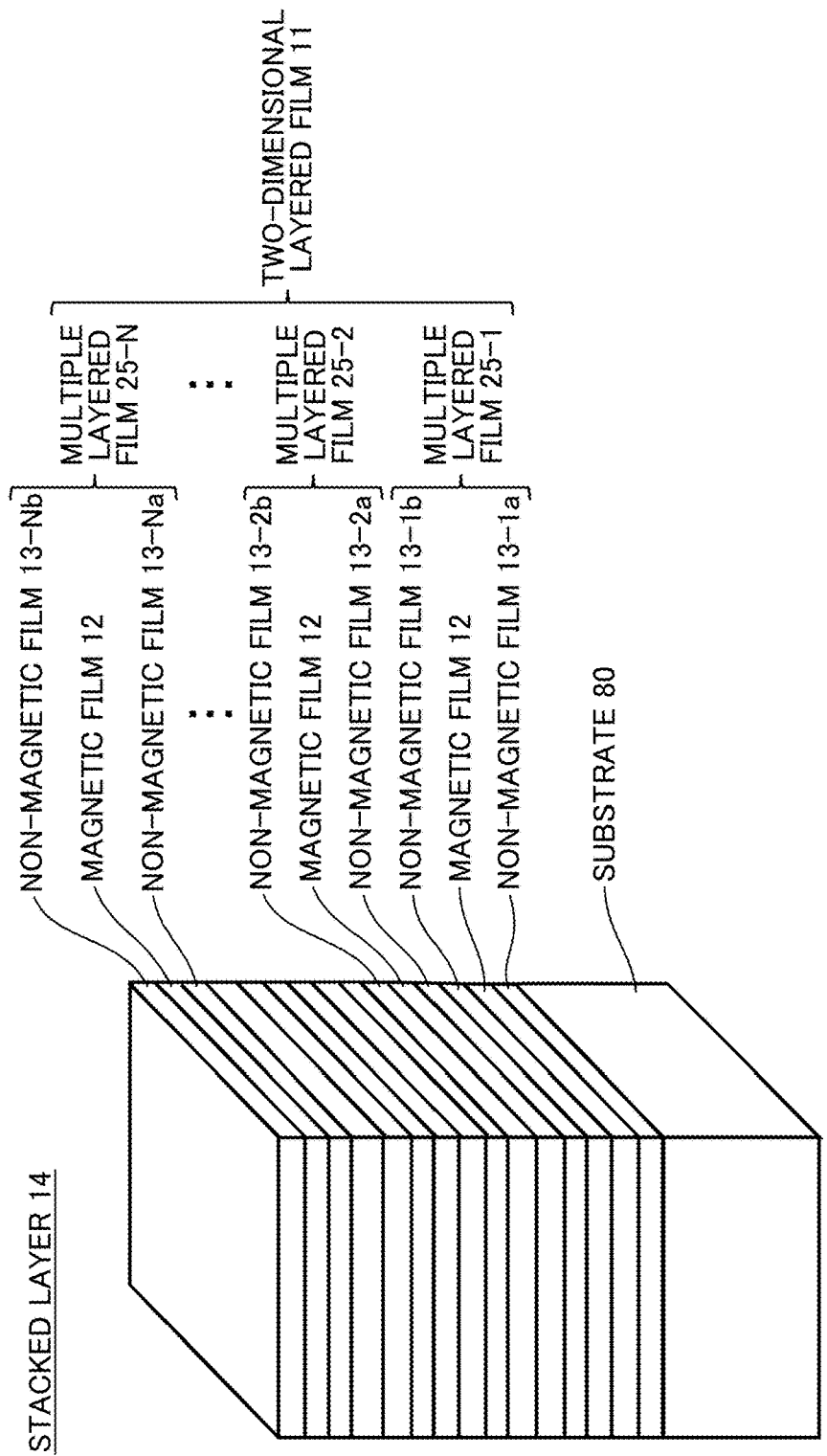
FIG. 4 illustrates one example of a configuration of a stacked layer 14 forming a skyrmion phase.

FIG. 4 illustrates one example of a configuration of a stacked layer 14 forming a skyrmion phase.

The stacked layer 14 of the present example comprises a substrate 80 and a two-dimensional stacked film 11 formed on the substrate 80.

The two-dimensional stacked film 11 is formed of N multiple layered films 25. Each of N multiple layered films 25 includes a magnetic film 12 and a non-magnetic film 13 which are stacked on each other. For example, a multiple layered film 25-1 has a structure in which a non-magnetic film 13-1a, the magnetic film 12 and a non-magnetic film 13-1b are stacked. A multiple layered films 25-2 has a structure in which a non-magnetic film 13-2a, the magnetic film 12 and a non-magnetic film 13-2b are stacked. Also, a multiple layered films 25-N has a structure in which a non-magnetic film 13-Na, the magnetic film 12 and a non-magnetic film 13-Nb are stacked. N multiple layered films 25 may include the non-magnetic films 13 formed of different material, respectively. Also, N multiple layered films 25 may also be formed to have different film thicknesses, respectively. In one example, the number of layers of the multiple layered films 25 and material of the magnetic film 12 and the non-magnetic film 13 are selected such that the two-dimensional stacked film 11 does not have a reversal symmetry in a direction of the stacked layer.

In the two-dimensional stacked film 11, by stacking N multiple layered films 25, an interaction between the magnetic film 12 and the non-magnetic film 13 can be adjusted. For example, in the two-dimensional stacked film 11, N multiple layered films 25 are stacked to increase the interaction between the magnetic film 12 and the non-magnetic film 13. This allows a temperature for generating the skyrmion 40 in the two-dimensional stacked film 11 to be equal to or higher than the room temperature. Also, the size of the skyrmion 40 to be generated can be smaller.

Figure 5:
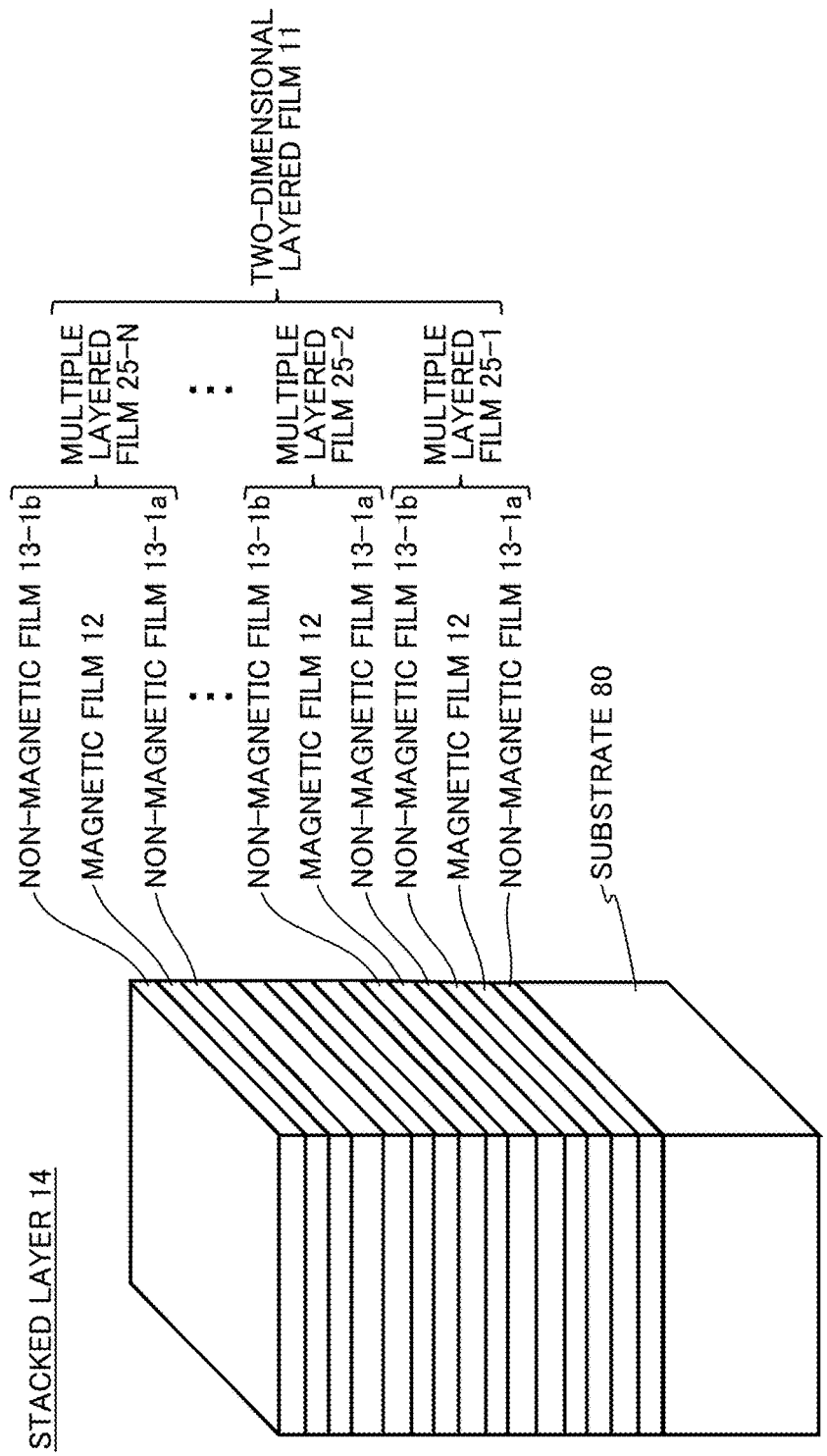
FIG. 5 illustrates one example of a configuration of a stacked layer 14 forming a skyrmion phase.

FIG. 5 illustrates one example of a configuration of a stacked layer 14 forming a skyrmion phase.

N multiple layered films 25 of the present example include multiple layered films 25-1 to 25-N formed of the same material, respectively. Also, N multiple layered films 25 may have the same film thickness, respectively. The multiple layered film 25 of the present example includes the non-magnetic film 13-1a, the magnetic film 12 and the non-magnetic film 13-1b, respectively. This ensures that the two-dimensional stacked film 11 has a non-reversal symmetry with respect to the direction of the stacked layer.

Embodiment Example 1

Figure 6:
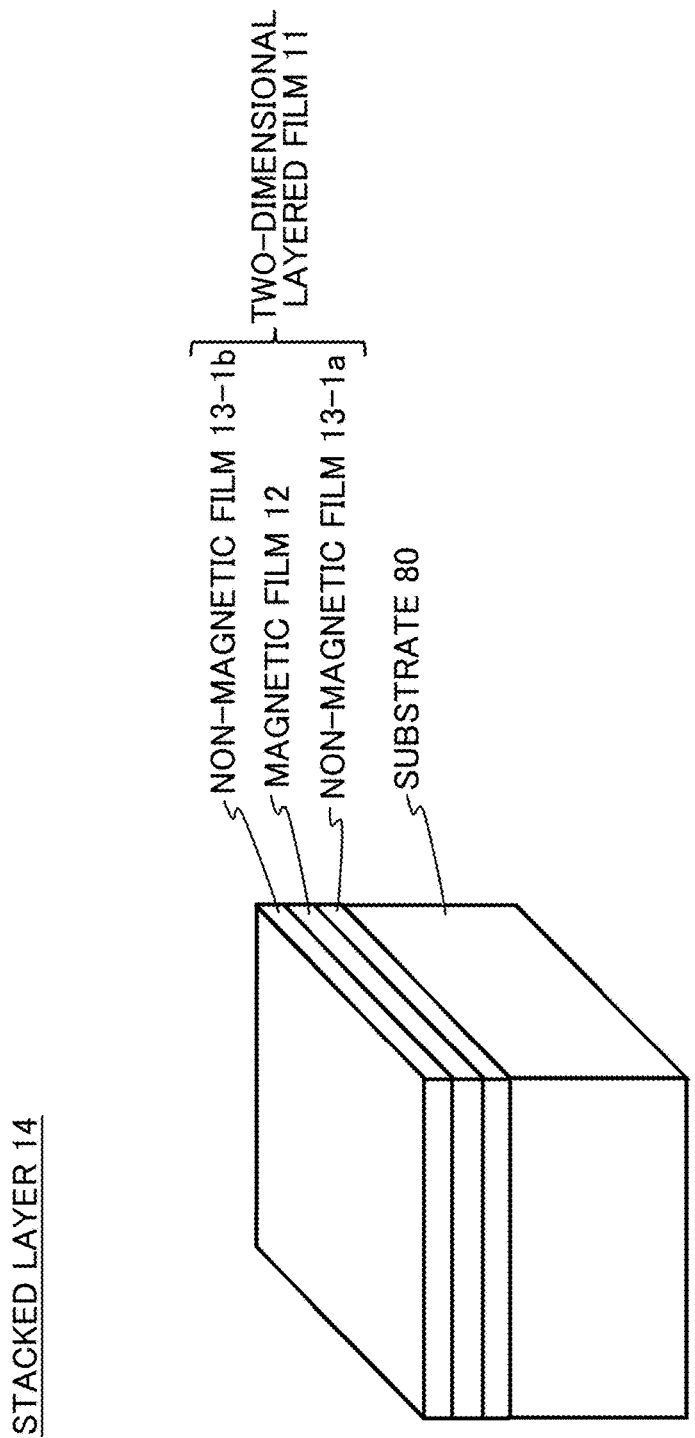
FIG. 6 illustrates one example of the two-dimensional stacked film 11 according to Embodiment Examples 1, 2.

FIG. 6 illustrates an embodiment example of a stacked layer 14 forming a skyrmion phase. The stacked layer 14 of the present example includes a two-dimensional stacked film 11. The two-dimensional stacked film 11 includes a non-magnet 13-1a, a magnetic film 12 formed on the non-magnet 13-1a, and a non-magnetic film 13-1b formed on the magnetic film 12. This corresponds to the two-dimensional stacked film 11 having N layers shown in FIG. 4 when N=1.

The magnetic film 12 is a ferromagnetic metal thin film having a strong magnetic exchange interaction J. Magnetic moments of the magnetic film 12 are oriented to a direction substantially perpendicular to a front surface of the magnetic film 12 due to the magnetic anisotropy. For example, the magnetic film 12 may be a magnetic oxide having a perovskite crystal structure.

At least one of the non-magnetic film 13-1a and the non-magnetic film 13-1b is a thin film having a strong spin-orbit interaction. A thin film having a strong spin-orbit interaction contains a heavyweight element in the periodic table. For example, a heavyweight element refers to Pd, Ag, Ir, Pt, Au, W, Re. For example, the non-magnetic film 13 is an oxide containing Pd, Ag, Ir, Pt, Au, W, Re or a plurality of these elements as a main component. Also, the non-magnetic film 13 may be a non-magnetic film formed of Pd, Ag, Ir, Pt, Au, W, Re or a plurality of these elements. The non-magnetic film 13-1a of the present example is $SrTiO_3$ and the non-magnetic film 13-1b is $SrIrO_3$. In this case, $SrIrO_3$ of the non-magnetic film 13-1b becomes a film having a strong spin-orbit interaction.

The non-magnet of the stacked layer 14 has a strong spin-orbit interaction which causes the Dzyaloshinskii-Moriya (DM) interaction D at the stack interface. The Dzyaloshinskii-Moriya (DM) interaction D generates a force to tilt and twist the magnetic moment oriented perpendicular to the front surface of the magnetic film 12.

The magnetic film 12 having a strong magnetic exchange interaction J forms the skyrmion phase by being stacked with the non-magnetic film 13 having a strong spin-orbit interaction. The generated skyrmion 40 has a diameter $\lambda$ associated with:

$$\lambda = 2\sqrt{2}\pi J a/D \quad \text{[Equation 3]}$$

and associated with the magnetic exchange interaction J and the Dzyaloshinskii-Moriya (DM) interaction D. When D is larger, the skyrmion 40 has a smaller diameter $\lambda$. When the magnetic exchange interaction J is larger, the skyrmion 40 has a larger size. As the magnetic exchange interaction J is larger, the two-dimensional stacked film 11 eventually quits to form the skyrmion 40 and transits to a ferromagnetic phase with magnetic moments aligned.

The two-dimensional stacked film 11 can independently control the magnetic exchange interaction J and the spin-orbit interaction, respectively, by adjusting material of the magnetic film 12 and the non-magnetic film 13. Also, the spin-orbit interaction causes the Dzyaloshinskii-Moriya (DM) interaction D at the stack interface. That is, by selecting the magnetic film 12 and the non-magnetic film 13, the diameter $\lambda$ of the skyrmion 40 can be adjusted to any length.

It should be noted that the skyrmion phase formed in the two-dimensional stacked film 11 cannot be confirmed easily. For example, one of methods of confirming formation of the skyrmion phase is a method using a Lorentz transmission electron microscope. A Lorentz transmission electron microscope allows magnetic moments of a magnet to be observed directly by allowing electron beams to transmit through the magnet. Also, for observation by using a Lorentz transmission electron microscope, a sample needs to be shaped to a slice of equal to or less than 100 nm. However, it is difficult to shape a stacked structure such as the two-dimensional stacked film 11 to have a slice structure of equal to or less than 100 nm.

Figure 7:
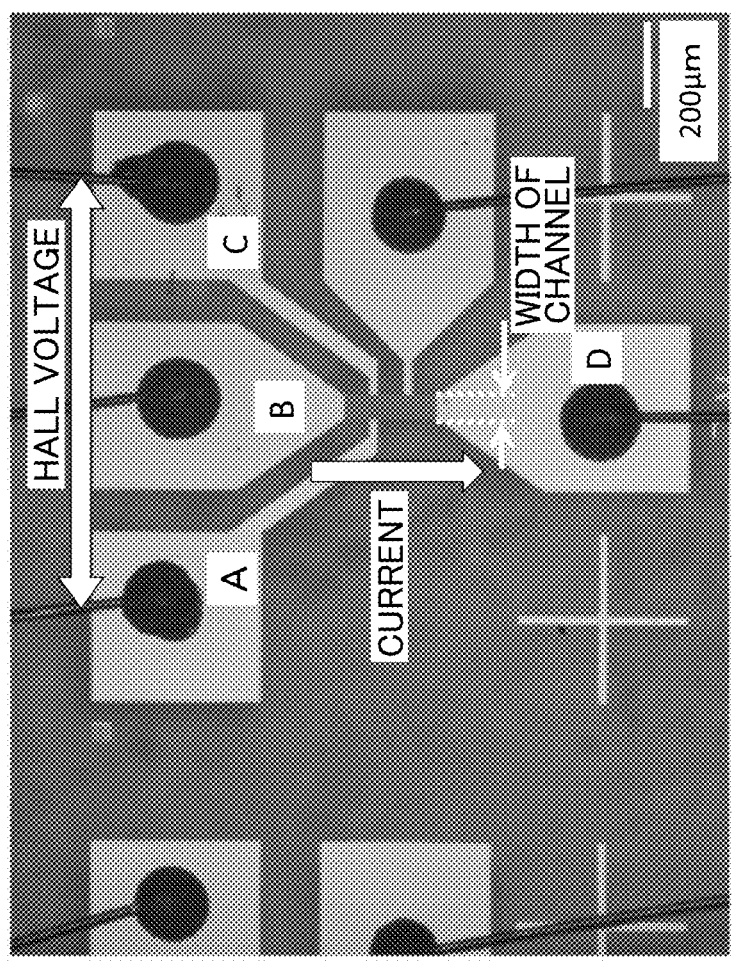
FIG. 7 illustrates one example of a pattern of electrodes for measuring the Hall voltage.

FIG. 7 illustrates one example of a pattern of electrodes for measuring the Hall voltage. By using the method of the present example, it is possible to confirm formation of the skyrmion phase through measurement of Hall voltages of the magnet. The magnet for measurement just needs to form the skyrmion phase, and is the two-dimensional stacked film 11, for example.

A pattern of electrodes for measuring the Hall voltage includes four electrodes A to D for measuring the Hall voltage connected to a channel. The electrodes A to D are formed of non-magnetic metal. A channel width of the present example is 60 µm. By using the pattern of electrodes for measuring the Hall voltage to measure the Hall resistance of the two-dimensional stacked film 11, it is detected whether the skyrmion 40 exists or not. It should be noted that the Hall resistance is in proportion to the Hall voltage.

The electrode B and the electrode D are connected to both ends of the channel. In the present example, the electrode B and the electrode D are connected to the channel to be arrayed in a longitudinal direction of the channel. Then, currents for measuring the Hall voltage are made flowing from the electrode B to the electrode D.

The electrode A and the electrode C are used to measure the Hall voltage generated by the currents flowing through the channel. The electrode A and the electrode C are connected to an end portion of the channel in a direction perpendicular to a direction of the currents flowing through the channel. It should be noted that a manufacturing cost can be reduced by forming the electrode B and the electrode D in the process similar to that of forming the electrode A and the electrode C.

The electrode A contacts an end portion of the two-dimensional stacked film 11 to be arranged perpendicular to the array of the electrode B and the electrode D. The electrode A just needs to contact at least a part of one end of the two-dimensional stacked film 11. For example, if the electrode B and the electrode D are arranged on and under the two-dimensional stacked film 11, the electrode A is arranged on the left side of the two-dimensional stacked film 11.

The electrode C contacts an opposite end portion of the two-dimensional stacked film 11 to be apart from the electrode A. The electrode C just needs to contact at least a part of one end of the two-dimensional stacked film 11. For example, if the electrode B and the electrode D are arranged on and under the two-dimensional stacked film 11, the electrode C is arranged on the right side of the two-dimensional stacked film 11.

If the skyrmion 40 exists, currents made flowing between the electrode B and the electrode D (a flowing direction of electrons is opposite to a direction of the currents) generate the Hall voltage in a direction perpendicular to a flowing direction of the currents. On the other hand, if the skyrmion 40 does not exist, the Hall voltage indicates a minimum value. A method of detecting the skyrmion 40 according to the present embodiment has a high sensitivity because one of the Hall voltages to be compared is small.

A Hall resistivity is a sum of a ordinary Hall resistivity ratio, an anomalous Hall resistivity, and a topological Hall resistivity. A conduction electron is considered to have one magnetic moment (in a direction opposite to a spin orientation). Therefore, a magnetic moment of a conduction electron interacts with a magnetic moment in a magnet. The ordinary Hall resistivity is a value to which a voltage generated from conduction electron currents scattered in a direction perpendicular to an incident direction of the conduction electron currents by a Lorentz force of an external magnetic field from the outside of the magnet (that is, Hall voltage) is standardized by the incident electron current. The anomalous Hall resistivity is a value to which a voltage generated from conduction electron currents scattered in a direction perpendicular to an incident direction of the conduction electron currents by a Lorentz force of the magnetic field from magnetic moments of a ferromagnet (that is, anomalous Hall voltage) is standardized by the incident electron current. The topological Hall resistivity $\rho_{yx}^T$ is a value to which a voltage generated from conduction electron currents scattered in a direction perpendicular to an incident direction of the conduction electron currents by a Lorentz force of the magnetic field from magnetic moments of the skyrmion 40 (that is, topological Hall voltage) is standardized by the incident electron current.

Figure 8:
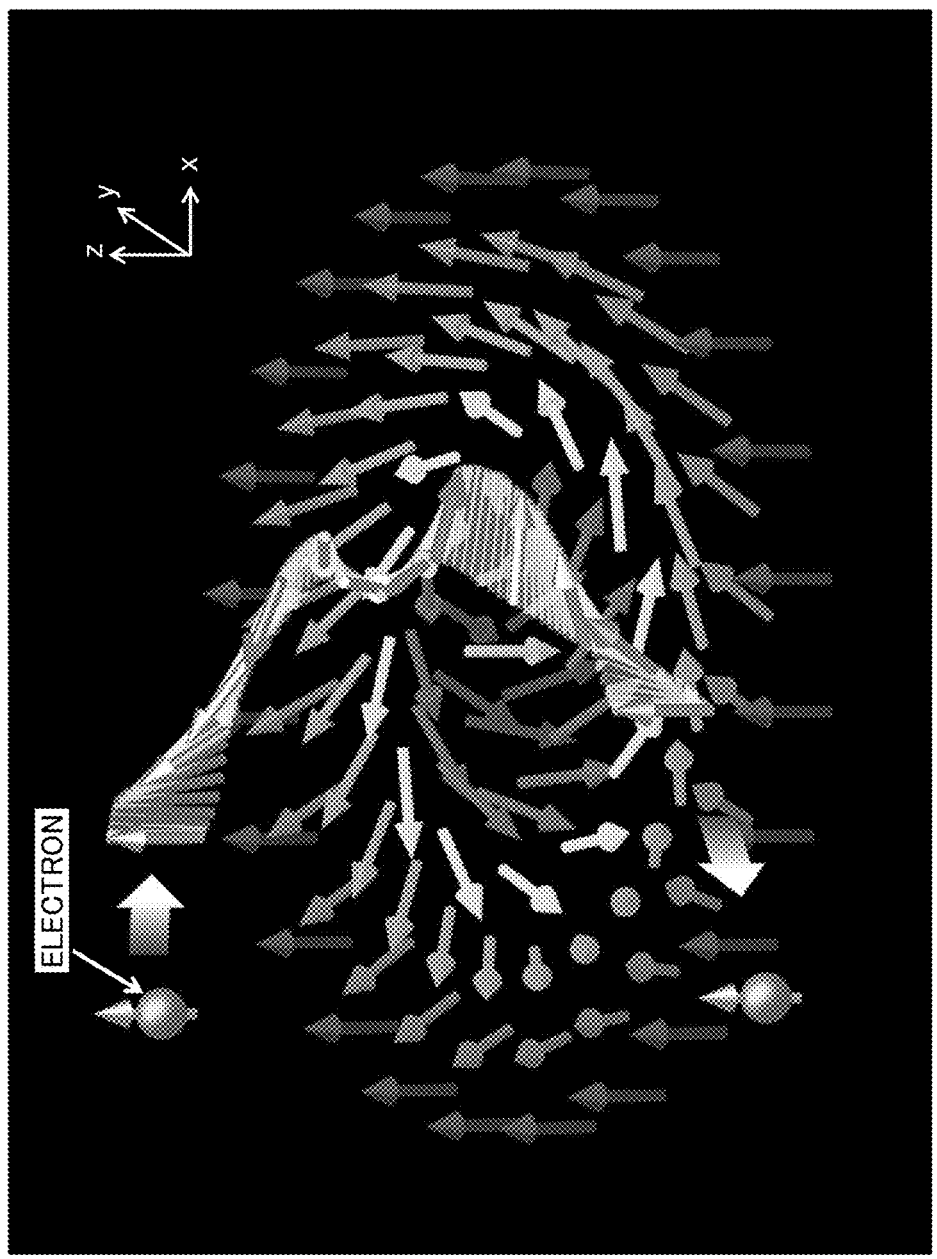
FIG. 8 is schematic view illustrating a mechanism of generation of Hall voltages in the skyrmion phase.

FIG. 8 is a schematic view illustrating a mechanism in which conduction electron currents generate the Hall voltage by a Lorentz force of a magnetic field from magnetic moments configuring the skyrmion 40. Unlike the magnetic moments aligned in the z axis direction in the ferromagnet, the skyrmion structure is a vortex-like structure. Therefore, spin-polarized electron currents passing through the skyrmion is subject to the Lorentz force from the magnetic field which is also twisted. As described above, the Hall resistivity can be represented by the following equation (Non-Patent Document 1).

$$\rho_H = \rho_H^N + \rho_H^A + \rho_H^T = R_0 B + S\rho_{xx}^2 M + \rho_H^T \quad \text{[Equation 4]}$$

Here, the first term is the ordinary Hall resistivity in proportion to a Hall factor $R_0$ of the Lorentz force based on the applied magnetic field B. The second term is the anomalous Hall resistivity induced by a magnetic moment M in the z direction indicating a ferromagnetism. The third term is the topological Hall resistivity $\rho_H^T$ due to the conduction electron currents scattered by the vortex-like magnetic moments configuring the skyrmion 40. The topological Hall resistivity $\rho_H^T$ is represented by Equation 5.

$$\rho_H^T = \rho_{yx}^T = PR_0 B_{eff} \quad \text{[Equation 5]}$$

P is a spin polarizability. The spin polarizability P is a physical amount specific to material due to electron bands split by the magnetic moment M of the magnetic film 12. $B_{eff}$ is an effective magnetic field based on a geometric arrangement of the magnetic moments of the skyrmion 40.

$$B_{eff} = \sqrt{3}\Phi_o/2\lambda^2 \quad \text{[Equation 6]}$$

A unit of a magnetic flux generated from the skyrmion 40 is $\Phi_o = h/e$. It should be noted that h is a constant of Planck.

As described above, by measuring the Hall resistivity $\rho_H$, it can be detected whether the topological Hall resistivity $\rho_H^T$ contributes or not. If there is contribution of the topological Hall resistivity $\rho_H^T$, it can be proven that the skyrmion 40 exists. Further, the diameter λ of the skyrmion can be calculated from Equation 6.

Figure 9:
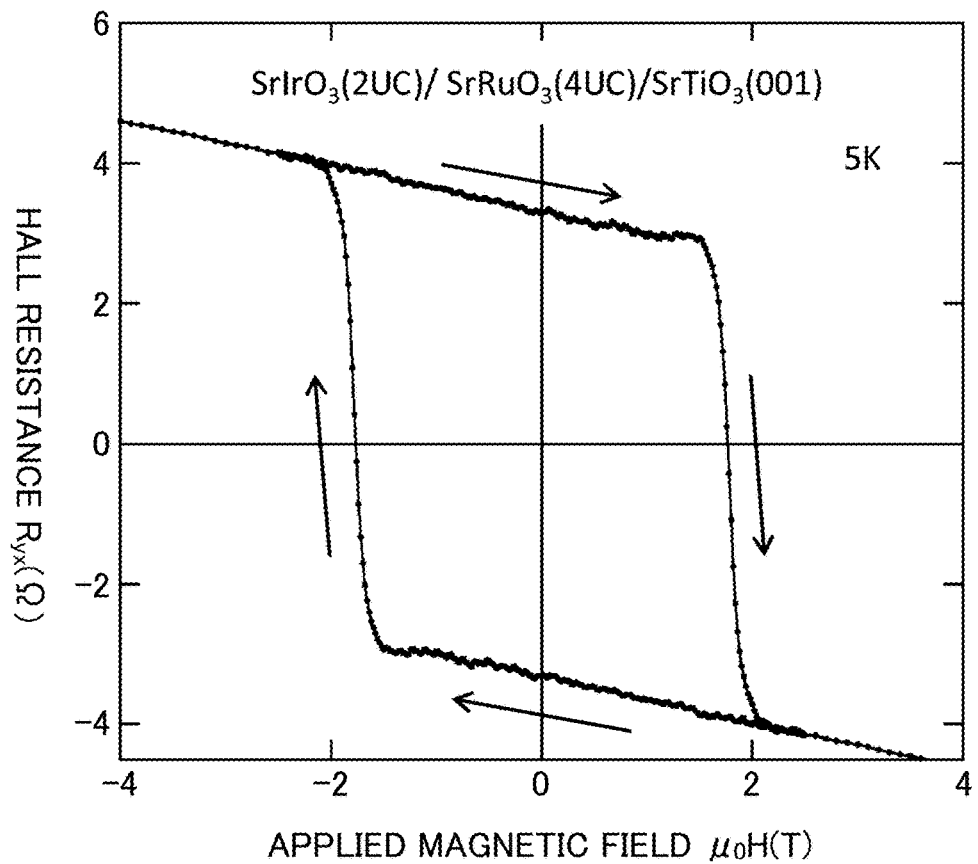
FIG. 9 illustrates a magnetic field dependency of a Hall resistance of a stacked layer 14 at 5 K.

FIG. 9 illustrates a magnetic field dependency of a Hall resistance of a stacked layer 14 at 5 K. The stacked layer 14 of the present example is an SrIrO$_3$ (2 UC)/SrRuO$_3$ (4 UC)/SrTiO$_3$ (001) stacked film. The vertical axis represents a Hall resistance $R_{yx}$ (Ω) while the horizontal axis represents an applied magnetic field $\mu_0 H$ (T). An UC means a unit cell, and one UC represents a monolayer thickness. For example, the monolayer thickness of SrIrO$_3$, SrRuO$_3$ is 4 angstroms.

The Hall resistance of the present example indicates hysteresis characteristics. The hysteresis characteristics result from the anomalous Hall resistance. That is, the magnetic moments in the ferromagnet indicate the hysteresis characteristics. Also, the Hall resistance of the present example has small peaks when the applied magnetic field is around ±2 tesla. This peak results from the topological Hall resistance and occurs when the skyrmion 40 exists.

Figure 10:
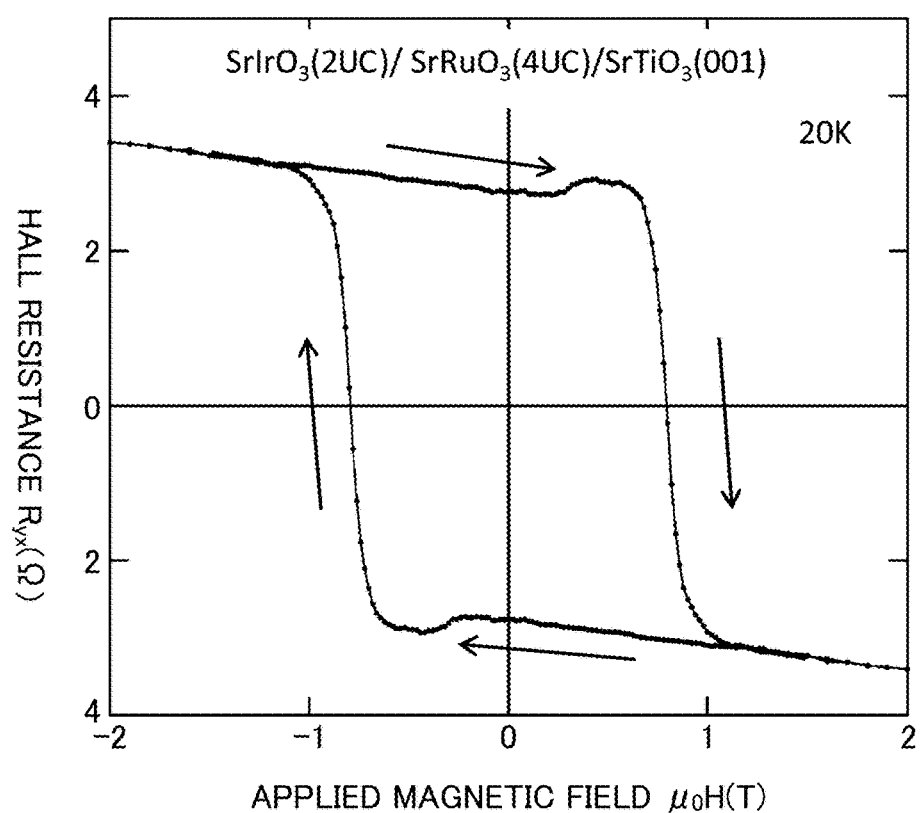
FIG. 10 illustrates a magnetic field dependency of a Hall resistance of the stacked layer 14 at 20 K.

FIG. 10 illustrates a magnetic field dependency of a Hall resistance of the stacked layer 14 at 20 K. The stacked layer 14 of the present example is an SrIrO$_3$ (2 UC)/SrRuO$_3$ (4 UC)/SrTiO$_3$ (001) stacked film. In the present example, peaks occur remarkably at shoulders when the applied magnetic field is around ±1 tesla. This peak results from the topological Hall resistance formed by the skyrmion 40.

Figure 11:
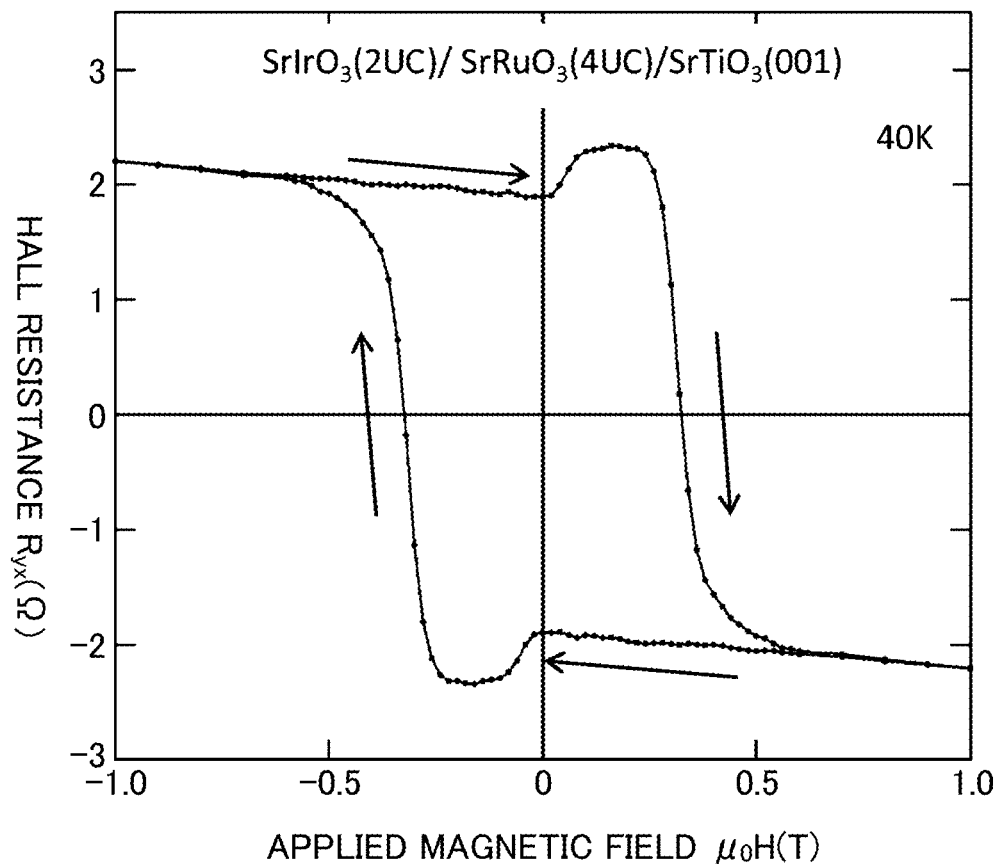
FIG. 11 illustrates a magnetic field dependency of a Hall resistance of the stacked layer 14 at 40 K.

FIG. 11 illustrates a magnetic field dependency of a Hall resistance of the stacked layer 14 at 40 K. The stacked layer 14 of the present example is an SrIrO$_3$ (2 UC)/SrRuO$_3$ (4 UC)/SrTiO$_3$ (001) stacked film. In the present example, peaks occur at shoulders when the applied magnetic field is around ±0.2 tesla. This peak results from the topological Hall resistance formed by the skyrmion 40. The peak at 40 K is larger than the one at 20 K. This results from a smaller diameter of the skyrmion 40 and a stronger effective magnetic field as calculated from Equation 6.

Figure 12:
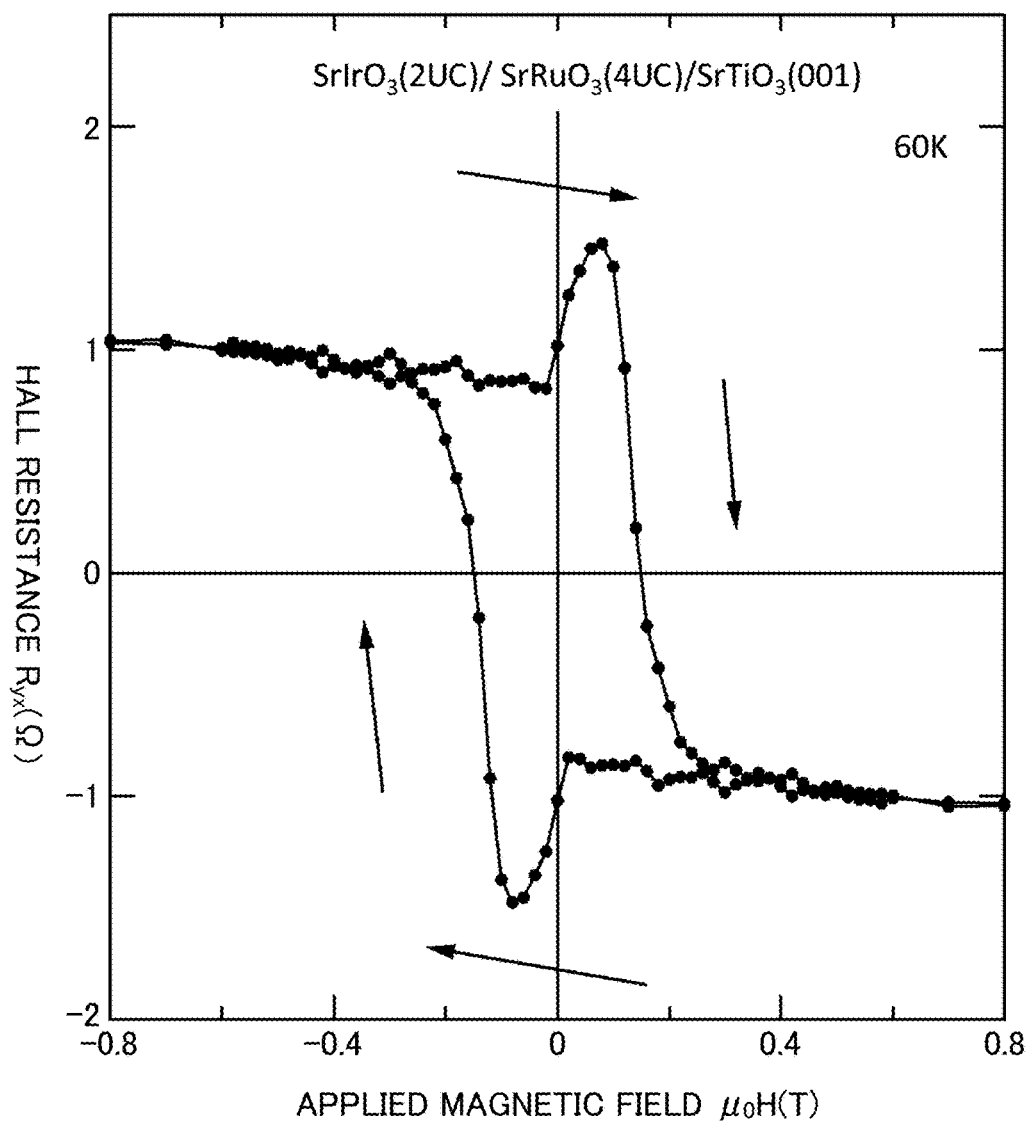
FIG. 12 illustrates a magnetic field dependency of a Hall resistance of the stacked layer 14 at 60 K.

FIG. 12 illustrates a magnetic field dependency of a Hall resistance of the stacked layer 14 at 60 K. The stacked layer 14 of the present example is an SrIrO$_3$ (2 UC)/SrRuO$_3$ (4 UC)/SrTiO$_3$ (001) stacked film. In the present example, peaks occur at shoulders when the applied magnetic field is around ±0.1 tesla. This peak results from the topological Hall resistance formed by the skyrmion 40. The peak at 60 K is still larger than the one at 40 K. That is, it should be understood that the diameter of the skyrmion 40 becomes still smaller.

Figure 13:
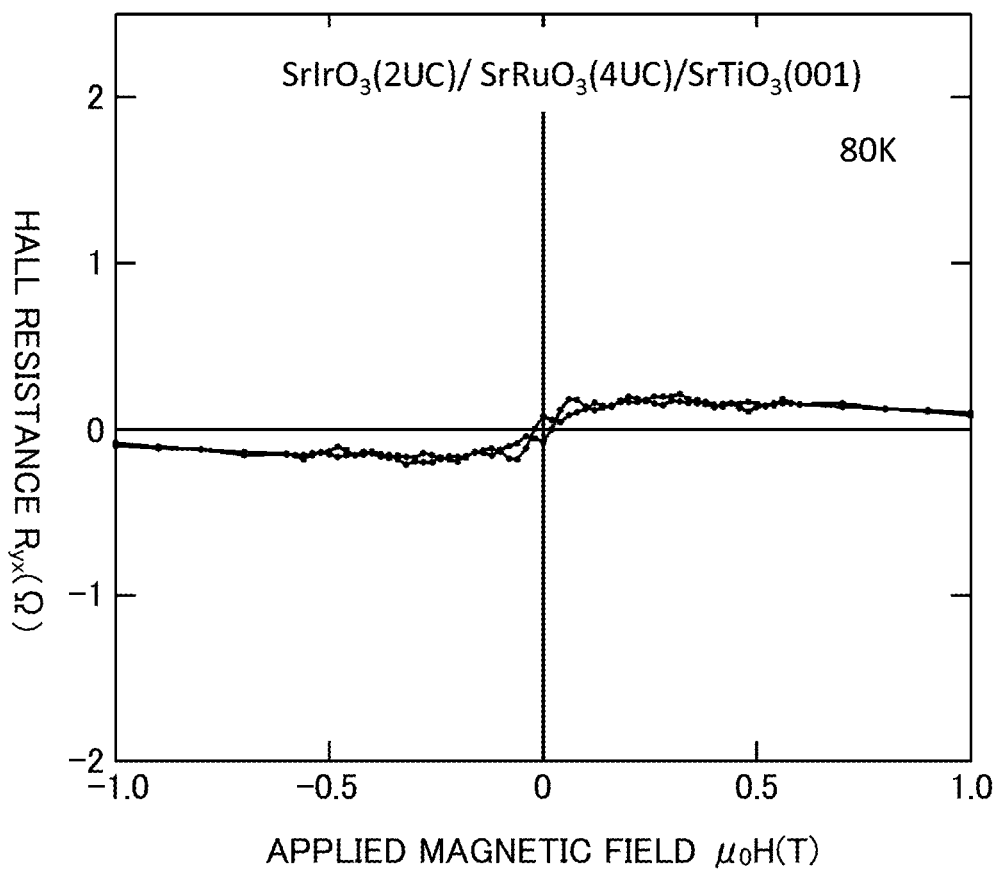
FIG. 13 illustrates a magnetic field dependency of a Hall resistance of the stacked layer 14 at 80 K.

FIG. 13 illustrates a magnetic field dependency of a Hall resistance of the stacked layer 14 at 80 K. The stacked layer 14 of the present example is an SrIrO$_3$ (2 UC)/SrRuO$_3$ (4 UC)/SrTiO$_3$ (001) stacked film. In the present example, contribution from the ferromagnetic component becomes smaller and the hysteresis characteristics of the anomalous Hall resistance become smaller. Also, it should be understood that there is no contribution of the topological Hall resistance and the skyrmion 40 disappears.

Figure 14:
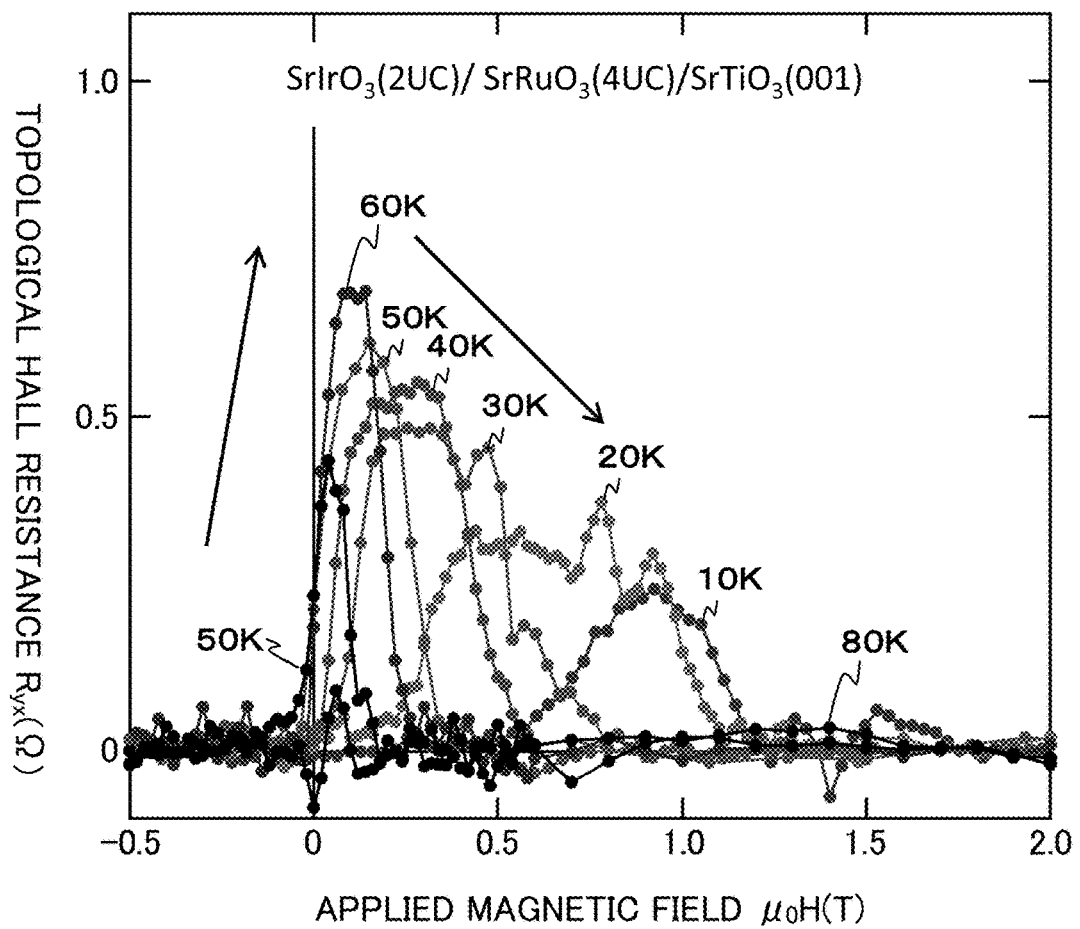
FIG. 14 illustrates a Hall resistance derived from a skyrmion of a stacked thin film of $SrIrO_3$ and $SrTiO_3$.

FIG. 14 illustrates the topological Hall resistance $R_{yx}$ (Ω) of the stacked layer 14. Also, FIG. 14 only illustrates contribution of the components of the topological Hall resistance from FIG. 9 to FIG. 13. It should be understood that as the temperature rises from a low temperature of 10 K, the stacked layer 14 forms the skyrmion 40 regardless of a small strength of the applied magnetic field. It should be understood that the strength is larger around 40 K and the skyrmion 40 has a radius of the minimum value around 40 K.

Figure 15:
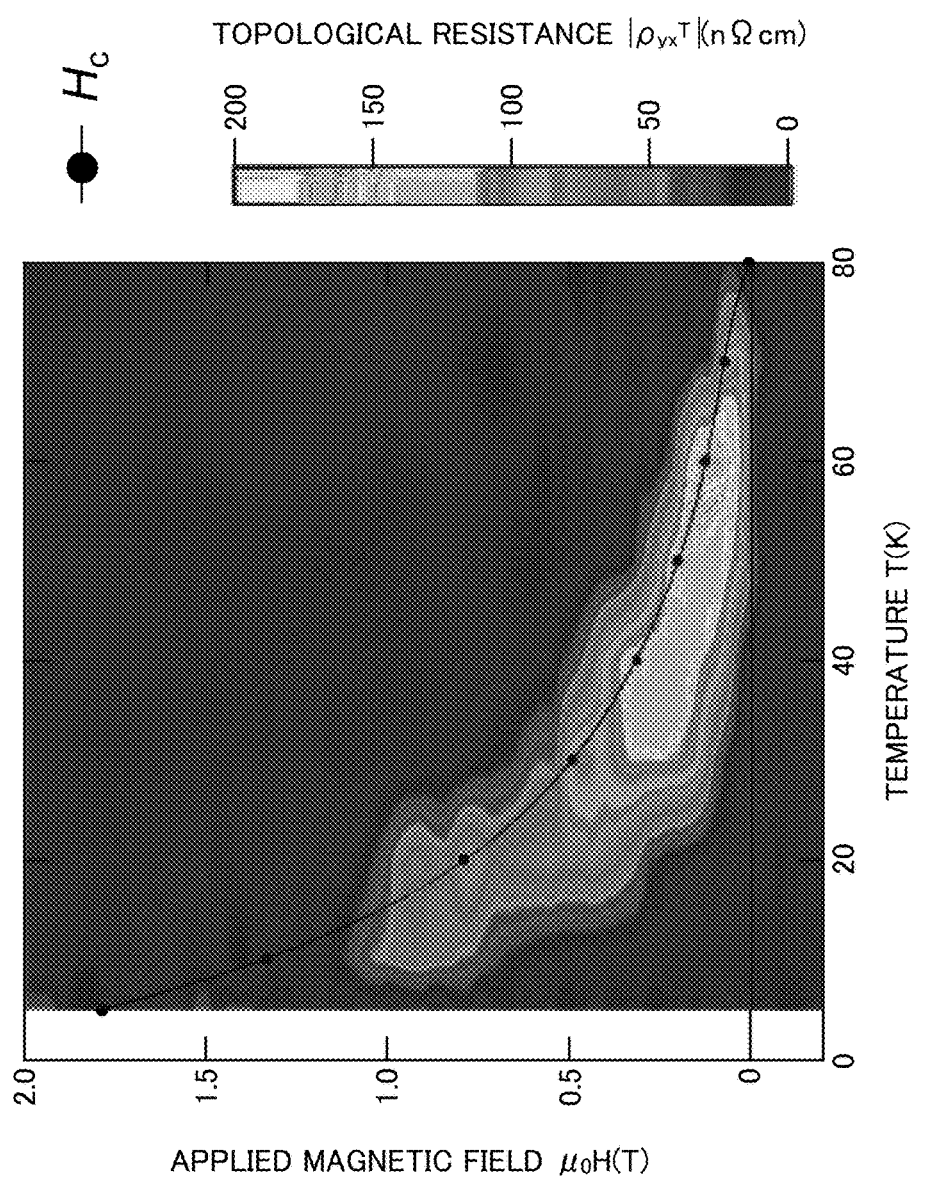
FIG. 15 is a phase diagram illustrating a skyrmion phase of an $SrIrO_3/SrRuO_3/SrTiO_3$ stacked thin film.

FIG. 15 illustrates a magnetic phase diagram of the stacked layer 14. The magnetic phase diagram of the stacked layer 14 explicitly indicates a region in which the skyrmion 40 exists calculated from the topological Hall resistance. The stacked layer 14 of the present example is an SrIrO$_3$ (2 UC)/SrRuO$_3$ (4 UC)/SrTiO$_3$ (001) stacked film. The vertical axis represents the applied magnetic field $\mu_0 H$ (T) while the horizontal axis represents the temperature T (K) of the stacked layer 14. In the present example, the regions are illustrated by a grayscale in accordance with the magnitude of the topological Hall resistance. Each region corresponds to a range from 0 nΩcm to 200 nΩcm and is colored in a lighter color as the topological Hall resistance is larger. The region in which the topological Hall resistance has an absolute value equal to or more than 10 nΩcm indicates that the skyrmion 40 is formed. The region in which the topological Hall resistance has an absolute value equal to or more than 10 nΩcm exists within a range of the magnetic field from 0 Oe (oersted) to 5000 Oe at a temperature region around 0 K to 80 K. In particular, the region in which the topological resistance becomes larger exists at 30 K to 60 K. If the applied magnetic field becomes larger, it transits to the ferromagnetic phase while it fails to generate the skyrmion 40. The temperature region at which the skyrmion 40 exists spans up to around the ferromagnetic transition temperature. If the magnetic film 12 is single crystal such as FeGe, the skyrmion 40 only exists in a narrow region of several temperatures immediately below the transition temperature. However, if the magnetic film 12 is a thin film, it is proven that the skyrmion 40 exists stably in a broad temperature range. It should be noted that the magnetic phase diagram of the present example is one example in which an SrIrO$_3$ (2 UC)/SrRuO$_3$ (4 UC)/SrTiO$_3$ (001) stacked film is used as the stacked layer 14, and the magnetic phase diagram is varied if another material is used.

Figure 16:
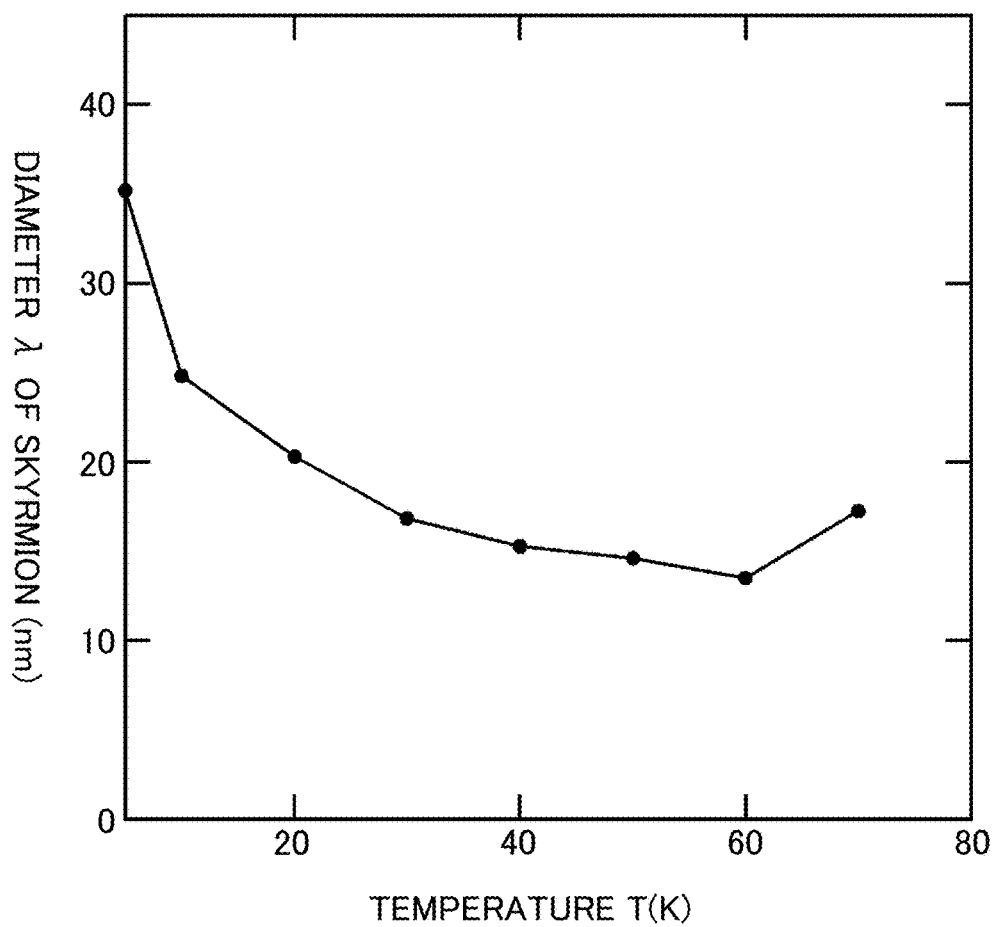
FIG. 16 illustrates a skyrmion size of an $SrIrO_3/SrRuO_3/SrTiO_3$ stacked thin film.

FIG. 16 illustrates a relationship between the diameter λ (nm) of the skyrmion 40 and the temperature T (K). The stacked layer 14 of the present example is an SrIrO$_3$ (2 UC)/SrRuO$_3$ (4 UC)/SrTiO$_3$ (001) stacked film.

The diameter λ of the skyrmion 40 is calculated from Equation 5. In the stacked film of the present example, a spin polarizability P is equal to or less than −0.1 (Non-Patent Document 2). The skyrmion 40 has the diameter λ of approximately 35 nm around 0K, approximately 20 nm around 20 K, approximately 15 nm at 40 K, and approximately 13 nm at 60 K. The smaller diameter the skyrmion 40 has, the larger the density of the skyrmion carrying information per unit area becomes. As a density of a storage capacity is in inverse proportion to the squared diameter of the skyrmion 40, the diameter of the skyrmion 40 is an important control factor of the storage capacity of the memory.

Figure 17:
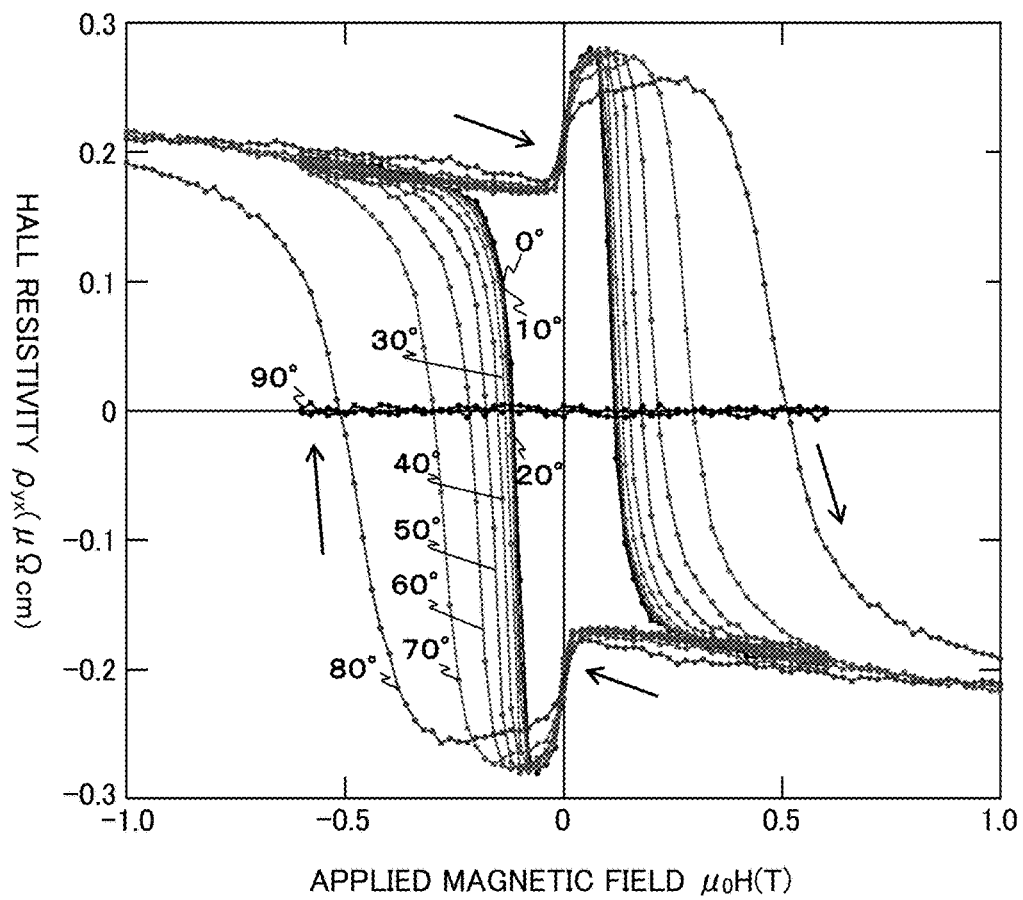
FIG. 17 illustrates an angle dependency to the magnetic field of an $SrIrO_3/SrRuO_3/SrTiO_3$ stacked thin film.

FIG. 17 illustrates an angle dependency of the Hall resistivity against the applied magnetic field. The stacked layer 14 of the present example is an $SrIrO_3$ (2 UC)/$SrRuO_3$ (4 UC)/$SrTiO_3$ (001) stacked film at 40 K. In the present example, an incident angle of the applied magnetic field to the stacked layer 14 is varied from 0 to 90 degrees. The topological Hall resistance indicates almost the same value at angles of 0 to 80 degrees.

Figure 18:
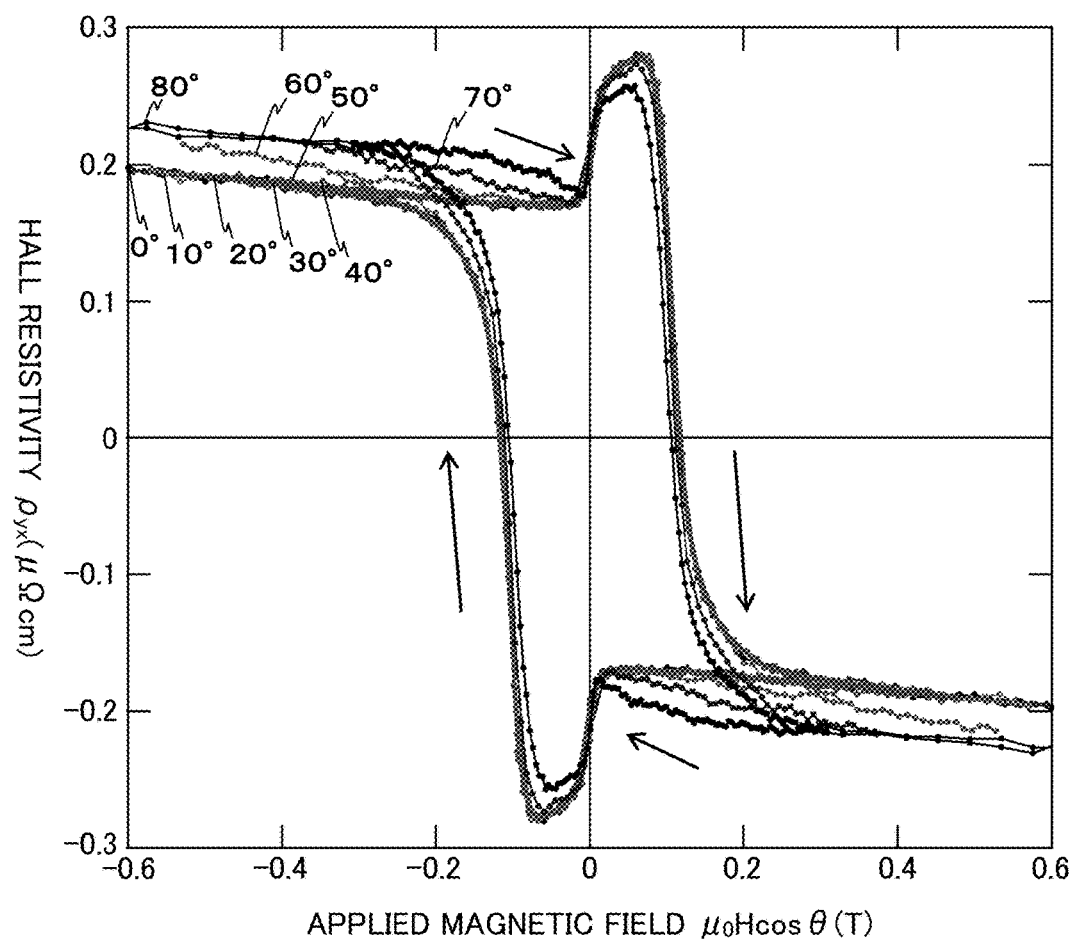
FIG. 18 illustrates a magnetic field cos θ angle dependency of an $SrIrO_3/SrRuO_3/SrTiO_3$ stacked thin film.

FIG. 18 illustrates an angle dependency of the Hall resistivity against a cosine component of the applied magnetic field. The stacked layer 14 of the present example has the same configuration as the one in FIG. 17. The cosine component of the applied magnetic field represents an applied magnetic field in a direction perpendicular to a front surface of the stacked layer 14. In the present example, an incident angle of the applied magnetic field to the stacked layer 14 is varied from an angle of 0 degree to an angle of 80 degrees. At angles of 0 to 80 degrees, if the horizontal axis is represented by the cosine component of the applied magnetic field, the topological Hall resistances are almost overlapped. That is, it is indicated that the topological resistance depends on the component of the applied magnetic field in a direction perpendicular to the stacked layer 14. This indicates that the structure of the skyrmion 40 in the thickness direction is definitely formed to be perpendicular to the front surface of the stacked layer 14. That is, it should be understood that the skyrmion 40 which results from the magnetic exchange interaction J and the Dzyaloshinskii-Moriya (DM) interaction D has no dependency on the direction of the applied magnetic field.

Figure 19:
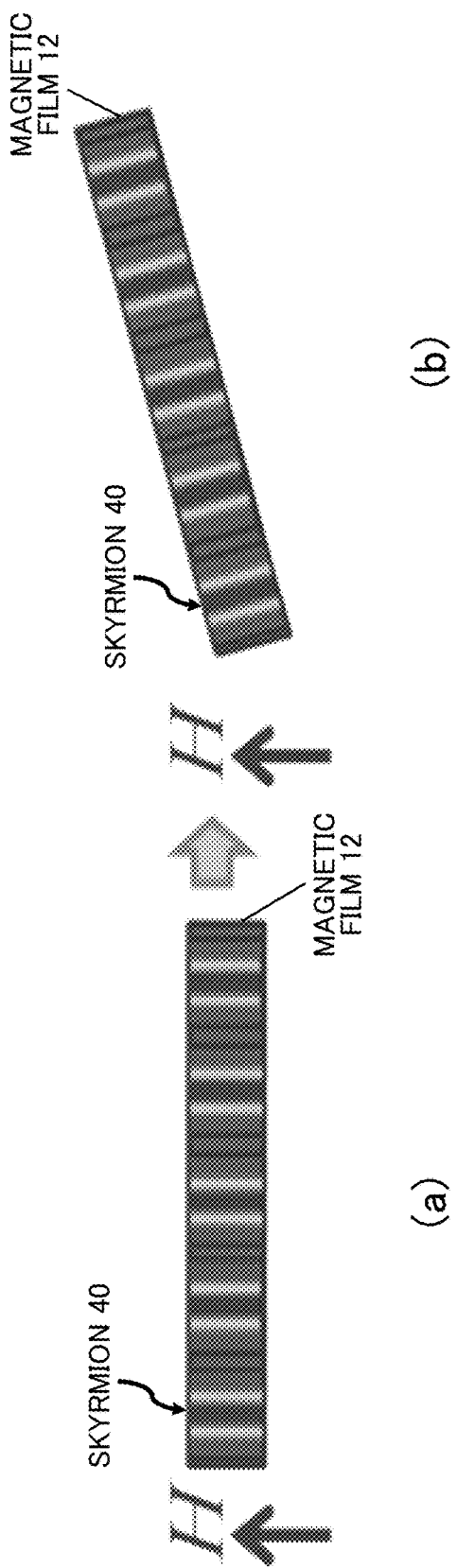
FIG. 19 illustrates a cross sectional view of the magnetic film 12 forming the skyrmion 40.

FIG. 19 illustrates a cross sectional view of the magnetic film 12 forming the skyrmion 40. In the present example, to describe orientation of which the skyrmion 40 is formed with respect to the front surface of the magnetic film 12, the skyrmion 40 is schematically illustrated. The orientation of the skyrmion 40 refers to an orientation of the magnetic moment at the center or on the outermost circumference of the skyrmion 40 when the skyrmion 40 is ideally formed.

FIG. 19(*a*) illustrates the case in which the applied magnetic field is input to be perpendicular to the two-dimensional surface of the magnetic film 12. On the other hand, FIG. 19(*b*) illustrates the case in which the applied magnetic field is input to be tilted against the two-dimensional surface of the magnetic film 12. Even in either case of FIG. 19(*a*) or (*b*), the orientation of the skyrmion 40 is perpendicular to the front surface of the magnetic film 12.

As illustrated in the present embodiment example, the skyrmion phase can be formed by stacking the magnetic film 12 with a strong magnetic exchange interaction J and the non-magnetic film 13 with a strong spin-orbit interaction. In the present embodiment example, the skyrmion phase can be formed even if the magnetic film 12 is not formed of a chiral magnet. The two-dimensional stacked film 11 of the present example generates the skyrmion 40 having an orientation perpendicular to the front surface of the two-dimensional stacked film 11, regardless of the angle to the magnetic field.

Embodiment Example 2

Next, a two-dimensional stacked film 11 according to Embodiment Example 2 will be described. The basic configuration is similar to that of the two-dimensional stacked film 11 described in FIG. 6. The two-dimensional stacked film 11 comprises a magnetic film 12 and a non-magnetic film 13, and forms the skyrmion phase. The non-magnetic film 13 is formed of a non-magnetic film 13-1*a* and a non-magnetic film 13-1*b*. The two-dimensional stacked film 11 of the present example is formed by a magnetron sputtering apparatus.

The magnetic film 12 indicates a flexible magnetization characteristic such that an orientation of the magnetization easily responds to an applied magnetic field. The magnetic film 12 is a magnetic thin film with a dipole-dipole interaction. The magnetic thin film with a dipole-dipole interaction forms the skyrmion phase by a dipole interaction. The magnetic thin film with a dipole-dipole interaction may be formed of a magnet formed of Cr, V, Mn, Fe, Co, Ni, Cu or a plurality of these metal elements. Also, the magnetic film 12 may be a magnetic oxide having a perovskite crystal structure. For example, the magnetic film 12 is a thin film of $La_{1-x}Sr_xMnO_3$ added with Ru elements, where x is such that $0 \leq x \leq 1$. The magnetic film 12 of the present example is $La_{0.7}Sr_{0.3}MnO_3$ and has a film thickness of 40 nm. An $La_{0.7}Sr_{0.3}MnO_3$ thin film is a perovskite oxide to be ferromagnetic metal. The $La_{0.7}Sr_{0.3}MnO_3$ thin film has a ferromagnetic transition temperature of 350 K and is a ferromagnetic phase up to a temperature equal to or higher than the room temperature.

The non-magnetic film 13 is formed of an LSAT $((LaAlO_3)_{0.7}(SrAl_{0.5}Ta_{0.5}O_3)_{0.3})$ thin film which is a non-magnetic thin film LSAT is a perovskite oxide. On an LSAT (001) surface, an $La_{0.7}Sr_{0.3}MnO_3$ thin film doped with Ru is stacked. Here, the LSAT thin film plays a role such that the $La_{0.7} Sr_{0.3}MnO_3$ thin film doped with Ru forms a crystal lattice at an atomic layer level. That is, the non-magnetic film 13 selects a film having a lattice constant close to a lattice constant of the magnetic film 12. The non-magnetic film 13 of the present example has a film thickness of 0.5 mm.

What is important for the two-dimensional stacked film 11 to form the skyrmion phase is a magnetic characteristic of the magnetic film 12 formed of the $LaSrMnO_3$ thin film doped with Ru. The two-dimensional stacked film 11 forms the skyrmion phase by the magnetic film 12 formed of a dipole magnet of which orientations of magnetic moments are flexible, and the non-magnetic film 13-1*a* and the non-magnetic film 13-1*b* stacked on and under the magnetic film 12.

Figure 20:
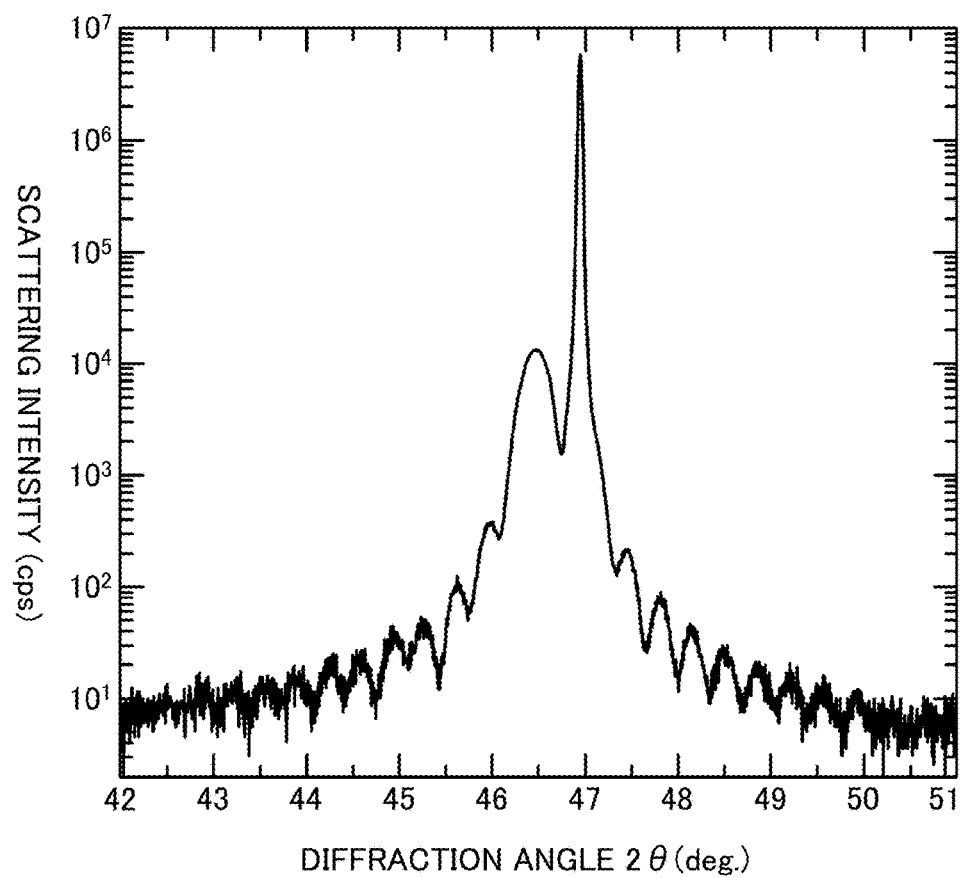
FIG. 20 is an X ray diffraction pattern of an LaSrMnO3 thin film added with Ru elements to 5% of Mn.

FIG. 20 illustrates an X ray diffraction pattern of the two-dimensional stacked film 11. The two-dimensional stacked film 11 of the present example includes an $La_{0.7}Sr_{0.3}MnO_3$ thin film doped with Ru formed on the LSAT (001) surface. The vertical axis represents a scattering strength (cps) while the horizontal axis represents a diffraction angle 2θ (deg.)

The magnetic film 12 of the present example indicates a (001) diffraction line having a sharp diffraction angle. The (001) diffraction line indicates that the $LaSrMnO_3$ thin film doped with Ru and having a crystal lattice in an monoatom order exists on the LSAT (001) surface. It should be noted that the magnetic film 12 of the present example has a film thickness of 40 nm.

Figure 21:
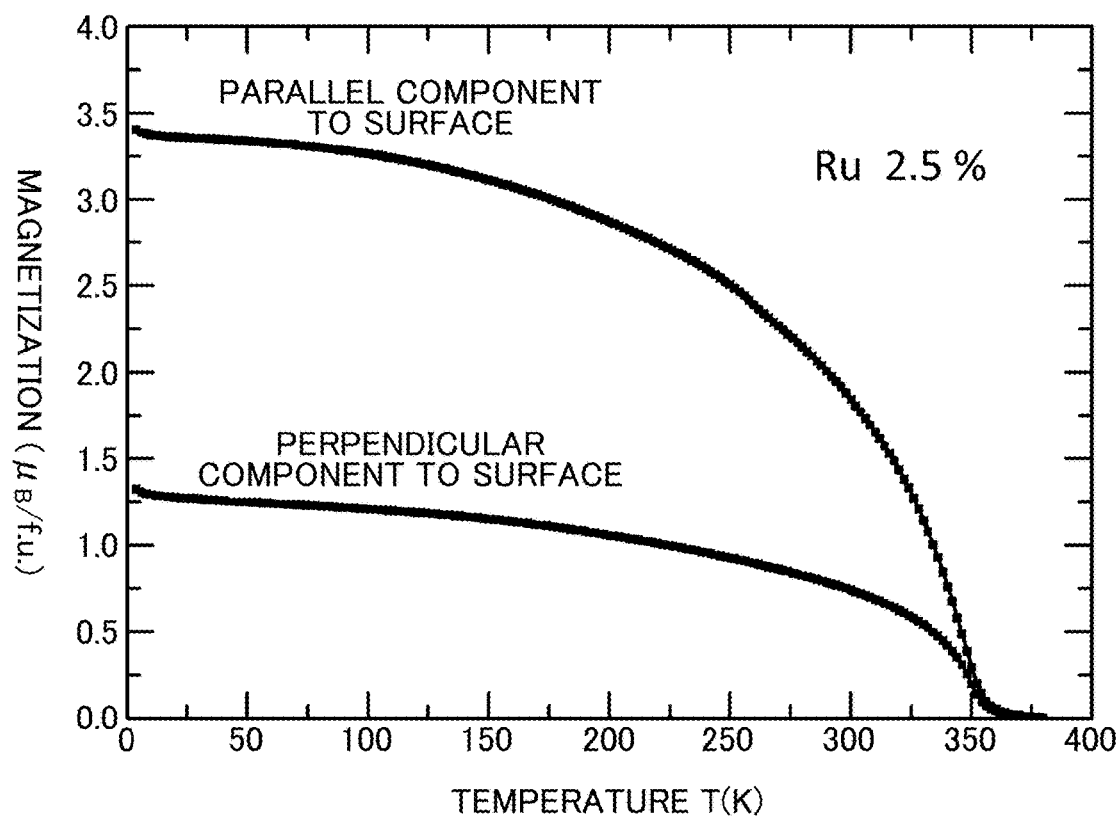
FIG. 21 illustrates a temperature dependency of magnetization of an $LaSrMnO_3$ thin film added with Ru elements to 2.5% of Mn.

FIG. 21 illustrates a temperature dependency of the magnetization of the two-dimensional stacked film 11. The two-dimensional stacked film 11 of the present example is an $LaSrMnO_3$ thin film of which the Ru doping amount is 2.5% formed on the LSAT (001) surface. The vertical axis represents the magnetization (μB/f.u.) while the horizontal axis of the two-dimensional stacked film 11 represents the temperature T (K). A graph of the present example represents parallel components to the surface and perpendicular components to the surface of the magnetization. As used herein, the parallel component to the surface of the magnetization refers to a magnetization in a direction parallel to the front surface of the two-dimensional stacked film 11. Also, the perpendicular component to the surface of the magnetization refers to a magnetization in a direction perpendicular to the front surface of the two-dimensional stacked film 11.

When the Ru doping amount is 2.5%, the parallel component to the surface of the magnetization is larger than the perpendicular component to the surface in any temperature regions. Also, it is understood that the temperature dependency of the magnetization according to the present embodiment proves that the two-dimensional stacked film 11 has a ferromagnetic transition temperature of 350 K.

Figure 22:
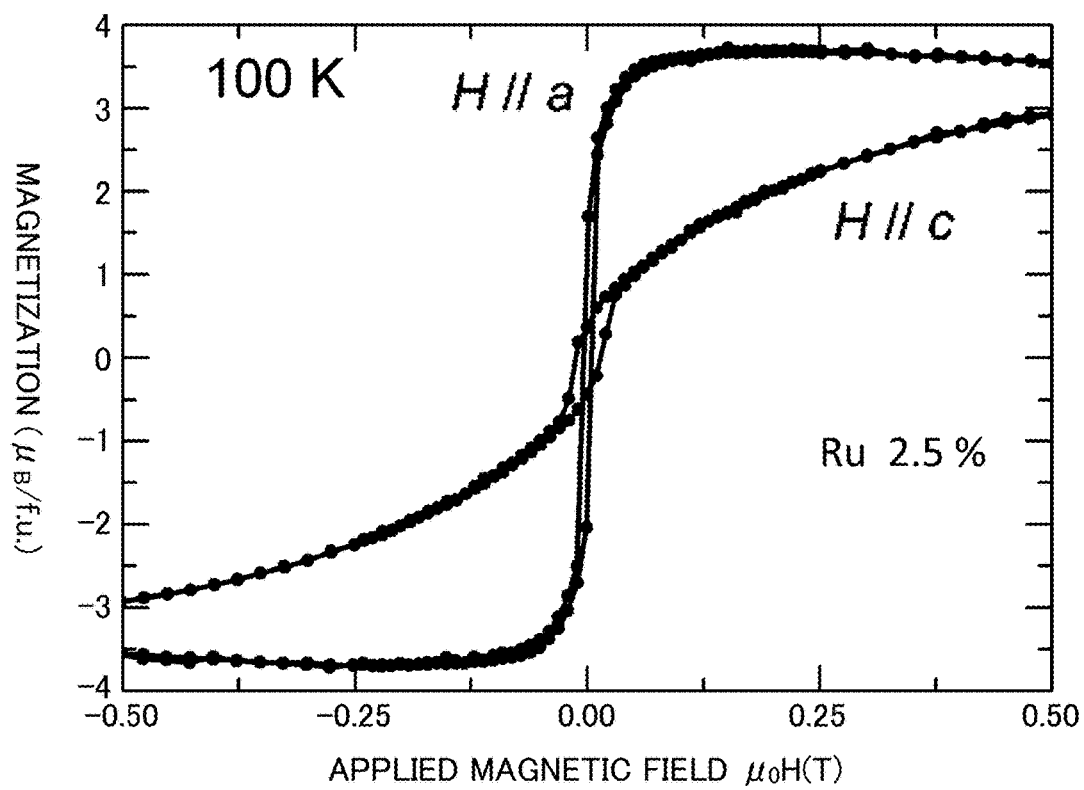
FIG. 22 illustrates a magnetic field dependency of magnetization of an $LaSrMnO_3$ thin film added with Ru elements to 2.5% of Mn.

FIG. 22 illustrates an applied magnetic field dependency of the magnetization of the two-dimensional stacked film 11 shown in FIG. 21. The two-dimensional stacked film 11 of the present example is at a temperature of 100 K. H//a represents the parallel component to the surface of the magnetization while H//c represents the perpendicular component to the surface of the magnetization. If the applied magnetic field is equal to or more than 5000 Oe, the parallel component to the surface and the perpendicular component to the surface are saturated and becomes the same. On the other hand, if the applied magnetic field is equal to or less than 5000 Oe, the parallel component to the surface of the magnetization is larger and magnetic moments of the magnetic film 12 is oriented to be parallel to the surface.

Figure 23:
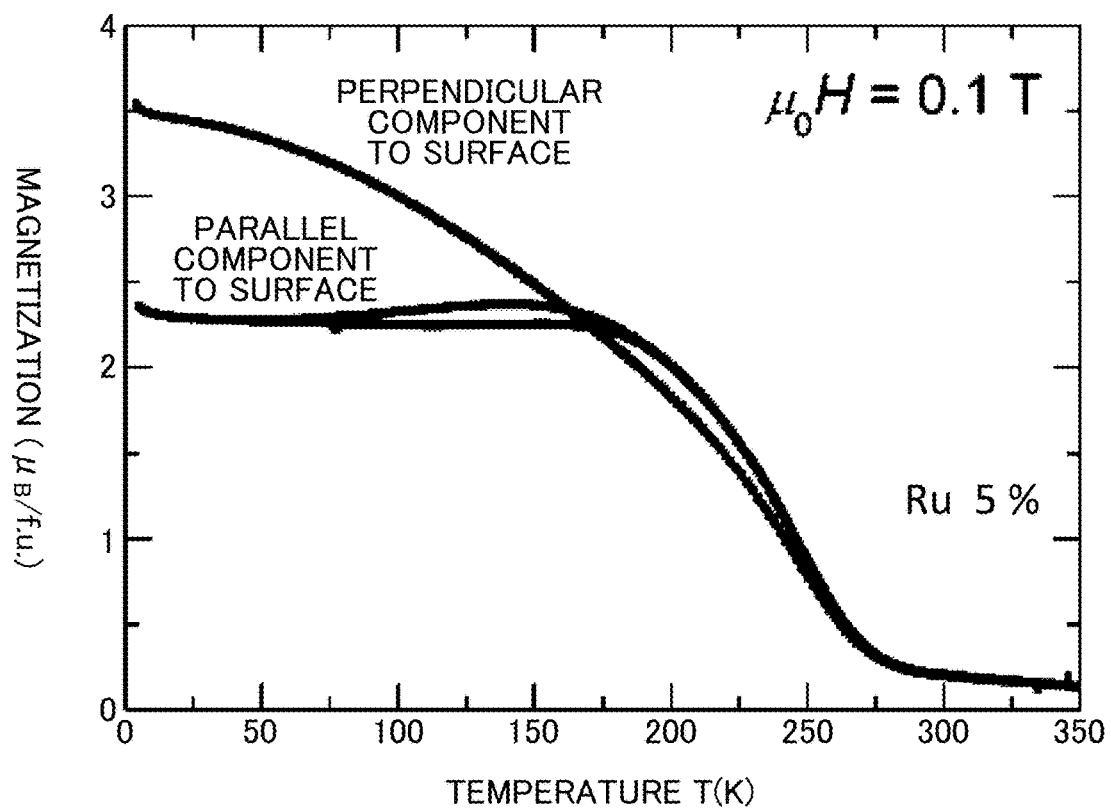
FIG. 23 illustrates a magnetic field dependency of magnetization of an $LaSrMnO_3$ thin film added with Ru elements to 5% of Mn.

FIG. 23 illustrates a temperature dependency of the magnetization of the two-dimensional stacked film 11. The two-dimensional stacked film 11 of the present example is an LaSrMnO$_3$ thin film of which the Ru doping amount is 5% formed on the LSAT (001) surface. The two-dimensional stacked film 11 has a ferromagnetic transition temperature of 270 K. At a low temperature equal to or less than 150 K, the perpendicular component to the surface of the magnetization is larger. Also, in a temperature region from 150 K to 270 K, the parallel component to the surface and the perpendicular component to the surface of the magnetization are almost the same. That is, it is indicated that the LaSrMnO$_3$ thin film of which the Ru doping amount is 5% in the temperature region equal to or more than 150 K has a flexible magnetic characteristic.

Figure 24:
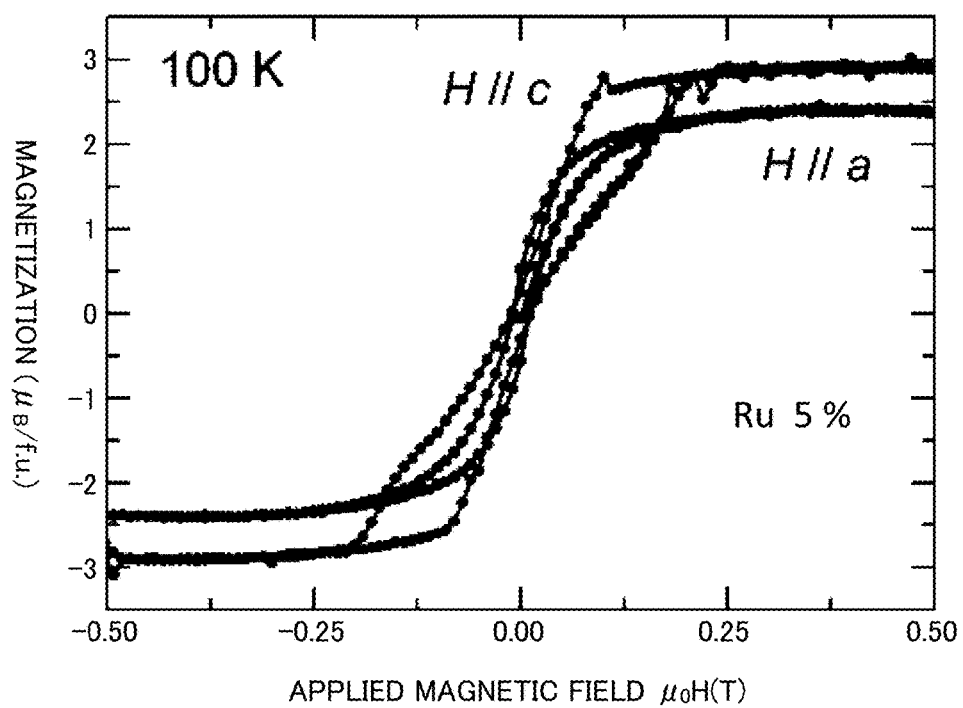
FIG. 24 illustrates a temperature dependency of magnetization of an $LaSrMnO_3$ thin film added with Ru elements to 10% of Mn.

FIG. 24 illustrates an applied magnetic field dependency of the magnetization of the two-dimensional stacked film 11 shown in FIG. 23. The two-dimensional stacked film 11 of the present example is at a temperature of 100 K. H//c and H//a of the magnetic field dependency of the magnetization are almost the same. The magnetization in response to the applied magnetic field indicates a curve with a gentle slope. Also, when the applied magnetic field H=0, the magnetization reaches zero and does not indicate hysteresis characteristics.

Figure 25:
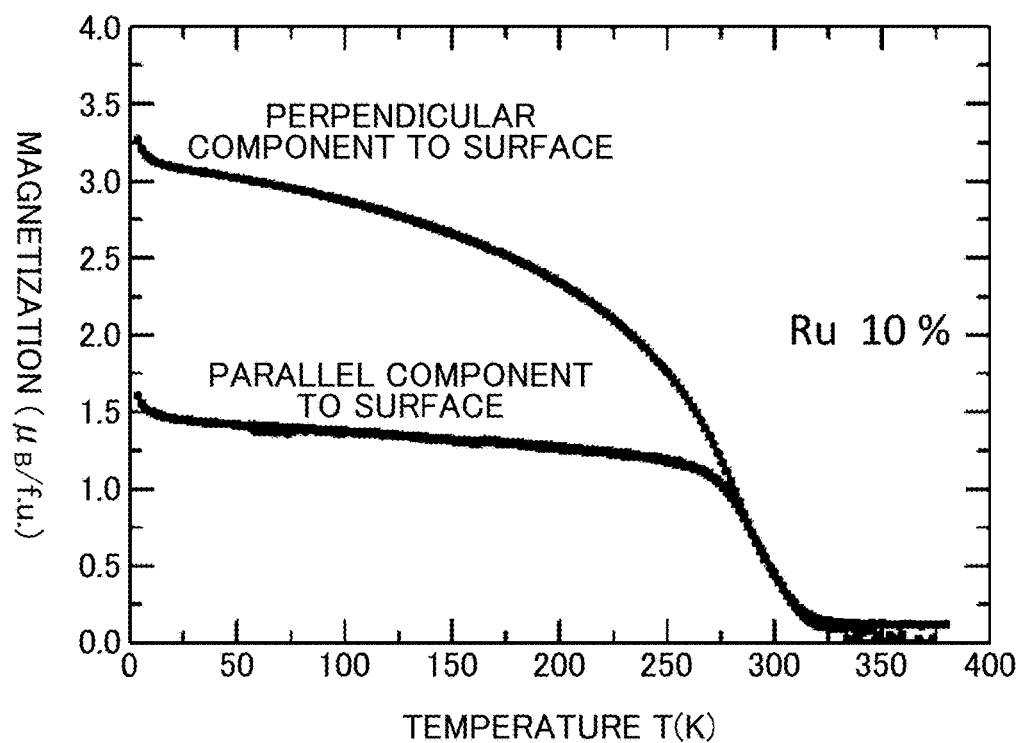
FIG. 25 illustrates a magnetic field dependency of magnetization of an $LaSrMnO_3$ thin film added with Ru elements to 10% of Mn.

FIG. 25 illustrates a temperature dependency of the magnetization of the two-dimensional stacked film 11. The two-dimensional stacked film 11 of the present example is an LaSrMnO$_3$ thin film of which the Ru doping amount is 10% formed on the LSAT (001) surface. It is understood that the temperature dependency of the magnetization according to the present embodiment proves that the two-dimensional stacked film 11 has a ferromagnetic transition temperature of 310 K. The perpendicular component to the surface of the magnetization is larger than the parallel component to the surface of the magnetization in the entire temperature region.

Figure 26:
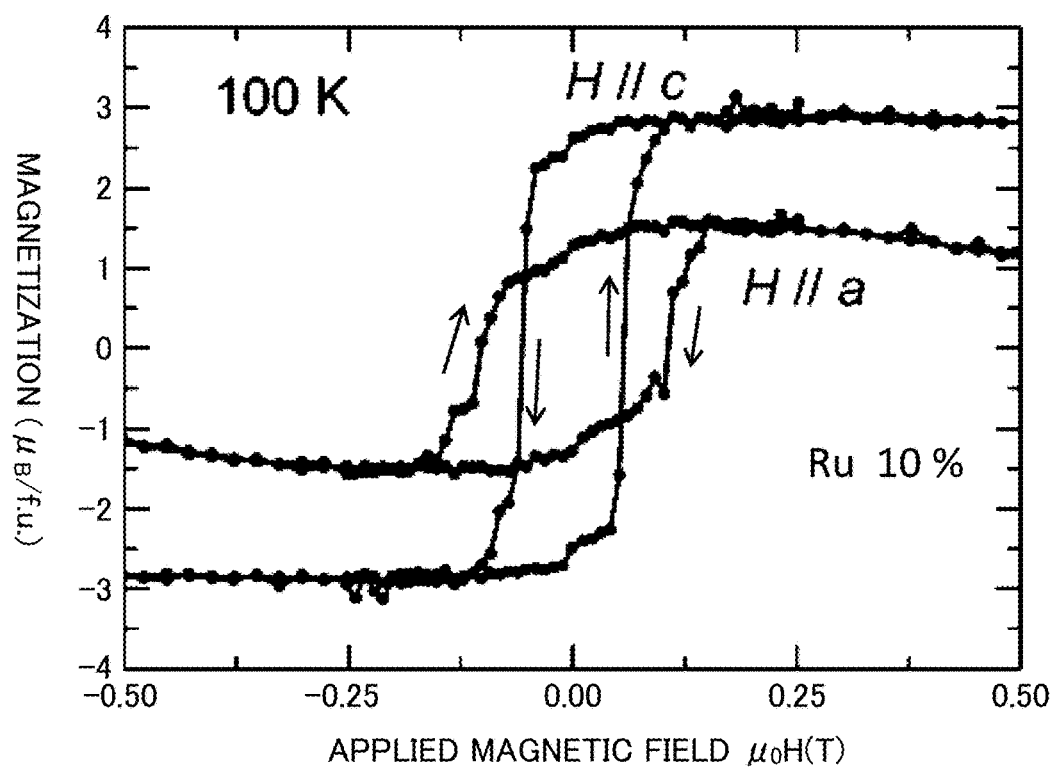
FIG. 26 illustrates a magnetic field dependency of magnetization of an $LaSrMnO_3$ thin film added with Ru elements to 5% of Mn.

FIG. 26 illustrates the applied magnetic field dependency of the magnetization of the two-dimensional stacked film 11 shown in FIG. 25. The two-dimensional stacked film 11 of the present example is at a temperature of 100 K. In both of H//a and H//c, the magnetization indicates a tendency of saturation at a temperature equal to or more than 2000 Oe (oersted), but the perpendicular component to the surface of H//c is larger. Even when the applied magnetic field is increased, the perpendicular component to the surface of H//c remains. Also, the perpendicular component to the surface of the magnetization indicates strong hysteresis characteristics when the applied magnetic field H is around zero. That is, it should be understood that in the LaSrMnO$_3$ thin film of which the Ru doping amount is 10%, the magnetic moment has a strong retention in an orientation perpendicular to the surface.

As described above, in the LaSrMnO$_3$ thin film of which the Ru doping amount is 5%, the magnetization follows the direction of the applied magnetic field. On the other hand, the parallel component to the surface of the magnetization dominates in the LaSrMnO$_3$ thin film of which the Ru doping amount is 2.5%, while the perpendicular component to the surface of the magnetization dominates in the LaSrMnO$_3$ thin film of which the Ru doping amount is 10%. That is, by adjusting the Ru amount for doping the LaSrMnO$_3$ thin film the magnetic film 12 becomes a flexible magnet in which the orientation of the magnetic moment is varied in accordance with the orientation of the applied magnetic field. The magnetic film 12 can form the skyrmion phase if it has a flexible magnetic characteristic. The Ru doping amount is not necessarily 5%, but may be adjusted as appropriate to the amount sufficient to form the skyrmion phase.

Figure 27:
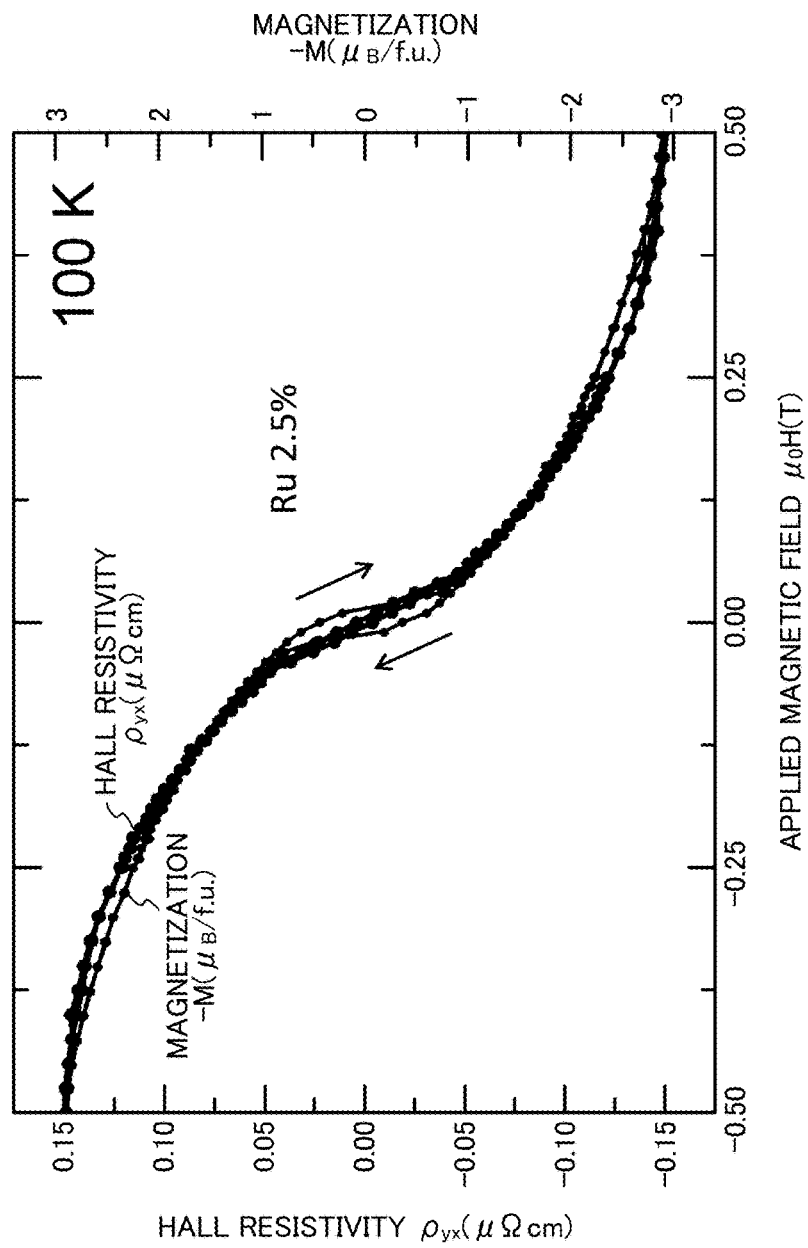
FIG. 27 is a diagram comparing a Hall resistance and magnetization at 100 K of a Hall resistance of an $LaSrMnO_3$ thin film added with Ru elements to 2.5% of Mn.

FIG. 27 illustrates the magnetic field dependency of the Hall resistivity and the magnetization of the two-dimensional stacked film 11. The horizontal axis represents the applied magnetic field while the left-side axis and the right-side axis represent the Hall resistivity and the magnetization, respectively. A magnetization curve is a comparison curve with signs of the magnetization converted to be negative, to be compared to the Hall resistance. The two-dimensional stacked film 11 of the present example is an LaSrMnO$_3$ thin film of which the Ru doping amount is 2.5% formed on the LSAT (001) surface. Also, the two-dimensional stacked film 11 is at a temperature of 100 K.

Here, the ordinary Hall resistivity is a Hall resistivity caused by the ordinary Hall effect. The ordinary Hall resistivity is in proportion to the applied magnetic field, as defined in the first term of Equation 4. Contribution of the ordinary Hall effect of the first term is small enough to be neglected.

The Hall resistivity having hysteresis characteristics represents a Hall resistivity of a sum of the anomalous Hall resistance and the topological Hall resistance. If the two-dimensional stacked film 11 is a ferromagnet which does not form the skyrmion 40, as defined in the second term of Equation 4, the Hall resistance consists of only the anomalous Hall resistance. That is, if the skyrmion 40 does not exist, the anomalous Hall resistivity curve is the same curve as the comparison curve of the magnetization. In practice, in the LaSrMnO$_3$ thin film of which the Ru doping amount is 2.5%, the Hall resistivity curve well matches the magnetization curve. Therefore, if the Ru doping amount is 2.5%, there is no contribution of the topological resistance resulting from generation of the skyrmion 40. That is, in the LaSrMnO$_3$ thin film of which the Ru doping amount is 2.5%, the skyrmion 40 is not generated. The Hall resistivity at 100 K is shown here, but the behavior is the same in the entire temperature region and the skyrmion 40 does not exist in the entire temperature region.

Figure 28:
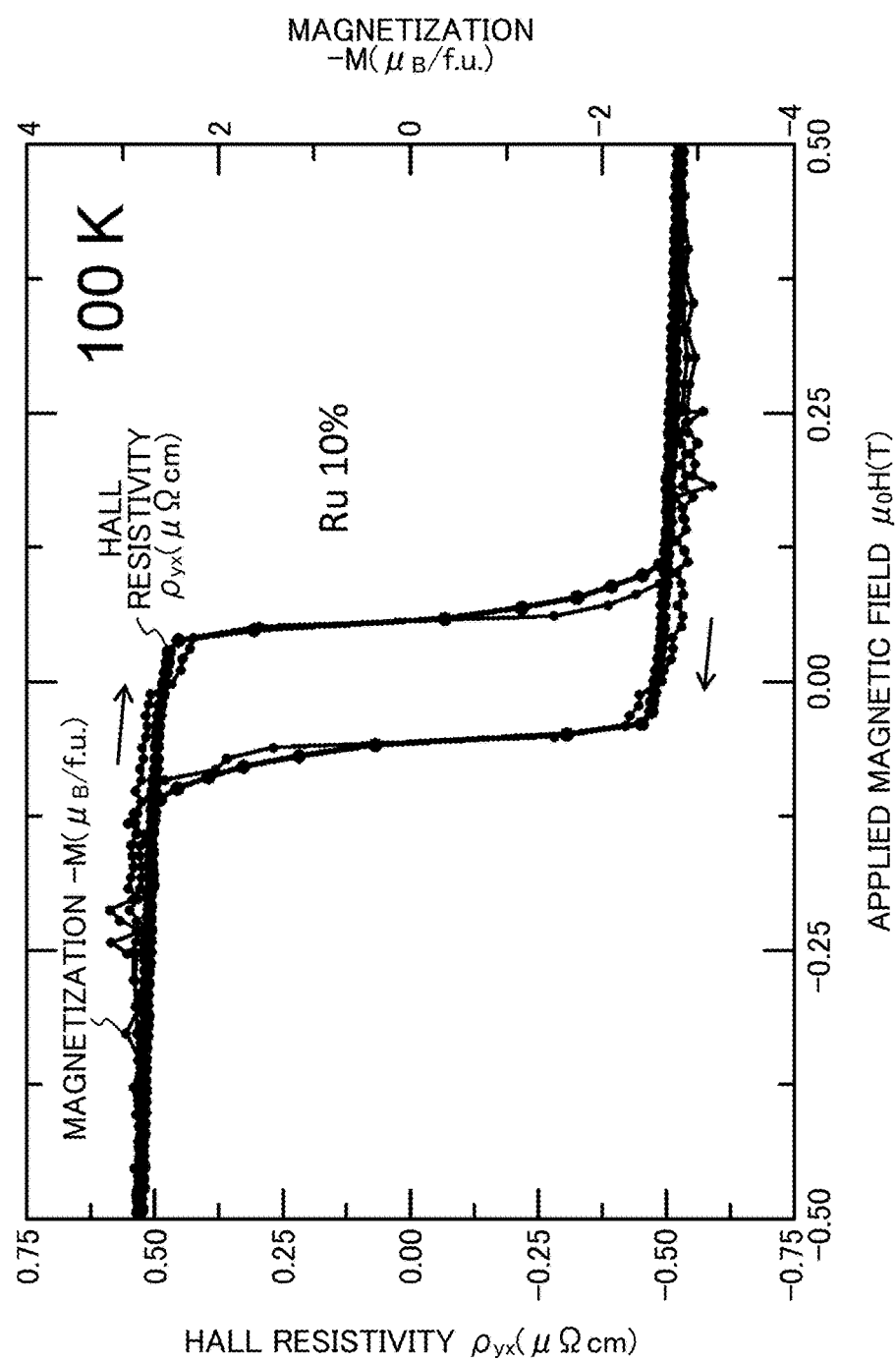
FIG. 28 is a diagram comparing a Hall resistance and magnetization at 100 K of a Hall resistance of an $LaSrMnO_3$ thin film added with Ru elements to 10% of Mn.

FIG. 28 illustrates the magnetic field dependency of the Hall resistivity and the magnetization of the two-dimensional stacked film 11. The horizontal axis and the vertical axis represent the same as those in FIG. 27. The two-dimensional stacked film 11 of the present example is an LaSrMnO$_3$ thin film of which the Ru doping amount is 10% formed on the LSAT (001) surface. Also, the two-dimensional stacked film 11 is at a temperature of 100 K. In practice, when the Ru doping amount is 10%, the Hall resistivity curve of the LaSrMnO$_3$ thin film well matches the magnetization curve. The Hall resistivity at 100 K is shown here, but the behavior is the same in the entire temperature region and the skyrmion 40 does not exist in the entire temperature region.

Figure 29:
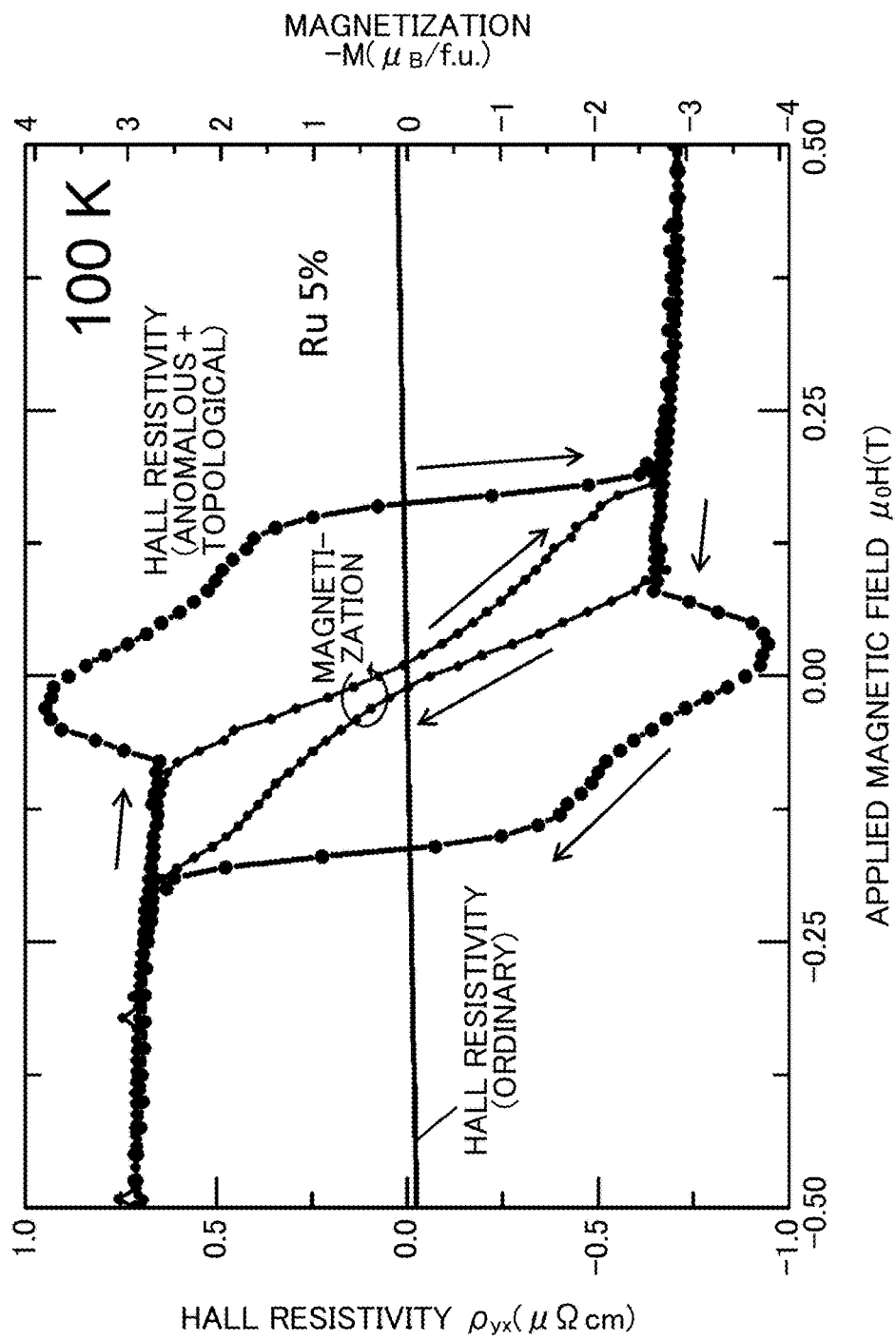
FIG. 29 is a diagram comparing a Hall resistance and magnetization at 100 K of a Hall resistance of an $LaSrMnO_3$ thin film added with Ru elements to 5% of Mn.

FIG. 29 illustrates the magnetic field dependency of the Hall resistivity and the magnetization of the two-dimensional stacked film 11. The horizontal axis and the vertical axis represent the same as those in FIG. 27. The two-dimensional stacked film 11 of the present example is an LaSrMnO$_3$ thin film of which the Ru doping amount is 5% formed on the LSAT (001) surface. Also, the two-dimensional stacked film 11 is at a temperature of 100 K. When the Ru doping amount is 5%, there is a large difference from the cases when the Ru doping amount is 2.5% and when 10%. The Hall resistivity which is largely different from the magnetization curve is the topological Hall resistivity resulting from generation of the skyrmion 40. Specifically, when the applied magnetic field is increased from −0.5 T to 0.5 T, in the region of the magnetic field strength of −0.01 T to 0.13 T, the hysteresis curve of the Hall resistivity and the comparison curve of the magnetization are separated. That is, it should be understood that the skyrmion phase is formed in the region of the magnetic field strength of −0.01 T to 0.13 T.

Figure 30:
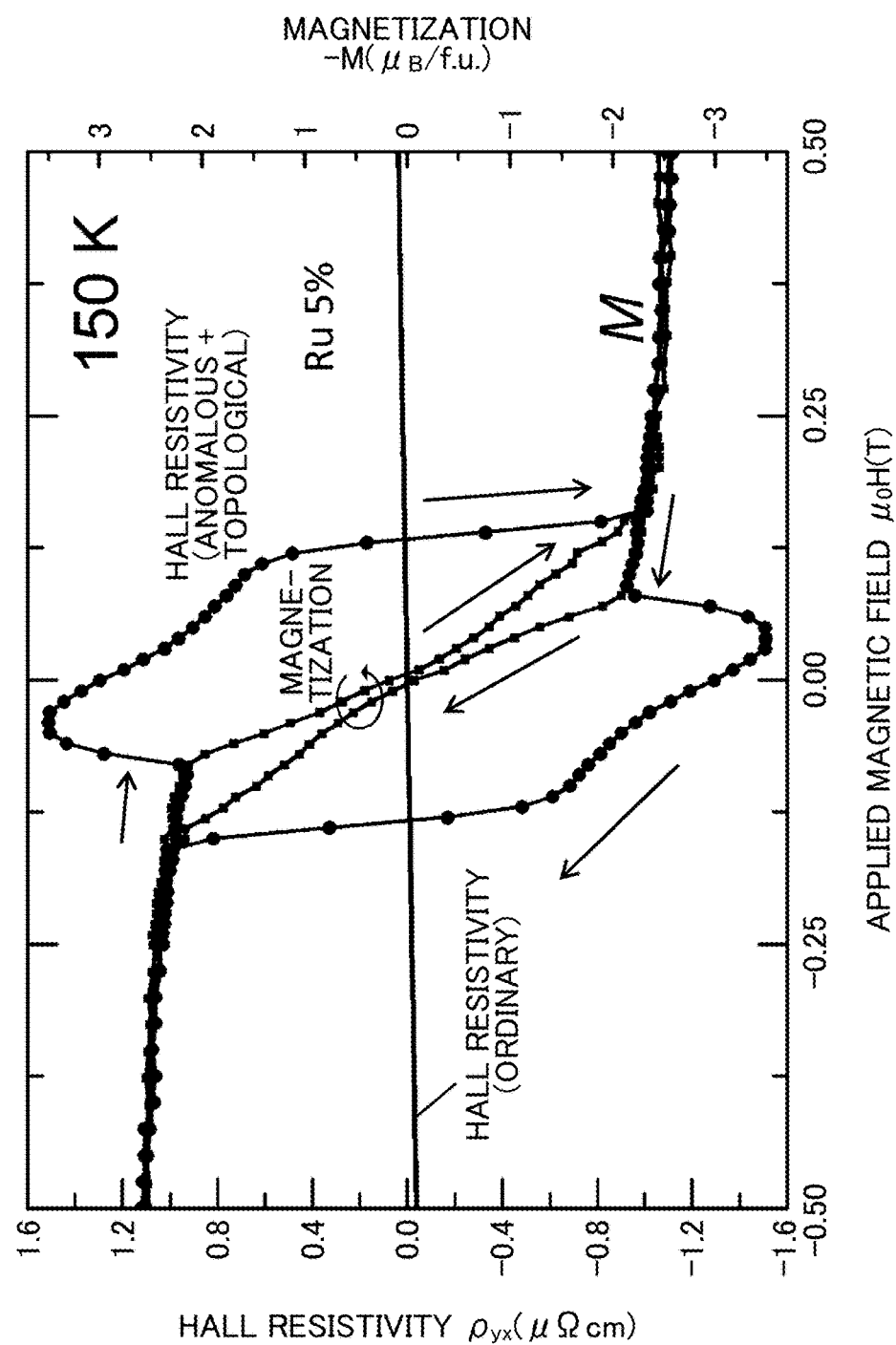
FIG. 30 is a diagram comparing a Hall resistance and magnetization at 150 K of an $LaSrMnO_3$ thin film added with Ru elements to 5% of Mn.

FIG. 30 illustrates the magnetic field dependency of the Hall resistivity and the magnetization. The two-dimensional stacked film 11 is an LaSrMnO$_3$ thin film of which the Ru doping amount is 5% formed on the LSAT (001) surface. Also, the two-dimensional stacked film 11 is at a temperature of 150 K. Compared to FIG. 29, the two-dimensional stacked film 11 forms the skyrmion phase in a bit narrower range of the applied magnetic field than the one at 100 K.

Figure 31:
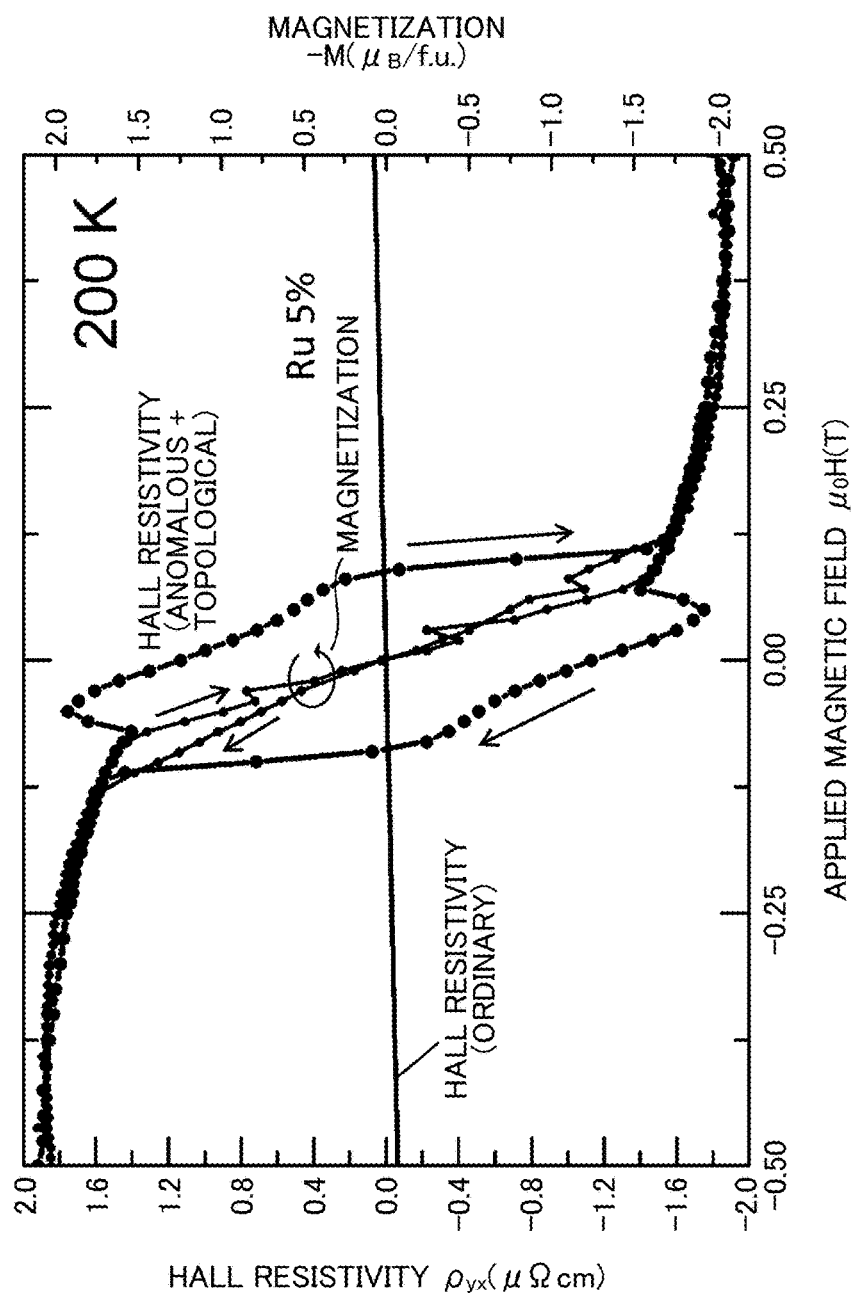
FIG. 31 is a diagram comparing a Hall resistance and magnetization at 200 K of an $LaSrMnO_3$ thin film added with Ru elements to 5% of Mn.

FIG. 31 illustrates the magnetic field dependency of the Hall resistivity and the magnetization. The two-dimensional stacked film 11 is an LaSrMnO$_3$ thin film of which the Ru doping amount is 5% formed on the LSAT (001) surface. Also, the two-dimensional stacked film 11 is at a temperature of 200 K. Compared to FIG. 29 and FIG. 30, the two-dimensional stacked film 11 forms the skyrmion phase in a still narrower range of the applied magnetic field than those at 100 K and 150 K.

Figure 32:
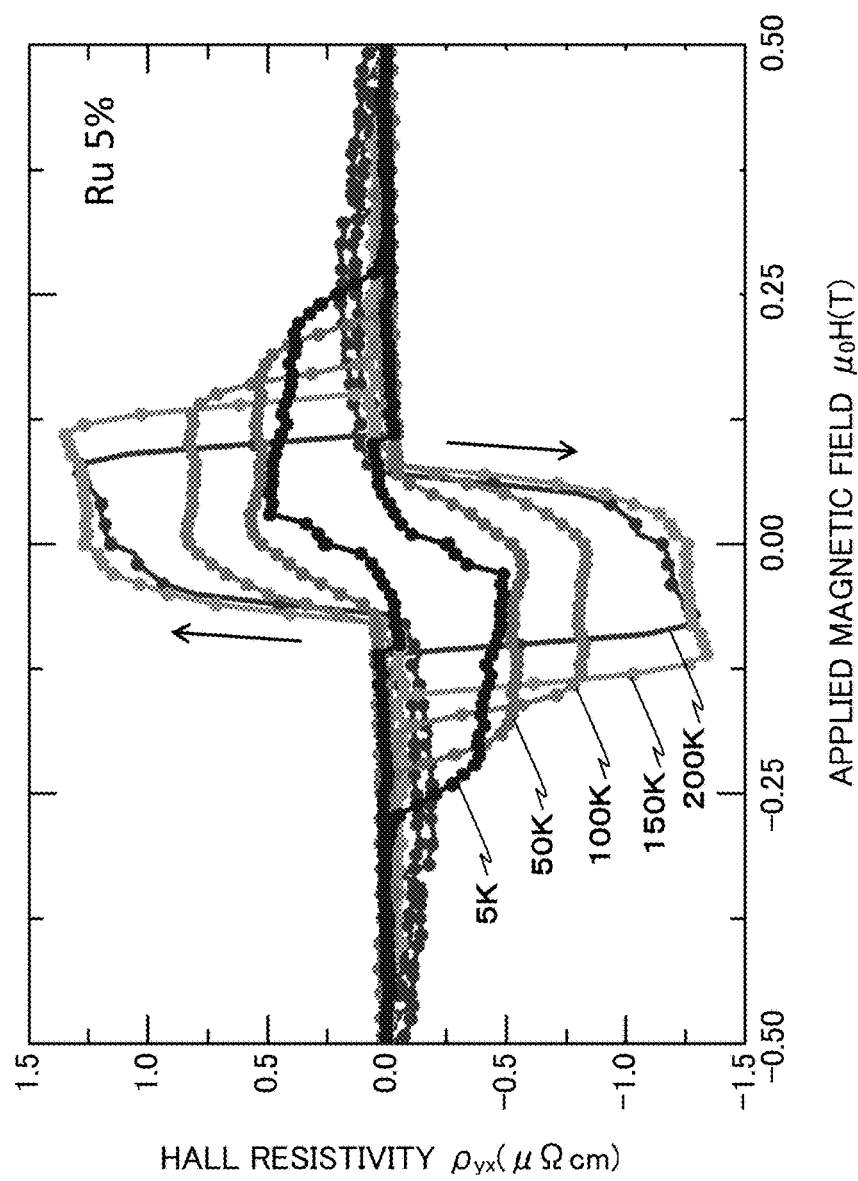
FIG. 32 illustrates a Hall resistance derived from a skyrmion of an $LaSrMnO_3$ thin film added with Ru elements to 5% of Mn.

FIG. 32 illustrates the magnetic field dependency of the topological Hall resistivity of the two-dimensional stacked film 11. The Hall resistivity of the present example represents the topological Hall resistivity from which contributions of the ordinary Hall resistance and the anomalous Hall resistance are subtracted. The two-dimensional stacked film 11 is an LaSrMnO$_3$ thin film of which the Ru doping amount is 5% formed on the LSAT (001) surface. The temperature of the two-dimensional stacked film 11 is varied in a range from 5 K to 200 K.

As shown in FIG. 27 and FIG. 28, when the Ru doping amount is 2.5% and 10%, the Hall resistivity of the LaSrMnO$_3$ thin film only includes a contribution of the anomalous Hall resistivity. That is, when the Ru doping amount is 2.5% and 10%, the component of the topological Hall resistance is zero and the skyrmion 40 does not exist. On the other hand, the Hall resistivity of the LaSrMnO$_3$ thin film of which the Ru doping amount is 5% includes a contribution of the topological Hall resistance, in addition to that of the anomalous Hall resistance. This results from the magnetic moment of the LaSrMnO$_3$ thin film of which the Ru doping amount is 5% having a flexible magnetic characteristic with respect to the applied magnetic field. In the two-dimensional stacked film 11 which utilizes the dipole interaction, it is important to have a flexible magnetic characteristic with respect to the applied magnetic field to form the skyrmion phase.

Figure 33:
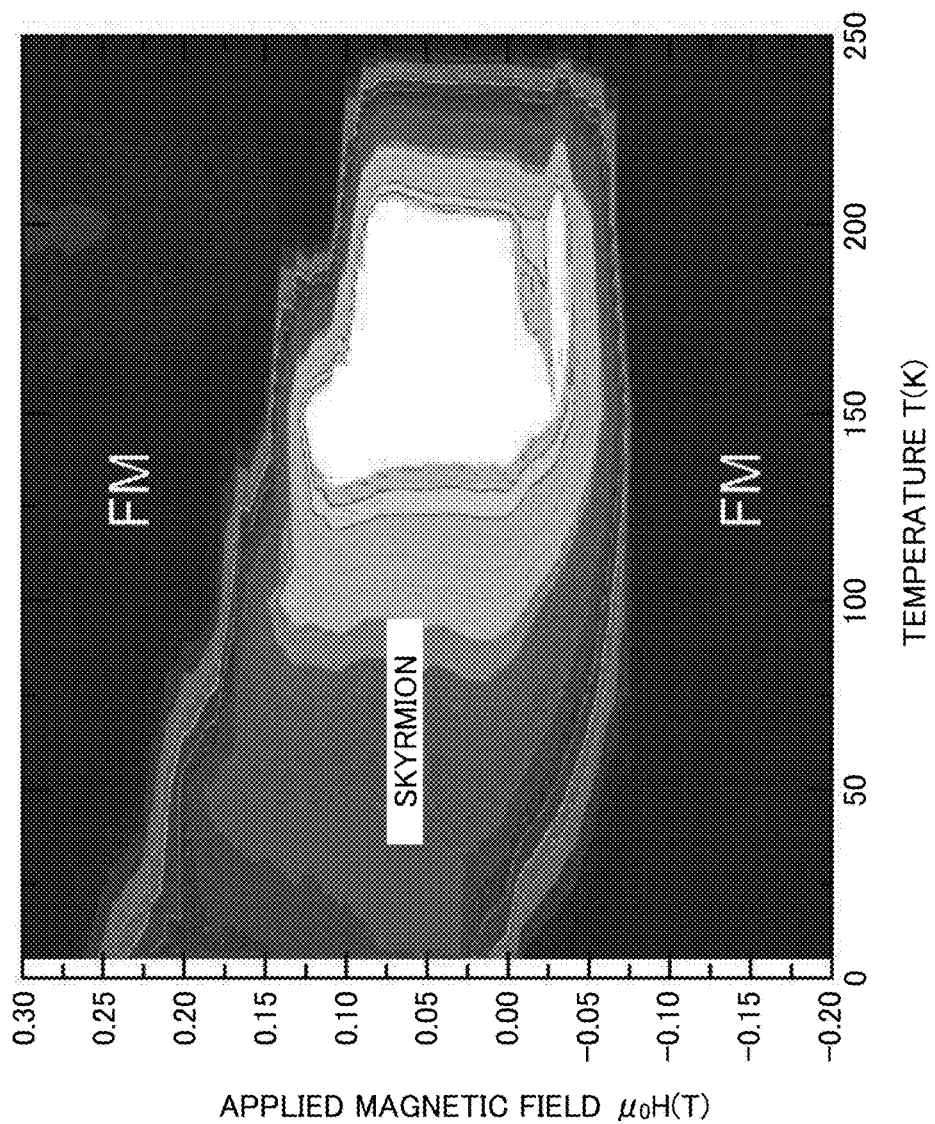
FIG. 33 illustrates a phase diagram of a skyrmion of an $LaSrMnO_3$ thin film added with Ru elements to 5% of Mn.

FIG. 33 illustrates the magnetic phase diagram of the two-dimensional stacked film 11. The two-dimensional stacked film 11 of the present example is an LaSrMnO$_3$ thin film of which the Ru doping amount is 5% formed on the LSAT (001) surface. The vertical axis represents the applied magnetic field $\mu_0 H$ (T) while the horizontal axis represents the temperature T (K) of the two-dimensional stacked film 11. When the applied magnetic field is around −0.05 T to 0.15 T in the broad temperature region from 0 K to 250 K, the skyrmion phase is generated.

Figure 34:
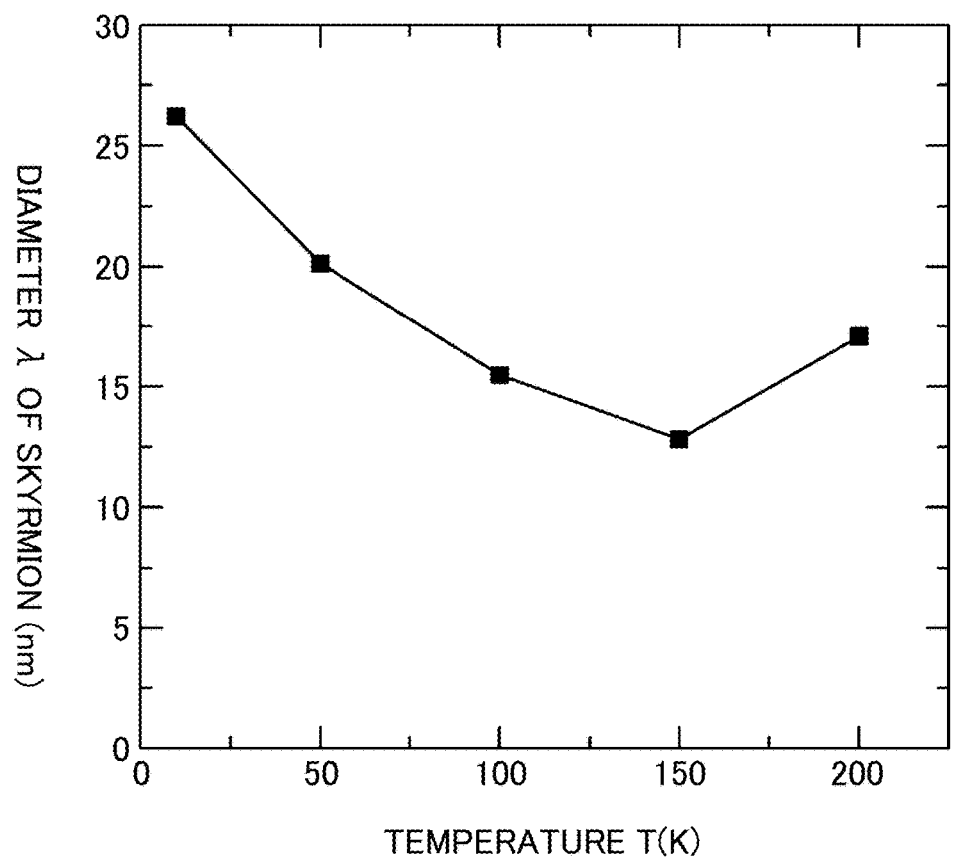
FIG. 34 illustrates a diameter of a skyrmion of an $LaSrMnO_3$ thin film added with Ru elements to 5% of Mn.

FIG. 34 illustrates a relationship between the diameter λ (nm) of the skyrmion 40 and the temperature T (K). The two-dimensional stacked film 11 of the present example is an LaSrMnO$_3$ thin film of which the Ru doping amount is 5% formed on the LSAT (001) surface. The diameter λ of the skyrmion 40 is calculated from the topological Hall resistance by using Equation 3. However, the spin polarization of the LaSrMnO$_3$ thin film is 1 (Non-Patent Document 3). The diameter λ of the skyrmion 40 is 25 nm at a temperature around 0 K, the diameter λ of the skyrmion 40 becomes smaller to 13 nm at a temperature of 150 K, and the diameter λ of the skyrmion 40 becomes approximately 17 nm at a temperature of 200 K. In this manner, the diameter λ of the skyrmion 40 can be estimated if the temperature is known with respect to predetermined material.

Figure 35:
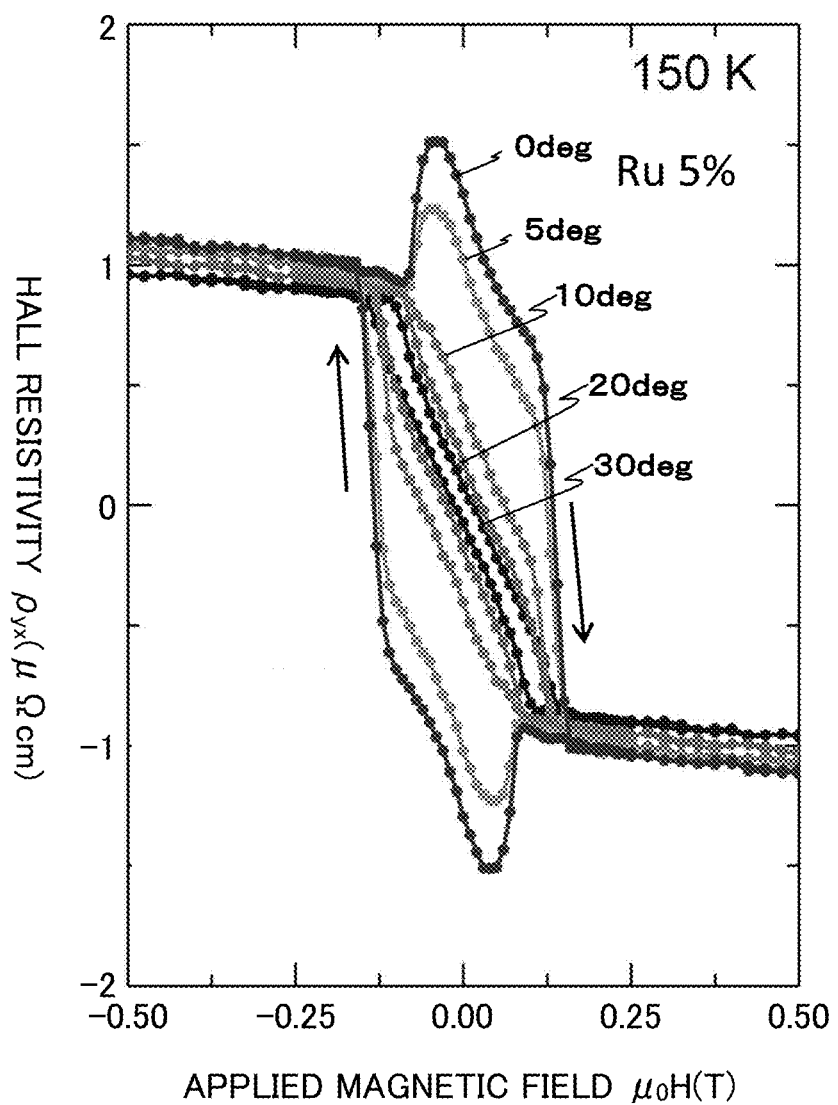
FIG. 35 illustrates an angle dependency of a magnetic field of a topological Hall effect.

FIG. 35 illustrates the angle dependency to the magnetic field of the topological Hall effect. The two-dimensional stacked film 11 of the present example is an LaSrMnO$_3$ thin film of which the Ru doping amount is 5% formed on the LSAT (001) surface. The two-dimensional stacked film 11 is at a temperature of 150 K. Each curve represents the topological Hall resistance when the magnetic field applied to the two-dimensional stacked film 11 is tilted by an angle from 0 to 30 degrees. As being tilted from 0 to 30 degrees, the magnetic field applied to the two-dimensional stacked film 11 becomes smaller in the perpendicular component to the surface. When the angle between a direction perpendicular to the two-dimensional stacked film 11 and the applied magnetic field is varied from 0 degree, the topological Hall resistance becomes smaller gradually. At an angle around 30 degrees, the topological Hall resistance becomes almost zero. That is, the skyrmion 40 disappears when the angle to the magnetic field is tilted.

Figure 36:
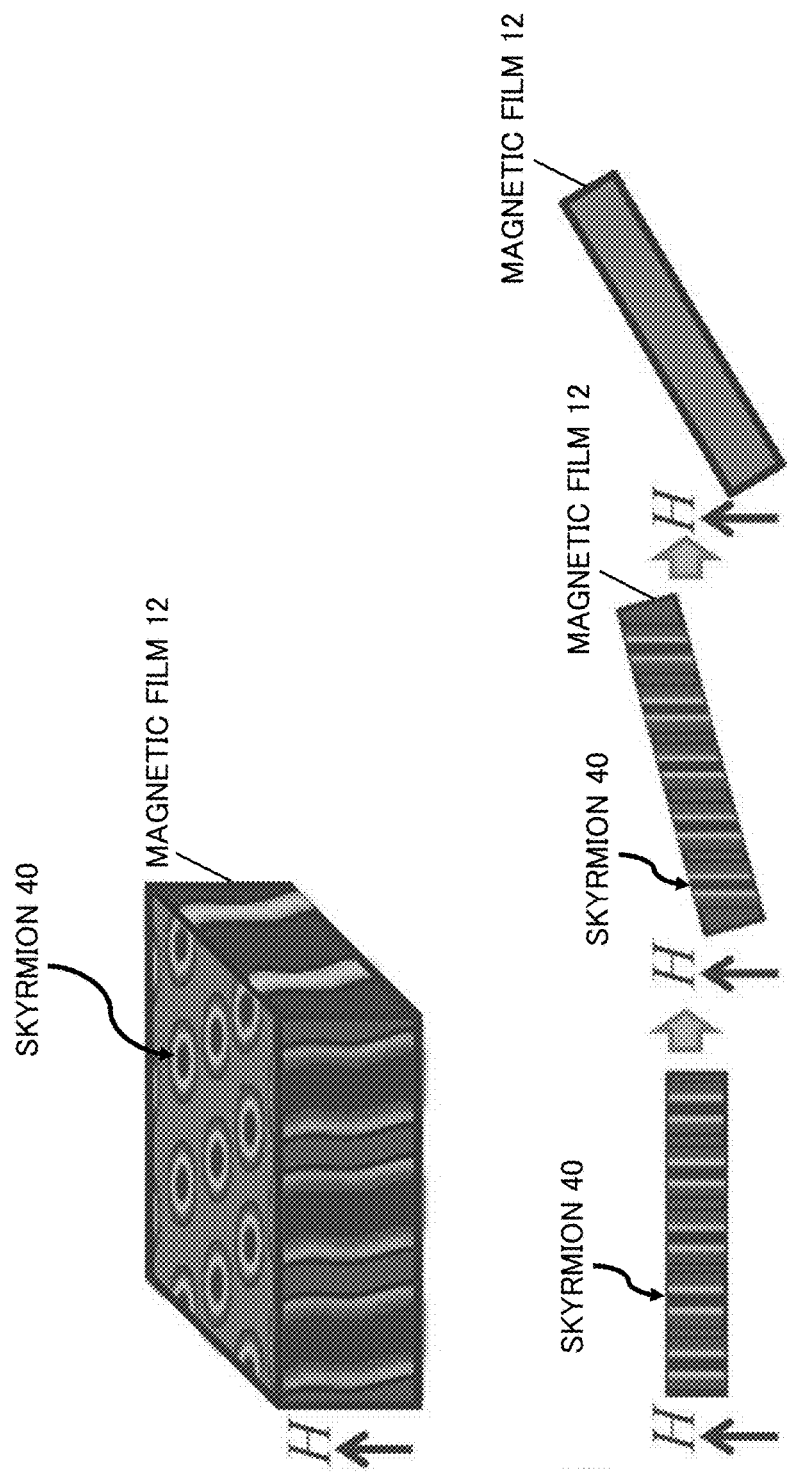
FIG. 36 illustrates a conceptual diagram describing an angle dependency of a magnetic field of a topological Hall effect.

FIG. 36 is a schematic view illustrating a state of the skyrmion 40. The state of the skyrmion 40 is calculated from the angle dependency to the magnetic field of the topological Hall resistance. The two-dimensional stacked film 11 of the present example is an LaSrMnO$_3$ thin film of which the Ru doping amount is 5% formed on the LSAT (001) surface.

If the angle to the magnetic field is 0 degree, the magnetic film 12 forms the skyrmion 40 oriented perpendicular to the front surface of the magnetic film 12. If the angle to the magnetic field is 0 degree, the skyrmion 40 of the present example is oriented the same as the on in Embodiment Example 1.

When the angle to the magnetic field is larger than 0 degree and smaller than about 30 degrees, the magnetic film 12 forms the skyrmion 40 oriented to be tilted with respect to the front surface of the magnetic film 12. It should also be understood from the magnetic field dependency of the magnetization that the magnetic film 12 has a flexible characteristic with respect to the applied magnetic field. As a result, as the angle to the magnetic field is increased, the skyrmion 40 has a larger length in a depth direction. Behaviors of the skyrmion 40 of the present example are largely different from those of the skyrmion 40 in Embodiment Example 1 which is in a constant orientation with respect to the front surface of the magnetic film 12 even when the angle to the magnetic field is varied.

When the angle to the magnetic field is increased up to approximately 30 degrees, a topologically-derived potential retention which supports the skyrmion 40 loses and the skyrmion 40 disappears. Such an angle dependency to the magnetic field of the skyrmion 40 indicates a flexible structural characteristic of the skyrmion 40 in a flexible dipole magnet.

As described in Embodiment Example 2, the skyrmion phase can be formed by using the magnetic film 12 formed of a magnetic thin film with a dipole-dipole interaction. In the present embodiment example, the skyrmion phase can be formed even if the magnetic film 12 is not formed of a chiral magnet. In the two-dimensional stacked film 11 of the present example, the orientation of the skyrmion 40 with respect to the front surface of the two-dimensional stacked film 11 is varied in accordance with the angle to the magnetic field.

Figure 37:
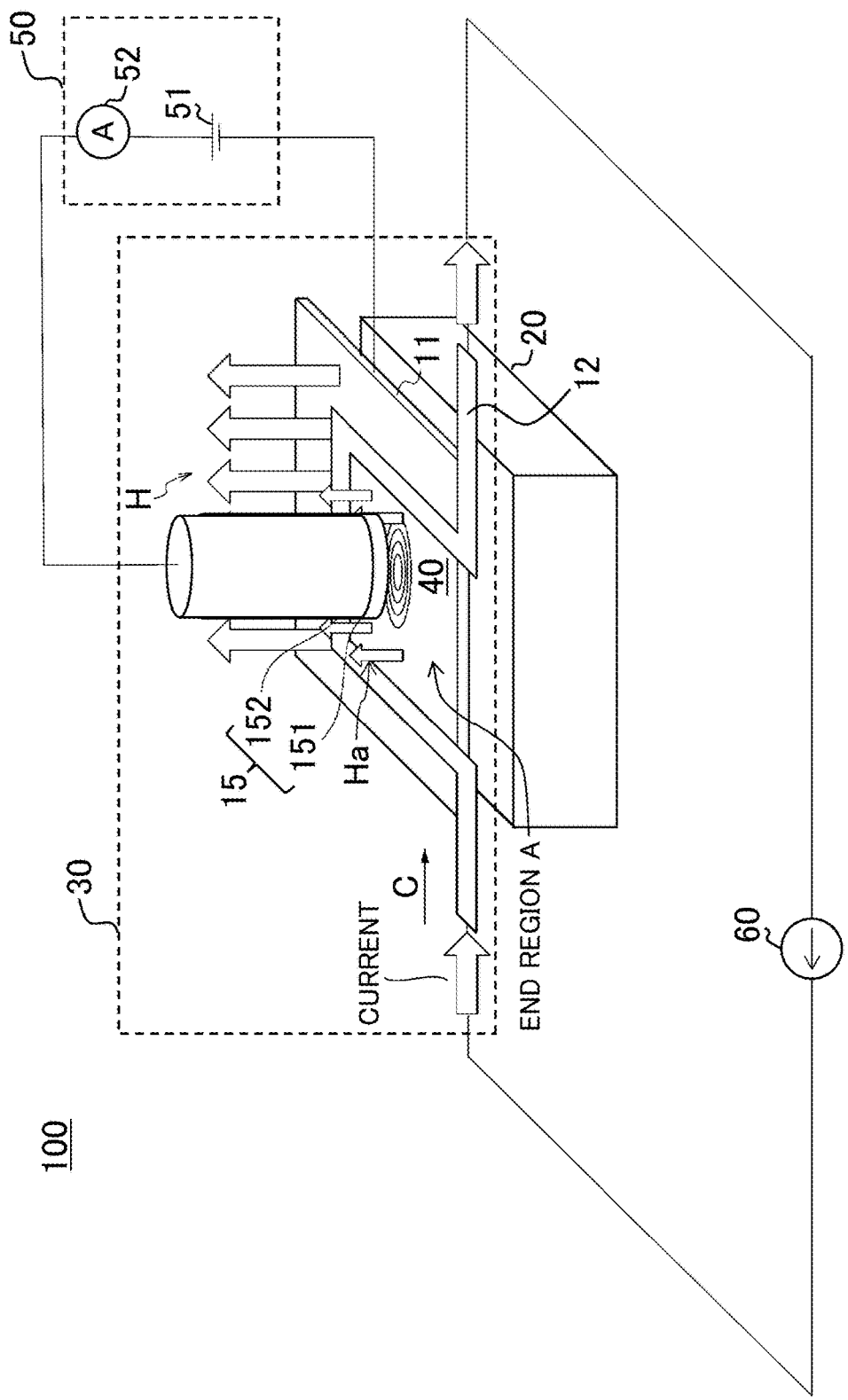
FIG. 37 illustrates a configuration example of a skyrmion memory 100.

FIG. 37 illustrates a configuration example of a skyrmion memory 100. The skyrmion memory 100 stores bit information by using the skyrmion 40. For example, whether the skyrmion 40 exists or not in the two-dimensional stacked film 11 corresponds to information of one bit. The skyrmion memory 100 of the present example comprises a magnetic element 30, a generating unit 20 of the magnetic field, a measuring unit 50 and a power supply 60 for a coil current.

The magnetic element 30 can generate and erase the skyrmion 40. The magnetic element 30 of the present example is an element formed in a thin layer shape having a thickness equal to or less than 500 nm. For example, techniques such as MBE (Molecular Beam Epitaxy) and sputtering are used for forming. The magnetic element 30 includes a two-dimensional stacked film 11, a current path 12 and a detector element 15 to sense a skyrmion.

The two-dimensional stacked film 11 allows at least a skyrmion crystal phase and a ferromagnetic phase to appear in accordance with an applied magnetic field. The skyrmion crystal phase refers to material in which the skyrmion 40 can be generated in the two-dimensional stacked film 11. For example, the two-dimensional stacked film 11 includes the configurations described in Embodiment Examples 1 and 2.

The magnetic film 12 of the two-dimensional stacked film 11 has a structure surrounded by a non-magnet. The structure surrounded by a non-magnet refers to a structure of which the magnetic film 12 of the two-dimensional stacked film 11 is surrounded by a non-magnet in the entire orientation. Also, the two-dimensional stacked film 11 forms at least a part as two-dimensional material.

The current path 12 is one example of a unit to control a skyrmion and controls to generate and erase the skyrmion 40. The current path 12 surrounds a region including an end portion of the two-dimensional stacked film 11 on one surface of the two-dimensional stacked film 11. The current path 12 may also be electrically separated from the two-dimensional stacked film 11 by using insulating material and the like. The current path 12 of the present example is a coil current circuit formed in a U shape. The U shape may be not only a shape with rounded corners, but also a shape including a right angle. The current path 12 may not form a closed region on the xy plane. A closed region may just be formed on the front surface of the two-dimensional stacked film 11 by a combination of the current path 12 and the end portion. The current path 12 is connected to a power supply 60 for a coil current and makes coil currents flowing. By making coil currents flowing through the current path 12, the magnetic field is generated with respect to the two-dimensional stacked film 11. The current path 12 is formed of non-magnetic metal material such as Cu, W, Ti, Al, Pt, Au, TiN, AlSi. As used herein, a region surrounded by the current path 12 is referred to as a coil region $A_C$. Also, when the region surrounded by the current path 12 includes the end portion of the two-dimensional stacked film 11, in particular, the coil region $A_C$ is called an end portion region A. The current path 12 of the present example includes a continuous conductive path which crosses the end portion of the two-dimensional stacked film 11 from the non-magnet side to the two-dimensional stacked film 11 side at least once and crosses from the two-dimensional stacked film 11 side to the non-magnet side at least once on the xy plane. This allows the current path 12 to surround a region including the end portion of the two-dimensional stacked film 11. It should be noted that the magnetic field strength in the end portion region A is defined as Ha.

The detector element 15 to sense a skyrmion functions as a magnetic sensor for detecting a skyrmion. The detector element 15 to sense a skyrmion detects that the skyrmion 40 is generated and erased. For example, the detector element 15 to sense a skyrmion is a resistance element of which a resistance value is varied depending on whether the skyrmion 40 exists or not. The detector element 15 to sense a skyrmion of the present example is a tunnel magnetic resistance element (TMR element). The detector element 15 to sense a skyrmion has a stacked structure of a non-magnetic thin film 151 and a magnetic metal 152 which contact the front surface of the two-dimensional stacked film 11 on one surface of the two-dimensional stacked film 11.

The magnetic metal 152 transits to a ferromagnetic phase having magnetic moments oriented upward due to the magnetic field from the generating unit 20 of the magnetic field oriented upward. The measuring unit 50 is connected between the two-dimensional stacked film 11 and an opposite end portion of the two-dimensional stacked film 11 side of the magnetic metal 152. This allows the resistance value of the detector element 15 to sense a skyrmion to be detected. The detector element 15 to sense a skyrmion indicates a minimum value of the resistance value when the skyrmion 40 does not exist within the two-dimensional stacked film 11 and an increased resistance value when the skyrmion 40 exists. The resistance value of the detector element 15 to sense a skyrmion is determined by dependency of a probability of a tunnel current of electrons of the non-magnetic thin film 151 on the orientation of the magnetic moment of the two-dimensional stacked film 11 and the magnetic metal 152 which has transitted to a ferromagnetic phase. A high resistance (H) and a low resistance (L)

of the detector element 15 to sense a skyrmion corresponds to whether the skyrmion 40 exists or not and corresponds to information of "1" and "0" stored in a memory cell of information.

The generating unit 20 of the magnetic field is provided to be opposite to the two-dimensional stacked film 11. The generating unit 20 of the magnetic field generates an applied magnetic field H and applies to a two-dimensional surface of the two-dimensional stacked film 11 perpendicularly, in a direction from the back surface to the front surface of the two-dimensional stacked film 11. The back surface of the two-dimensional stacked film 11 refers to a surface at the side of the generating unit 20 of the magnetic field of the two-dimensional stacked film 11. It should be noted that in the present embodiment, only one generating unit 20 of the magnetic field is used. However, as long as the generating unit 20 of the magnetic field can applies the magnetic field perpendicularly to the two-dimensional stacked film 11, a plurality of generating units 20 of the magnetic field may be used. The number of arrangement of the generating units 20 of the magnetic field is not limited to those in the present embodiment.

The measuring unit 50 includes a power supply 51 for measurement and an ammeter 52. The power supply 51 for measurement is provided between the two-dimensional stacked film 11 and the detector element 15 to sense a skyrmion. The ammeter 52 measures a current for measurement flowing from the power supply 51 for measurement. For example, the ammeter 52 is provided between the power supply 51 for measurement and the detector element 15 to sense a skyrmion. The measuring unit 50 can detect whether the skyrmion 40 exists or not with a low electrical power by using the detector element 15 to sense a skyrmion having a high sensitivity.

The power supply 60 for a coil current is connected to the current path 12 and flows a current in an orientation shown by an arrow C. The current flowing through the current path 12 generate the magnetic field from the front surface to the back surface of the two-dimensional stacked film 11 in the region surrounded by the current path 12. As the magnetic field induced by currents flowing through the current path 12 is reversely oriented with respect to the uniform magnetic field H from the generating unit 20 of the magnetic field, a weakened magnetic field Ha occurs in an orientation from the back surface to the front surface of the two-dimensional stacked film 11 in the coil region $A_C$. As a result, the skyrmion 40 can be generated in the coil region $A_C$. It should be noted that for erasing the skyrmion 40, the power supply 60 for a coil current may flow the coil current in a reverse direction with respect to the one for generating the skyrmion 40. Also, if a plurality of current paths 12 are provided, a plurality of power supply 60 for a coil current may also be provided depending on the number of the current paths 12.

Figure 38:
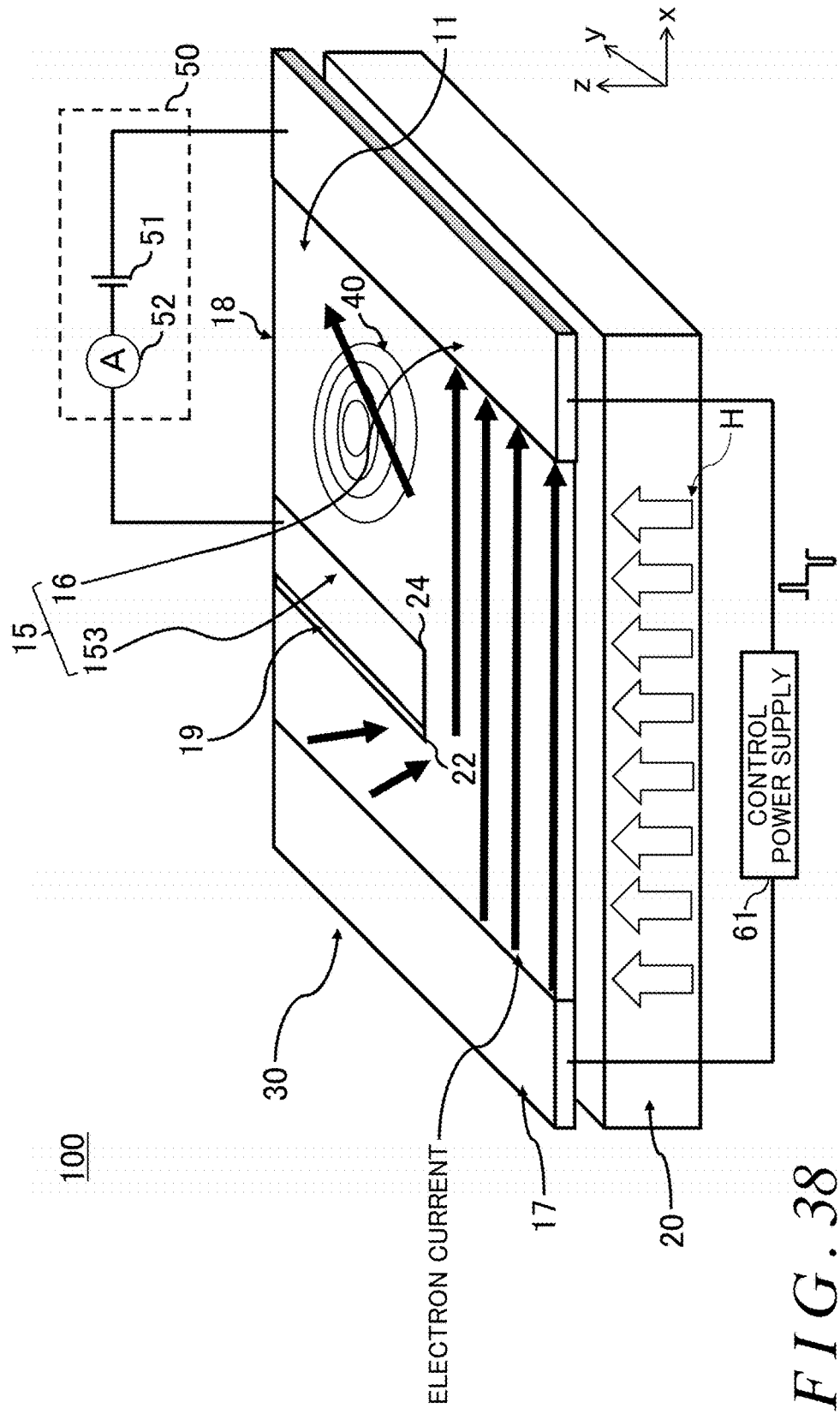
FIG. 38 illustrates a configuration example of a skyrmion memory 100 when a generating unit of a current is a notch structure.

FIG. 38 is a schematic view illustrating a configuration example of the skyrmion memory 100. The configuration example of a skyrmion memory 100 is illustrated when a generating unit of a current is a notch structure. The skyrmion memory 100 can generate and erase the skyrmion 40 by way of a current, thereby storing information. For example, whether the skyrmion 40 exists or not at a predetermined position in a two-dimensional stacked film 11 corresponds to information of one bit. The skyrmion memory 100 of the present example comprises a magnetic element 30, a generating unit 20 of the magnetic field, a control power supply 61 and a measuring unit 50.

The magnetic element 30 can generate, erase and detect the skyrmion 40 by an applied current. The magnetic element 30 of the present example includes the two-dimensional stacked film 11, an upstream non-magnetic metal electrode 16, a downstream non-magnetic metal electrode 17 and an electrode 153 with a notch structure. The upstream non-magnetic metal electrode 16 and the electrode 153 with a notch structure configures a detector element 15 to sense a skyrmion.

The upstream non-magnetic metal electrode 16 is connected to the two-dimensional stacked film 11. The upstream non-magnetic metal electrode 16 is connected to the two-dimensional stacked film 11 in a spreading direction. In the present example, the spreading direction of the two-dimensional stacked film 11 refers to a direction parallel to the xy plane. The upstream non-magnetic metal electrode 16 may have a shape of a thin layer. Also, the upstream non-magnetic metal electrode 16 may have the same thickness as that of the two-dimensional stacked film 11.

The downstream non-magnetic metal electrode 17 is apart from the upstream non-magnetic metal electrode 16 and connected to the two-dimensional stacked film 11. The downstream non-magnetic metal electrode 17 may be connected to the two-dimensional stacked film 11 in the spreading direction. The upstream non-magnetic metal electrode 16 and the downstream non-magnetic metal electrode 17 are arranged to flow a current in the two-dimensional stacked film 11 in a direction almost parallel to the xy plane, when a voltage is applied. The upstream non-magnetic metal electrode 16 and the downstream non-magnetic metal electrode 17 are formed of conductive non-magnetic metal such as Cu, W, Ti, TiN, Al, Pt, Au.

The control power supply 61 is connected to the upstream non-magnetic metal electrode 16 and the downstream non-magnetic metal electrode 17. The control power supply 61 selects either a direction from the upstream non-magnetic metal electrode 16 to the downstream non-magnetic metal electrode 17 or a direction from the downstream non-magnetic metal electrode 17 to the upstream non-magnetic metal electrode 16, and flows a current in the two-dimensional stacked film 11. For generating the skyrmion 40 in the two-dimensional stacked film 11, the control power supply 61 applies a current to the two-dimensional stacked film 11 in a direction from the upstream non-magnetic metal electrode 16 to the downstream non-magnetic metal electrode 17. Also, for erasing the skyrmion 40 which exists in the two-dimensional stacked film 11, the control power supply 61 applies a current to the two-dimensional stacked film 11 in a direction from the downstream non-magnetic metal electrode 17 to the upstream non-magnetic metal electrode 16.

The two-dimensional stacked film 11 includes a notch structure 19 at an end portion 18. The end portion 18 of the present example is an end portion, among end portions of the two-dimensional stacked film 11, positioned between the upstream non-magnetic metal electrode 16 and the downstream non-magnetic metal electrode 17. In a more specific example, the end portion 18 is an upper end portion of the two-dimensional stacked film 11 given that the upstream non-magnetic metal electrode 16 is arranged on the right side and the downstream non-magnetic metal electrode 17 is arranged on the left side. The position with the notch structure 19 is provided to be apart from both of the upstream non-magnetic metal electrode 16 and the downstream non-magnetic metal electrode 17 at the end portion 18. The position with the notch structure 19 may be provided with a non-magnet therein.

The skyrmion memory 100 use the skyrmion 40 generated by a current from the control power supply 61 as a storage medium of information. In FIG. 38, a direction of an electron current (reverse orientation with respect to the current) is shown by arrows. This electron current allows the skyrmion 40 to be generated from the position with the notch structure 19 of the two-dimensional stacked film 11.

In the present example, the skyrmion 40 is generated in the vicinity of the corner portion 24 of the position with the notch structure 19. In the present example, the corner portion 24 is a corner portion in a region of the position with the notch structure 19 at the upstream non-magnetic metal electrode 16 side which is most projecting to the inside of the two-dimensional stacked film 11. The position with the notch structure 19 includes at least two corner portions in the region which is most projecting to the inside of the two-dimensional stacked film 11. The position with the notch structure 19 may include a side parallel to the upstream non-magnetic metal electrode 16 and a side parallel to the downstream non-magnetic metal electrode 17. The corner portion 24 may also be an end portion of the side parallel to the upstream non-magnetic metal electrode 16. The position with the notch structure 19 of the present example has a rectangular shape. The two-dimensional stacked film 11 surrounds three sides of the position with the notch structure 19. The remaining one side of the position with the notch structure 19 is a straight line interpolating points of the end portion 18 at both sides of the position with the notch structure 19. In this case, the corner portion 24 is a corner portion closer to the upstream non-magnetic metal electrode 16 among two corner portions at a distal end of the position with the notch structure 19. However, the shape of the position with the notch structure 19 is not limited to a rectangle. The position with the notch structure 19 may have a polygonal shape. Also, each side of the position with the notch structure 19 may not be a straight line. Also, a distal end of at least one corner portion of the position with the notch structure 19 may be rounded.

The two-dimensional stacked film 11 transits to a ferromagnetic phase by the generating unit 20 of the magnetic field. Therefore, the magnetic moments in the two-dimensional stacked film 11 are oriented in the same direction as the magnetic field H. However, the magnetic moments at the end portion of the two-dimensional stacked film 11 is not oriented in the same direction as the magnetic field H, but inclined with respect to the magnetic field H. In particular, in the vicinity of the corner portion of the notch structure 19, the slants of the magnetic moments are continuously varied. Therefore, in the corner portion of the two-dimensional stacked film 11, the skyrmion 40 is more likely to be generated than in other regions, and the skyrmion 40 can be generated by a predetermined electron current.

The notch structure 19 includes at least two corner portions in a region most projecting to the inside of the two-dimensional stacked film 11 which have obtuse inner angles. Among the corner portions, the corner portion 24 adjacent to the upstream non-magnetic metal electrode 16 has an inner angle greater than or equal to 180 degrees. Also, the corner portion 22 adjacent to the downstream non-magnetic metal electrode 17 may also have an inner angle greater than or equal to 180 degrees. Here, the inner angle of the corner portion of the notch structure 19 refers to an angle of the corner portion 24 at the two-dimensional stacked film 11 side. For example, in the example of FIG. 38, the corner portion 24 adjacent to the upstream non-magnetic metal electrode 16 has an inner angle of 270 degrees.

When the corner portion 24 has an inner angle of 270 degrees and no current is applied, the magnetic moments in the vicinity of the corner portion 24 are in a state which is closest to a vortex. Therefore, preferably, the corner portion 24 has an inner angle of 270 degrees for generating the skyrmion 40.

Also, if a current flows in the two-dimensional stacked film 11 from the downstream non-magnetic metal electrode 17 to the upstream non-magnetic metal electrode 16, the orientation of the electron current is reversed from the one in FIG. 38. The reverse electron current pushes the skyrmion 40 into a region between the notch structure 19 and the downstream non-magnetic metal electrode 17. The region has a width insufficient to maintain the skyrmion 40. Therefore, the skyrmion 40 can be erased. Here, the width refers to a length in a direction in which a current flows in the two-dimensional stacked film 11 (the y axis direction in the present example). On the other hand, a region between the notch structure 19 and the upstream non-magnetic metal electrode 16 has a width sufficient to maintain the skyrmion 40. That is, the region between the notch structure 19 and the upstream non-magnetic metal electrode 16 has a larger width than the region between the notch structure 19 and the downstream non-magnetic metal electrode 17.

It should be noted that the notch structure 19 of the present example includes the electrode 153 with a notch structure including non-magnetic metal which is connected to the two-dimensional stacked film 11 in a spreading direction of the two-dimensional stacked film 11. Also, the upstream non-magnetic metal electrode 16 not only functions as an electrode for generating and erasing the skyrmion 40, but also functions as an electrode in the detector element 15 to sense a skyrmion. The detector element 15 to sense a skyrmion detects that the skyrmion 40 is generated and erased. For example, the detector element 15 to sense a skyrmion is a resistance element of which a resistance value is varied depending on whether the skyrmion 40 exists or not.

The electrode 153 with a notch structure contacts a side opposite to the upstream non-magnetic metal electrode 16 in the notch structure 19. It should be noted that as shown in FIG. 38, the entire notch structure 19 may also be the electrode 153 with a notch structure. The skyrmion 40 is positioned in a stable state between the electrode 153 with a notch structure and the upstream non-magnetic metal electrode 16. In the present example, depending on generation and erasing of the skyrmion 40, a resistance value of the two-dimensional stacked film 11 between the upstream non-magnetic metal electrode 16 and the electrode 153 with a notch structure is varied. The detector element 15 to sense a skyrmion indicates a minimum value of the resistance value when the skyrmion 40 does not exist within the two-dimensional stacked film 11 and an increased resistance value when the skyrmion 40 exists. A high resistance (H) and a low resistance (L) of the detector element 15 to sense a skyrmion corresponds to whether the skyrmion 40 exists or not and corresponds to information of "1" and "0" stored by a memory cell.

The measuring unit 50 is connected to the electrode 153 with a notch structure and the downstream non-magnetic metal electrode 17. The measuring unit 50 measures the resistance value of the two-dimensional stacked film 11 between the electrode 153 with a notch structure and the downstream non-magnetic metal electrode 17. A resistance value between the electrode 153 with a notch structure and the downstream non-magnetic metal electrode 17 corresponds to the resistance value of the two-dimensional stacked film 11, and is varied depending on generation and erasing of the skyrmion 40. For example, if the skyrmion 40 does not exist, the spatially uniform magnetic field H occurs in the two-dimensional stacked film 11. On the other hand, if the skyrmion 40 exists, the magnetic field in the two-dimensional stacked film 11 becomes spatially non-uniform. If a spatially non-uniform magnetic field occurs, a conduction electron flowing in the two-dimensional stacked film 11 is scattered by the magnetic moments of the two-dimensional stacked film 11. That is, the resistance value of the two-dimensional stacked film 11 is higher when the skyrmion 40 exists than the one when the skyrmion 40 does not exist.

The measuring unit 50 of the present example includes a power supply 51 for measurement and an ammeter 52. The power supply 51 for measurement is provided between the electrode 153 with a notch structure and the downstream non-magnetic metal electrode 17. The ammeter 52 measures a current for measurement flowing from the power supply 51 for measurement. From a ratio of a known voltage applied by the power supply 51 for measurement and a current measured by the ammeter 52, the resistance value of the two-dimensional stacked film 11 can be detected. This allows information stored in the skyrmion memory 100 to be read.

The skyrmion memory 100 having the configuration described above can be embodied as an magnetic element which can transfer and erase the skyrmion 40 in the two-dimensional stacked film 11. In this case, the downstream non-magnetic metal electrode 17, the downstream non-magnetic metal electrode 17 and the control power supply 61 work as a unit to control a skyrmion which controls to generate, erase and transfer the skyrmion 40.

Figure 39:
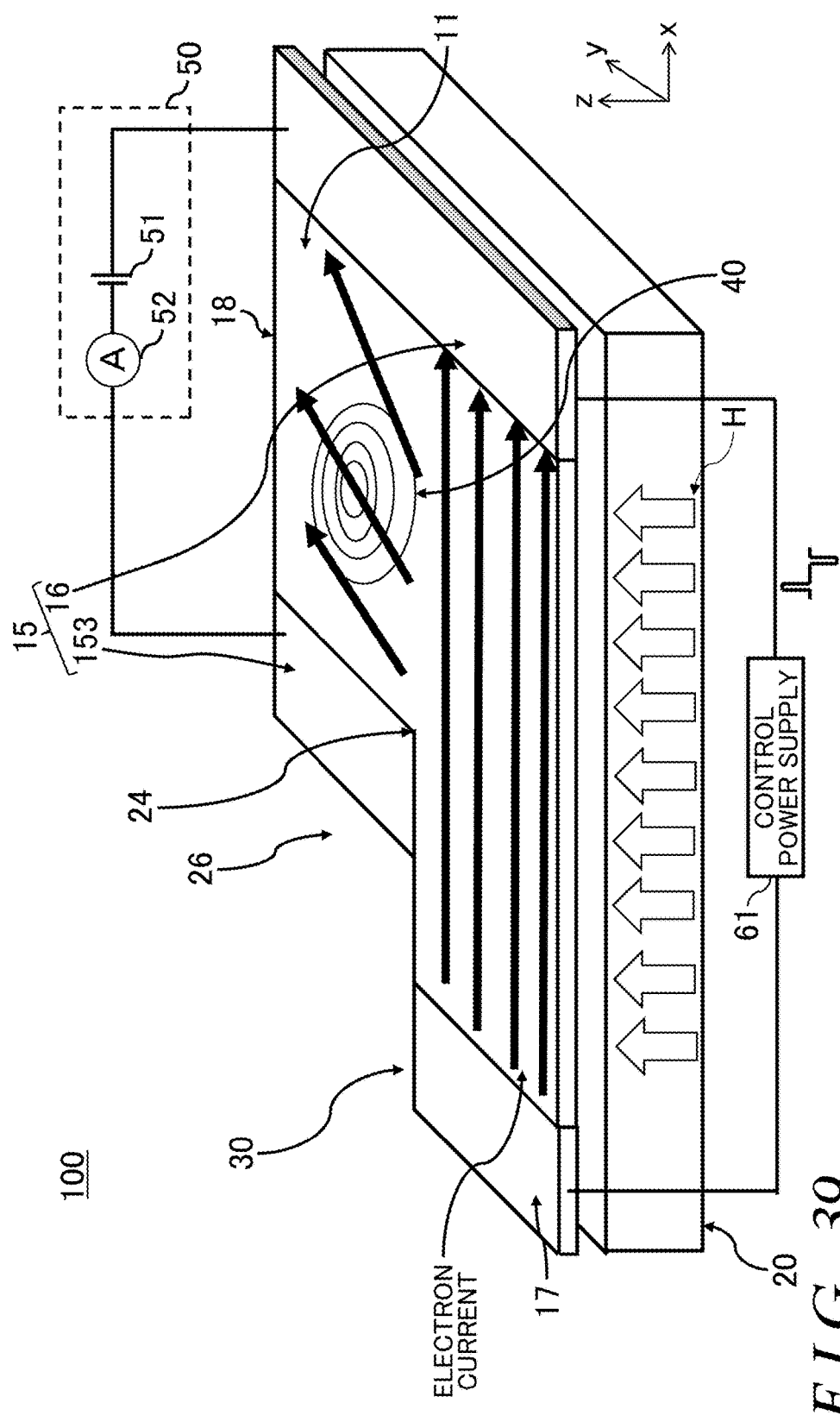
FIG. 39 illustrates a configuration example of a skyrmion memory 100 when a generating unit of a current is an L-shaped portion.

FIG. 39 illustrates a configuration example of the skyrmion memory 100 in which the generating unit of a current is an L-shaped portion. It is a schematic view illustrating another example of the skyrmion memory 100. The end portion of the notch structure 26 at the downstream non-magnetic metal electrode 17 side may also spread to the end portion of the magnet 10 at the downstream non-magnetic metal electrode 17 side. In this case, the corner portion of the notch structure 26 is only the corner portion 24. The design of the magnet of the present example is more simple in the structure than the one in FIG. 38 and suitable for microfabrication. Also, the downstream non-magnetic metal electrode 17 has approximately the same length in the x direction as a length of the end portion of the magnet 10 at the downstream non-magnetic metal electrode 17 side. However, the downstream non-magnetic metal electrode 17 is electrically insulated from the electrode 153 with a notch structure. The electrode 153 with a notch structure may be provided only in a part of regions of the notch structure 26 at the upstream non-magnetic metal electrode 16 side to be insulated from the downstream non-magnetic metal electrode 17.

As a result of a detailed simulation experiment using a pulse current, it was found that a remarkable characteristic is indicated with respect to generation and erasing of a skyrmion generation. The time needed for generating and erasing a nano-size skyrmion by a pulse current may be approximately tens to hundreds picoseconds (psec) of an extremely short pulse. That is, the current applying time for applying a current pulse for generating or erasing the skyrmion 40 is shorter than 1 nsec. This speed is two orders of magnitude larger than DRAM (Dynamic Random Access Memory) which needs 20 nsec. Also, a high speed SRAM (Static Randum Access Memory) needs 2 nsec. An operating speed of the skyrmion memory 100 is equal to or more than that of a high speed SRAM. Also, it is also proven that the generated skyrmion 40 remains a predetermined position if the pulse current is not applied. That is, the skyrmion memory 100 has a non-volatile memory characteristic which does not consume an electrical power during storage of the memory. An electrical power is needed only for generating and erasing the skyrmion 40. As also described above, as an extremely short pulse is sufficient, only a low power consumption is needed also for writing and erasing data. As it can be achieved, the memory element is likely to have a feature as an ultimate memory element.

The magnetic element 30 which can generate the skyrmion 40 is an element formed to be a thin layer shape, for example, having a thickness equal to or less than 500 nm, and can be formed by using techniques such as MBE (Molecular Beam Epitaxy) and sputtering. The upstream non-magnetic metal electrode 16 and the downstream non-magnetic metal electrode 17 is formed of conductive magnetic metal such as Cu, W, Ti, TiN, Al, Pt, Au.

Figure 40:
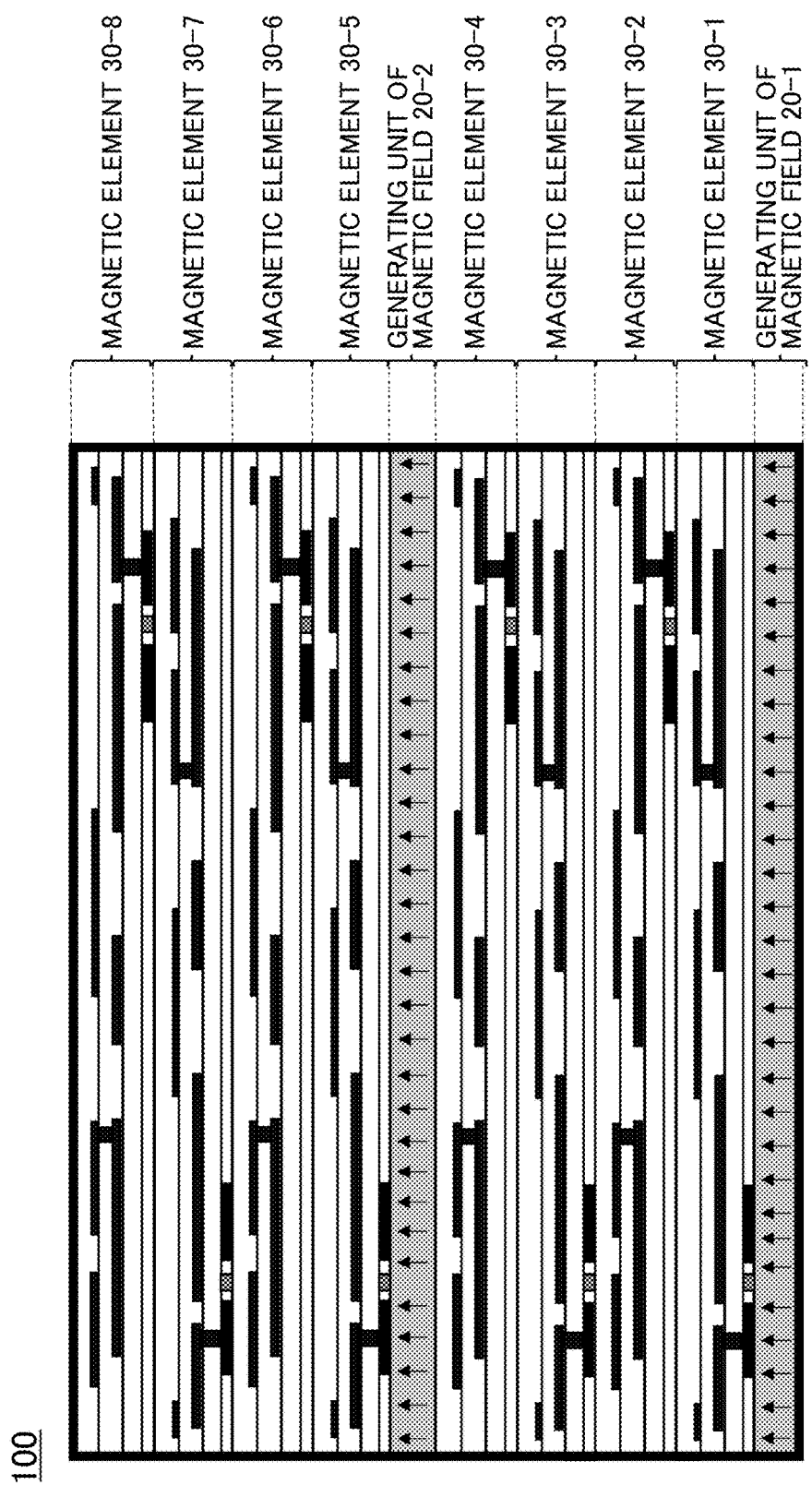
FIG. 40 illustrates a configuration example of a skyrmion memory 100.

FIG. 40 illustrates the skyrmion memory 100 including a plurality of generating units 20 of the magnetic field. The skyrmion memory 100 of the present example including eight layers of the magnetic elements 30 in total, a magnetic element 30-1 to a magnetic element 30-8. The skyrmion memory 100 includes four layers of the magnetic elements 30 on a generating unit 20-1 of the magnetic field. The skyrmion memory 100 further includes a generating unit 20-2 of the magnetic field between the magnetic element 30-4 and the magnetic element 30-5. This allows the magnetic element 30 to keep constant the strength of the magnetic field received from the generating unit 20 of the magnetic field. The generating units 20 of the magnetic field may be arranged at a suitable interval depending on material of the magnetic element 30 and the like.

Figure 41:
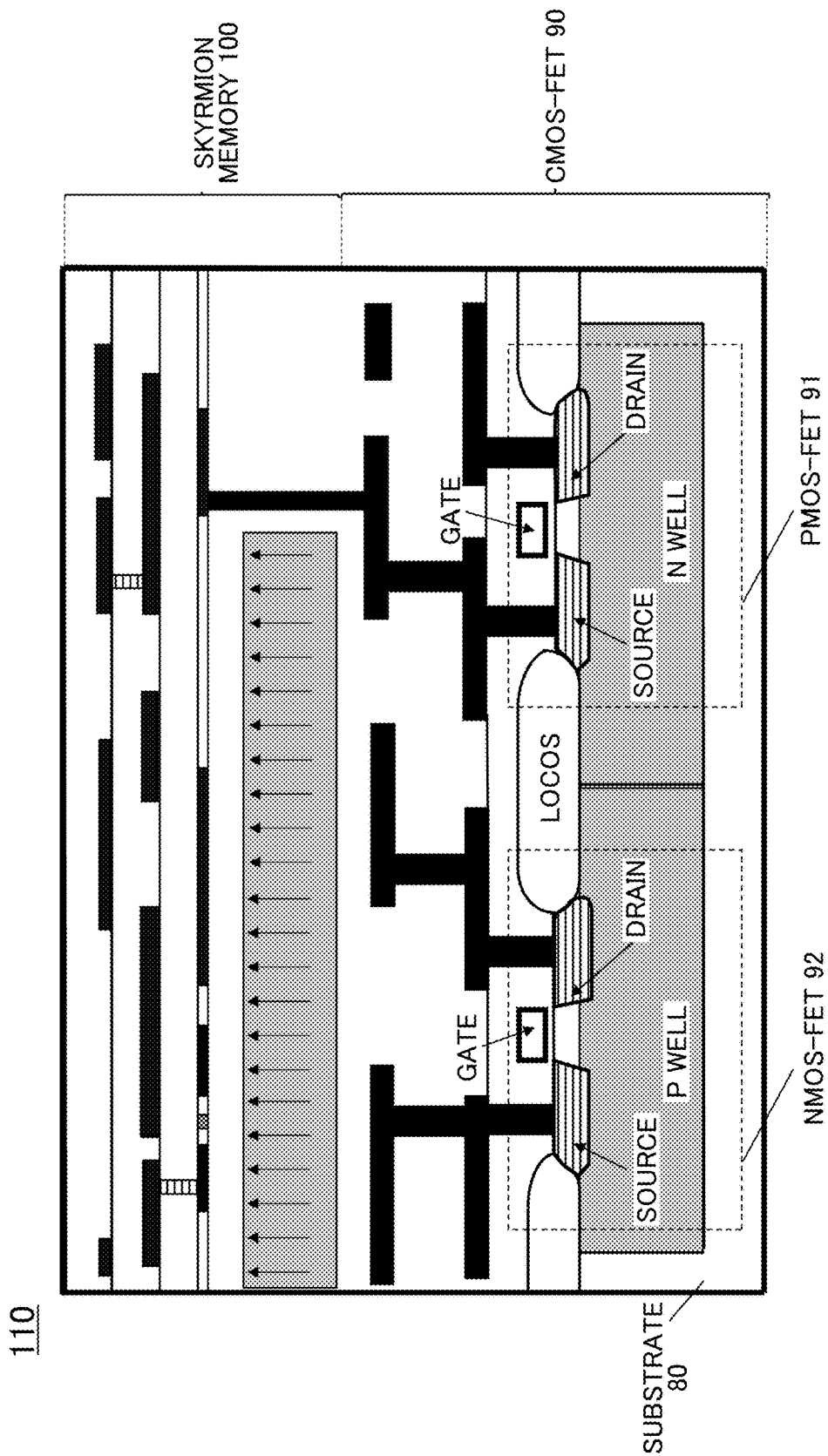
FIG. 41 illustrates a configuration example of a skyrmion memory device 110.

FIG. 41 illustrates a configuration example of the skyrmion memory device 110 including a semiconductor element. The skyrmion memory device 110 of the present example comprises the skyrmion memory 100 and a CMOS-FET 90 configuring a CPU function. The skyrmion memory 100 is formed on the CMOS-FET 90. The CMOS-FET 90 of the present example includes a PMOS-FET 91 and an NMOS-FET 92 formed on the substrate 80. The skyrmion memory device 110 may include the CMOS-FET 90 configuring a CPU function and the skyrmion memory 100 which is a stacked large scale non-volatile memory in the same chip. This results in a reduced processing time and speed-up of the CPU, thereby largely reducing the power consumption of the CPU.

Figure 42:
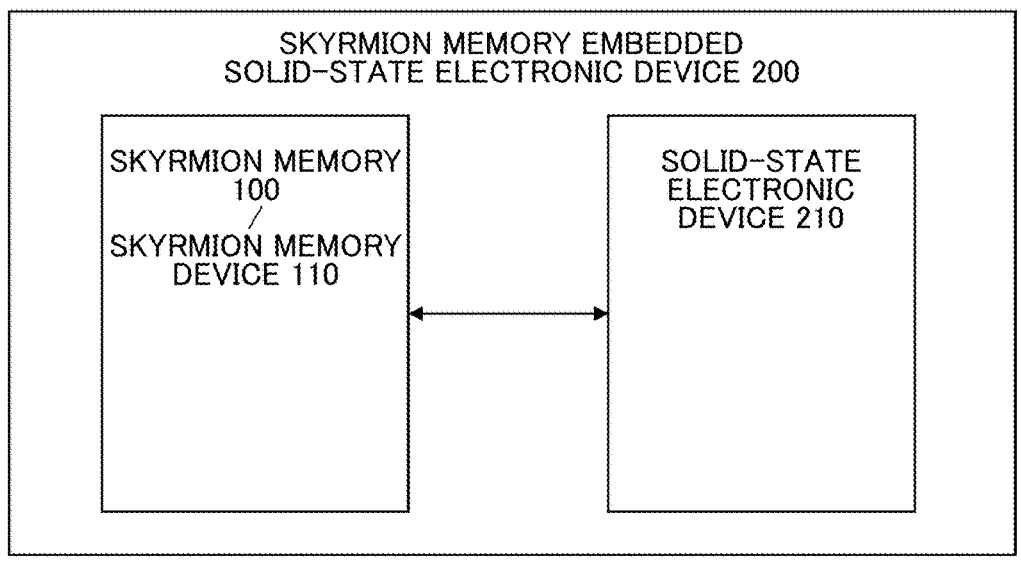
FIG. 42 is a schematic view illustrating a configuration example of a skyrmion memory embedded solid-state electronic device 200.

FIG. 42 is a schematic view illustrating configuration example of a skyrmion memory embedded solid-state electronic device 200. The skyrmion memory embedded solid-state electronic device 200 comprises a skyrmion memory 100 or a skyrmion memory device 110 and a solid-state electronic device 210. The skyrmion memory 100 or the skyrmion memory device 110 is the skyrmion memory 100 or the skyrmion memory device 110 described in FIG. 37 to FIG. 41. The solid-state electronic device 210 is, for example, a CMOS-LSI device. The solid-state electronic device 210 has at least one function of writing data in the skyrmion memory 100 or the skyrmion memory device 110 and reading data from the skyrmion memory 100 or the skyrmion memory device 110.

Figure 43:
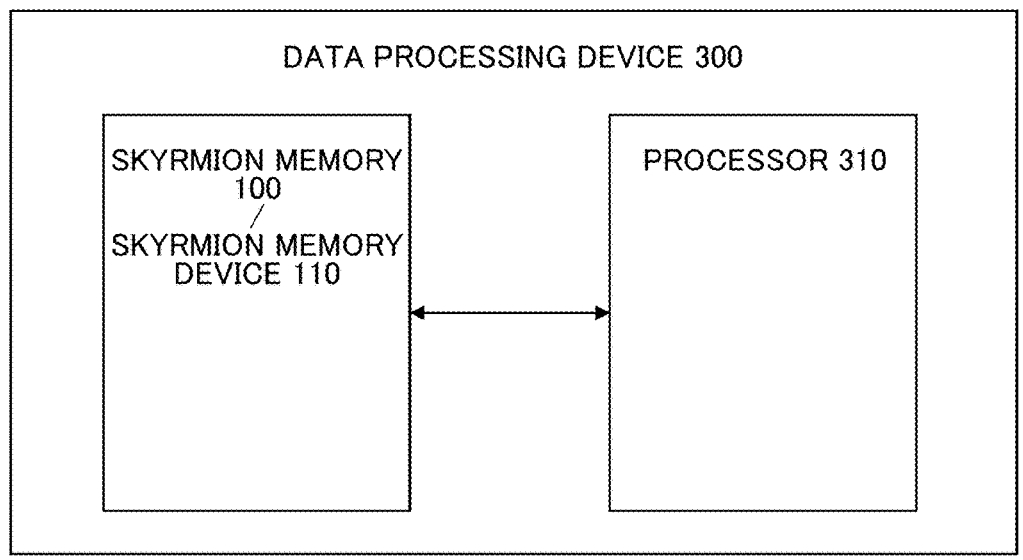
FIG. 43 is a schematic view illustrating a configuration example of a data processing device 300.

FIG. 43 is a schematic view illustrating a configuration example of a data processing device 300. The data processing device 300 comprises the skyrmion memory 100 or the skyrmion memory device 110 and a processor 310. The skyrmion memory 100 or the skyrmion memory device 110 is the skyrmion memory 100 or the skyrmion memory device 110 described in FIG. 37 to FIG. 41. The processor 310 includes, for example, a digital circuit which processes a digital signal. Processor 310 has at least one function of writing data in the skyrmion memory 100 or the skyrmion memory device 110 and reading data from the skyrmion memory 100 or the skyrmion memory device 110.

Figure 44:
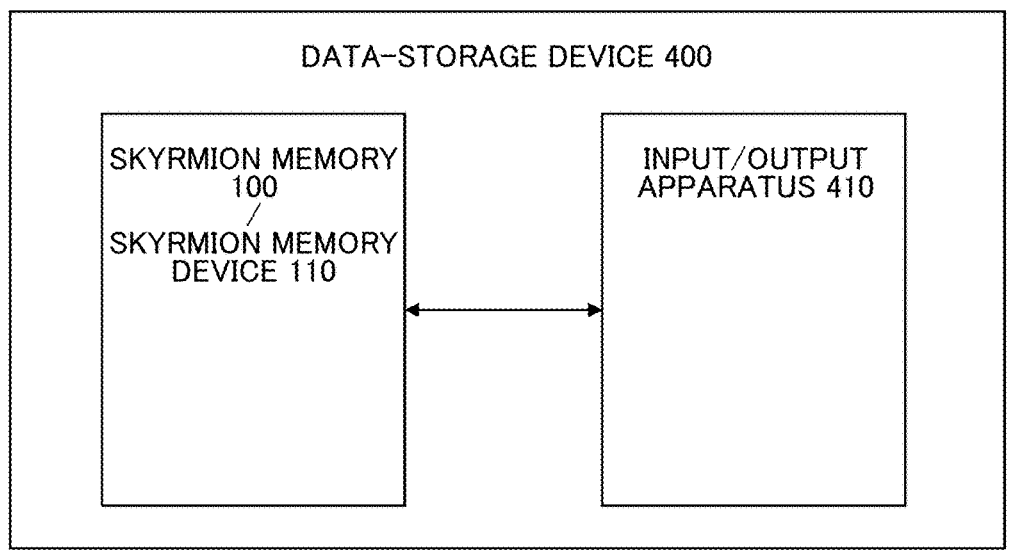
FIG. 44 is a schematic view illustrating a configuration example of a data-storage device 400.

FIG. 44 is a schematic view illustrating a configuration example of a data-storage device 400. The data-storage device 400 comprises the skyrmion memory 100 or the skyrmion memory device 110 and an input/output apparatus 410. The data-storage device 400 is, for example, a hard disk or a memory device such as a USB memory. The skyrmion memory 100 or the skyrmion memory device 110 is the skyrmion memory 100 or the skyrmion memory device 110 described in FIG. 37 to FIG. 41. The input/output apparatus 410 has at least one of function of writing data from the outside to the skyrmion memory 100 or the skyrmion memory device 110, and reading data from the skyrmion memory 100 or the skyrmion memory device 110 and outputting the data to the outside.

Figure 45:
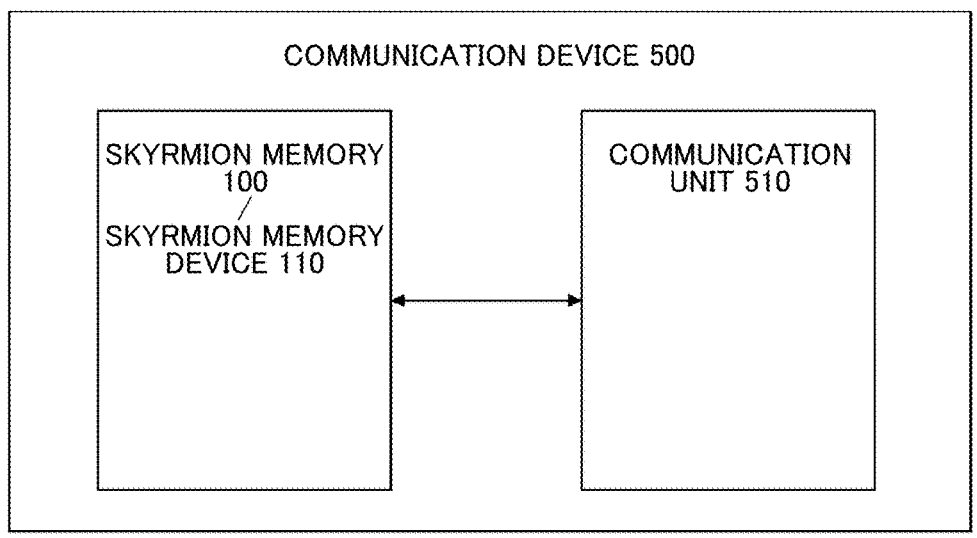
FIG. 45 is a schematic view illustrating a configuration example of a communication device 500.
Figure 46:
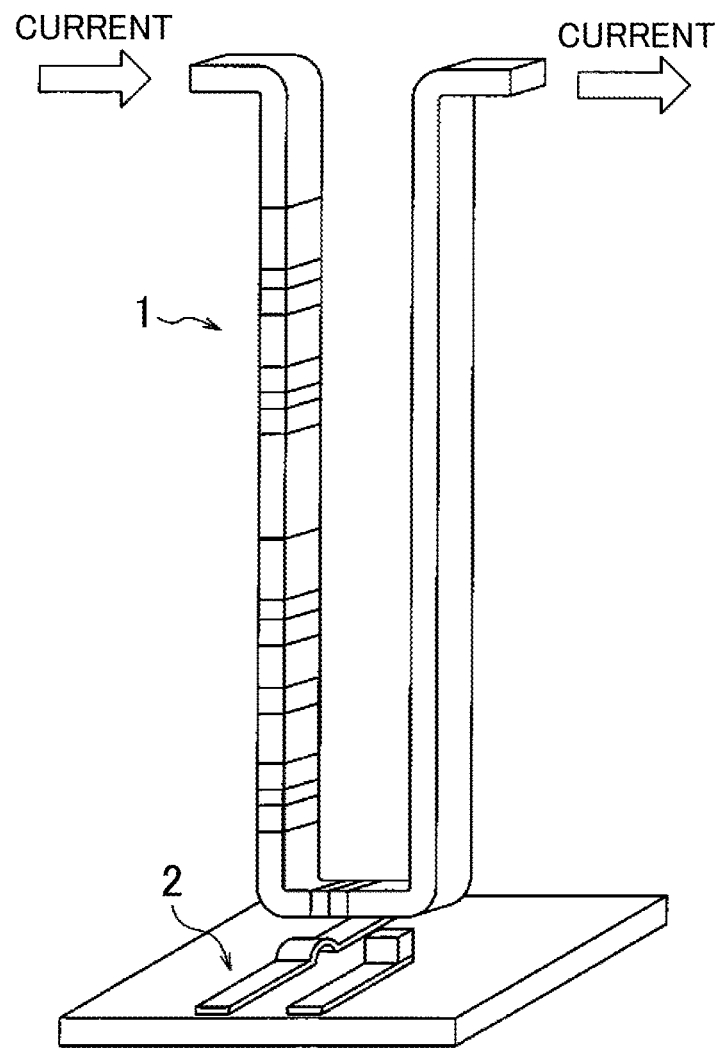
FIG. 46 is a diagram illustrating the principle of driving a magnetic domain by currents.

FIG. 45 is a schematic view illustrating a configuration example of a communication device 500. The communication device 500 refers to, for example, a general device having a communication function with the outside such as a mobile phone, a smartphone, and a tablet. The communication device 500 may be portable or not portable. The communication device 500 comprises a skyrmion memory 100 or a skyrmion memory device 110 and a communication unit 510. The skyrmion memory 100 or the skyrmion memory device 110 is the skyrmion memory 100 or the skyrmion memory device 110 described in FIG. 37 to FIG. 41. The communication unit 510 has a communication function with the outside of the communication device 500. The communication unit 510 may have a wireless communication function, may have a wired communication function, or may also have both functions of wireless and wired communications. The communication unit 510 has at least one function of writing data received from the outside on the skyrmion memory 100 or the skyrmion memory device 110, transmitting the data read from the skyrmion memory 100 or the skyrmion memory device 110 to the outside, and operating based on control information stored in the skyrmion memory 100 or the skyrmion memory device 110.

Also, an electronic device to which the skyrmion memory 100 or the skyrmion memory device 110 is applied can also achieve power consumption saving, thereby achieving an embedded cell of a longer lifecycle. This can provide with users more breakthrough specification of the electronic device to which the skyrmion memory 100 or the skyrmion memory device 110 is applied. Note that the electronic device may be of any type such as a personal computer, an image recording device.

Also, applying the skyrmion memory 100 or the skyrmion memory device 110 to a communication device embedded with a CPU (a mobile phone, a smartphone, a tablet and the like) can achieve a further speed-up of an import of image information and an operation of various kinds of large scale application programs and a high speed response, thereby ensuring a comfortable usage environment for users. Also, this can also achieve a speed-up of an image display to display an image on a screen and the like, thereby further improving the usage environment.

Also, applying the skyrmion memory 100 or the skyrmion memory device 110 to an electronic device such as a digital camera allows mass storage of moving images. Also, applying the skyrmion memory 100 or the skyrmion memory device 110 to an electronic device such as a 4 K television receiver can achieve mass storage of the image recording. As a result, this can provide a television receiver which does not need to be connected to an external hard disk. Also, the skyrmion memory 100 or the skyrmion memory device 110 may be embodied as data recording medium, in addition to application of a data-storage device such as a hard disk.

Also, applying the skyrmion memory 100 or the skyrmion memory device 110 also to an electronic device such as a car navigation system can achieve further high functionality, thereby also allowing a large amount of mapping information to be easily stored.

Also, the skyrmion memory 100 or the skyrmion memory device 110 is expected to give a large impact on putting a self-propelled apparatus and a flying apparatus in practical use. That is, for a flying apparatus, this allows a complicated control process, a weather information process, improvement of service for passengers by providing videos of high definition images, and further, a control of a space flying apparatus and record of a huge amount of recorded information of observed image information, thereby providing people with many insights.

Also, as the skyrmion memory 100 or the skyrmion memory device 110 is a magnetic memory, it is highly tolerant against high energy elemental particles flying around in space. It has an advantage which is largely different from a flash memory using charges involved with electrons as a memory storage medium. Therefore, it is important as a storage meium for flying apparatus in space and the like.

EXPLANATION OF REFERENCES

1: magnetic shift register, 2: magnetic sensor, 10: magnet, 11: two-dimensional stacked film, 12: magnetic film, 13: non-magnetic film, 14: stacked layer, 15: detector element to sense a skyrmion, 16: upstream non-magnetic metal electrode, 17: downstream non-magnetic metal electrode, 18: end portion, 19: notch structure, 20: generating unit of a magnetic field, 22: corner portion, 24: corner portion, 25: multiple layered film, 26: notch structure, 30: magnetic element, 40: skyrmion, 50: measuring unit, 51: power supply for measurement, 52: ammeter, 60: power supply for coil current, 61: control power supply, 80: substrate, 90: CMOS-FET, 91: PMOS-FET, 92: NMOS-FET, 100: skyrmion memory, 110: skyrmion memory device, 151: non-magnetic thin film, 152: magnetic metal, 153: electrode with a notch structure, 200: skyrmion memory embedded solid-state electronic device, 210: solid-state electronic device, 300: data processing device, 310: processor, 400: data-storage device, 410: input/output apparatus, 500: communication device, 510: communication unit

What is claimed is:
1. A magnetic element for generating a skyrmion, the magnetic element comprising a two-dimensional stacked film, wherein
the two-dimensional stacked film is at least one or more multiple layered films including a magnetic film and a non-magnetic film stacked on the magnetic film,
the magnetic film includes ferromagnetic insulating material or ferromagnetic metal material and the non-magnetic film includes non-magnetic insulating material or non-magnetic metal material having a large constant of a spin-orbit interaction, and
in the two-dimensional stacked film, the skyrmion appears by applying a magnetic field substantially perpendicular to a two-dimensional surface having a thin layer shape.

2. The magnetic element according to claim 1, wherein in the two-dimensional stacked film, at least a skyrmion crystal phase in which the skyrmion is generated and a ferromagnetic phase appear in accordance with the applied magnetic field.

3. The magnetic element according to claim 1, wherein the magnetic film includes ferromagnetic material having a magnetic moment substantially perpendicular to the two-dimensional surface.

4. The magnetic element according to claim 1, wherein the magnetic film includes magnetic material having a perovskite crystal structure.

5. The magnetic element according to claim 4, wherein the magnetic film includes five or less molecular layers of $SrRuO_3$ having a perovskite crystal structure in a thickness direction.

6. The magnetic element according to claim 4, wherein the magnetic film includes Mn oxide magnetic material having a perovskite crystal structure.

7. The magnetic element according to claim 6, wherein the magnetic film includes perovskite oxide $La_{1-x}Sr_xMnO_3$ added with Ru elements within a range of 2.5% to 10% of Mn, where x is such that $0 \leq x \leq 1$.

8. The magnetic element according to claim 1, wherein the magnetic film includes magnetic material containing V, Cr, Mn, Fe, Co, Ni, Cu or a plurality of these metal elements.

9. The magnetic element according to claim 1, wherein the non-magnetic film includes perovskite oxide.

10. The magnetic element according to claim 9, wherein the non-magnetic film includes Ir oxide.

11. The magnetic element according to claim 10, wherein the non-magnetic film includes two or less molecular layers of $SrIrO_3$ in a thickness direction.

12. The magnetic element according to claim 1, wherein the non-magnetic film is a non-magnetic metal film containing Pd, Ag, Ir, Pt, Au, W, Re or a plurality of these metals.

13. A skyrmion memory comprising:
the magnetic element according to claim 1; and
a generating unit of a magnetic field provided to be opposite to the magnetic element and applying a magnetic field to the magnetic element.

14. A data-storage device comprising the skyrmion memory according to claim 13 embedded therein.

15. A data processing device comprising the skyrmion memory according to claim 13 embedded therein.

16. A communication device comprising the skyrmion memory according to claim 13 embedded therein.

* * * * *